United States Patent [19]
Suzuki et al.

[11] Patent Number: 5,124,944
[45] Date of Patent: Jun. 23, 1992

[54] OPTICAL STORAGE MEDIUM AND STORAGE PROCESS

[75] Inventors: Hiroyuki Suzuki; Toshiyuki Shimada; Toshihiro Nishi, all of Mito; Hiroaki Hiratsuka, Ushiku, all of Japan

[73] Assignee: Nippon Telegraph and Telephone Corporation, Tokyo, Japan

[21] Appl. No.: 510,562

[22] Filed: Apr. 18, 1990

[30] Foreign Application Priority Data

| Apr. 18, 1989 | [JP] | Japan | 1-96265 |
| Sep. 11, 1989 | [JP] | Japan | 1-232990 |
| Sep. 26, 1989 | [JP] | Japan | 1-247950 |

[51] Int. Cl.⁵ .............. G11C 13/04; G11B 7/24
[52] U.S. Cl. .................. 365/113; 365/119
[58] Field of Search .......... 365/113, 119, 121, 216; 430/900

[56] References Cited

U.S. PATENT DOCUMENTS

| 4,101,976 | 7/1978 | Castro et al. | 365/119 |
| 4,103,346 | 7/1978 | Haarer et al. | 365/216 |

OTHER PUBLICATIONS

"Can Single-Photon Processes Provide Useful Materials for Frequency-Domain Optical Storage?", W. E. Moerner and M. D. Levenson, vol. 2, No. 6, pp. 915-923/Jun. 1985/J. Opt. Soc. Am. B.

"Photon-Gated Hole Burning: A New Mechanism Using Two-Step Photoionization", A. Winnacker, R. M. Shelby, and R. M. Mcfarlene, vol. 10, No. 7, pp. 350-352/Jul. 1985/Optics Letters.

"Two-Color, Photon-Gated Spectral Hole-Burning in an Organic Material", H. W. H. Lee et al., vol. 118, No. 6, pp. 611-616/Aug. 16, 1985/Chemical Physics Letters.

"Mechanism of Photon-Gated Persistent Spectral Hole Burning in Metal-Tetrabenzoporphyrin/Halomethane Systems: Donor-Acceptor Electron Transfer", T. P. Carter et al., vol. 91, No. 15, pp. 3998-4004/1987/Journal of Physical Chemistry.

"Gated Photochemical Hole Burning in Photoadducts of Polyacencs", Mark Iannone et al., vol. 85, No. 9, pp. 4863-4866/Nov. 1, '86, Journal of Chemical Physics.

"Through-Bond Charge Transfer Interaction and Photoinduced Charge Separation", J. W. Verhoeven, vol. 58, No. 9, pp. 1285-1290/1986/Pure & Appl. Chem.

"Fast Burning of Persistent Spectral Holes in Small Laser Spots Using Photon-Gated Materials", W. E. Moerner et al., vol. 50, No. 8, pp. 430-432/Feb. 23, 1987/Appl. Phys. Lett.

"Photon-Gated Spectral Hole Burning in $LiGa_5O_8$:-$Co^{2+}$", R. M. Mcfarlane et al., Third Series, vol. 34, No. 1/Jul. 1, 1986/Physical Review B.

*Primary Examiner*—Joseph A. Popek
*Attorney, Agent, or Firm*—Oblon, Spivak, McClelland, Maier & Neustadt

[57] ABSTRACT

An optical data storage medium, comprising: (a) an amorphous matrix; and (b) guest molecules dispersed in the amorphous matrix, the guest molecules consisting essentially of electron donors and electron acceptors which are in a solid state at room temperature, the optical data storage medium having an inhomogeneously broadened absorption band due to a distribution of local environments around the guest molecules dispersed in the amorphous matrix, such that the optical data storage medium is capable of storing at least two bits of data in a frequency domain by virtue of an irreversible multiphotonic electron transfer reaction consisting of more than one photon process, in which at least one electron is transferred from the electron donors to the electron acceptors.

14 Claims, 9 Drawing Sheets

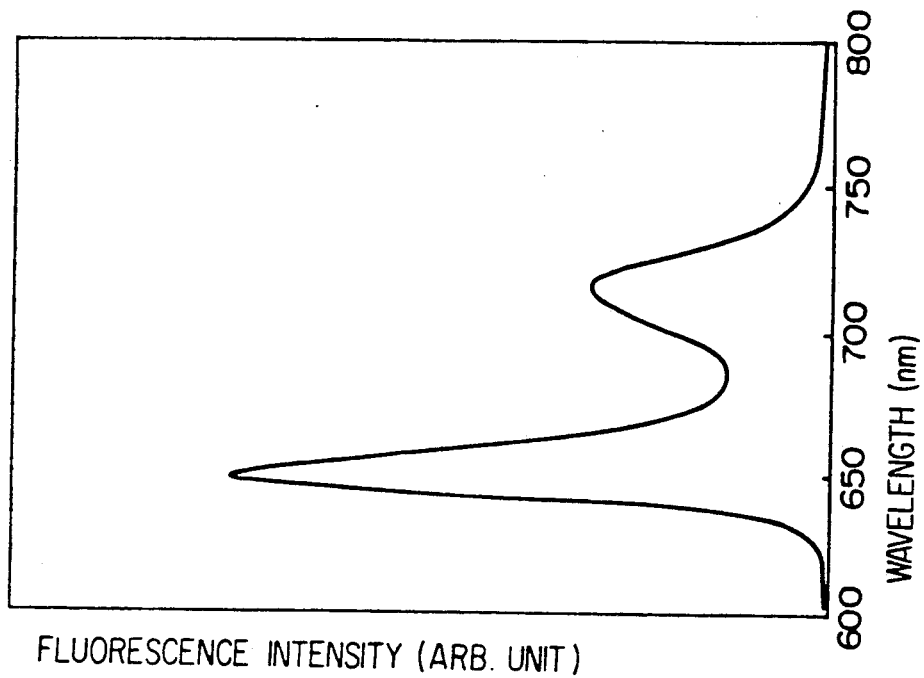
FIG.5-a
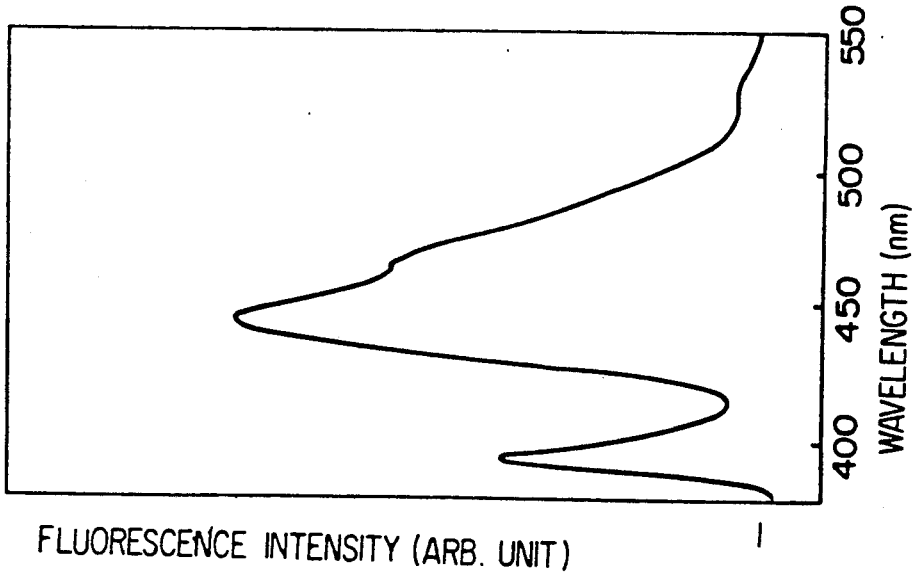
FIG.5-b

OPTICAL STORAGE MEDIUM AND STORAGE PROCESS

BACKGROUND OF THE INVENTION

The present invention relates to optical memory, more specifically to the optical memory medium and the storage method therewith which enables high-quality, high-density wavelength-multiplexing optical storage based on the photochemical hole-burning phenomenon at cryogenic temperature.

Castro, et al, proposed a wavelength multiplexing optical memory based on the photochemical hole-burning (PHB) phenomenon in 1978 (U.S. Pat. No. 4,101,976, 1978). Since then, much attention has been paid to PHB as a superhigh-density optical storage scheme that can principally realize more than 1000-fold increase in storage density as compared to conventional optical storage schemes. FIG. 2 outlines the wavelength-multiplexing storage scheme based on the PHB phenomenon. When guest molecules such as dye molecules are dispersed in amorphous systems such as a polymer or a rigid glass, they show an inhomogeneously broadened absorption band (band with: $\Delta\omega_{ih}$), which is composed of a lot of homogeneous absorption band of the molecules. (band with: $\Delta\omega_i$). This reflects the fact that each guest molecule interacts with amorphous matrix in a slightly different way. At a sufficiently low temperature $\Delta\omega_{ih} << \Delta\omega_i$, irradiation to the guest molecules with a light which has a narrow band width results in the selective excitation of the molecules which can resonantly absorb the light in frequency domain. This makes them occur a site-selective photochemistry, so that holes are produced in the inhomogeneously broadened absorption band when the product have a absorption band in another region of frequency domain. The data bits of 1 and 0 are represented by the presence and absence of the hole, respectively.

The hole formation by this method has been reported so far in a variety of organic and inorganic materials (Persistent Spectral Hole-Burning: Science and Applications, edited by W. E. Moerner, published by Springer-Varlag). Most of these systems are based on monophotonic photochemical reactions, such as proton tautomerization and intra- or inter-molecular hydrogen-bond rearrangements.

One of the major problems involved in a material which has a monophotonic hole formation are the absence of a threshold in PHB reaction, so that the destructive readout of stored information cannot be prevented. Moerner and Levenson examined in detail the material parameters required for realizing a sufficient S/N ratio (>26 dB for band width; 16 MHz) under the conditions of high-speed write-in and read-out (30 ns/bit) in a focused laser spot (10 $\mu m\phi$), which are crucial for a practical PHB optical memory (W. E. Moerner and M. D. Levenson, J. of Optical Society of America B, vol. 2, pp. 915 (1985)). They have shown that, for materials which have monophotonic hole formation the allowed region of the material parameters to satisfy the above-mentioned conditions is very limited and that no material thus for reported which has monophotonic hole formation lie within allowed region.

Photon-gated PHB materials were discovered later, in order to prevent the destructive read-out of stored informations, in which two photon photochemical reactions with a threshold are used as a PHB reaction. Photon-gated PHB materials so far reported include, for example, carbazole in boric acid (H. W. H. Lee, et al. Chemical Physics Letters, Vol. 118, pp. 611 (1985)), anthracenetetracene photo adducts in polymethyl methacrylate (PMMA) (M. Iannone, et al. J. of Chemical Physics, vol. 85, pp. 4863 (1986), 8, and the combination of zinc or magnesium tetrabenzoporphyrin and halogenated methanes in PMMA (T. P. Carter, et al. J. of Physical Chemistry, vol. 91, pp. 3998 (1987), W. B. Moerner, et al. Applied Physics Letters, vol. 50, pp. 430 (1987)), as the organic materials; and $Sm^{2+}$ in BaClF (A. Winnacker, Optics Letters, vol. 10, pp. 350 (1985), 7, and $Co^{2+}$ in $LiGa_5O_8$ (R. M. Macfarlane, et al. Physical Review B, vol. 34, pp. 1 (1986)., as the inorganic materials. Among these, the most promising systems from the viewpoint of applying PHB materials to practical optical memories are those consisting of zinc tetrabenzoporphyrin (TZT) or magnesium tetrabenzoporphyrin (TMT), and halogenated methanes in PMMA due to their high hole-burning efficiency (T. P. Carter, et al. J. of Physical Chemistry, vol. 91, pp. 3998 (1987), and M. E. Moerner, et al. Applied Physics Letters, vol. 50, pp. 430 (1987)). In these systems, where TZT or TMT, and the (1987)). In these systems, where TZT or TMT, and the halogenated methanes are used as a donor and an acceptor, respectively, holes are formed with a two-photon electron transfer from the donor to the acceptor via the triplet state of the donor. By using this reaction scheme, a hole of 1% depth was burnt as fast as in 30ns by means of a CW laser in a focused laser spot of 200 $\mu m\phi$. Furthermore, they could form a hole as fast as in 8 ns, although the laser beams was in a larger spot size of 1 $cm\phi$ (W. E. Moerner, et al. Applied Physics Letters, vol. 50, pp. 430 (1987)).

These materials, however, have the following drawbacks (1) The halogenated methanes used as the acceptor are also the solvent for preparing the PHB materials, so that it is very difficult to prepare the medium which has a desired concentration of the acceptor freely with good reproducibility.

(2) The low boiling point of the halogenated methanes used as the acceptor results in an insufficient stability of the medium.

(3) The writing time is not enough fast in view of the duration of the gating light of 200 ms.

(4) The quantum yield of the PHB reaction is still small to realize the practical PHB optical memory.

(5) The gating ratio (i.e., the ratio of the depth of a two-photon hole to that of a one-photon hole with the same irradiation energy) is not large enough to prevent destructive read-out of stored information many times.

(6) The finite lifetime (<100 ms) of the intermediate state of the PHB reaction limits the time interval between the irradiations of the wavelength-selective and the gating light.

SUMMARY OF THE INVENTION

An object of the present invention is to provide optical memory storage medium comprising:

(a) a dispersive matrix having amorphous structure; and (b) guest molecules dispersed in the dispersive matrix, the dispersed guest molecules composed essentially of electron donors and electron acceptors being in a solid state at room temperatures, whereby the memory storage medium has an inhomogeneously broadened absorption band due to a distribution of local environments around the guest molecules dispersed in the dispersive matrix, and the memory storage medium is capable of recording at least non-volatile two data bits in a frequency domain by virtue of an irreversible multi-photonic photochemical reaction consisting of more than one photon process, and/or, the optical memory storage medium described the above, wherein at least one intermediate produced in the multi-photonic photochemical reaction is stable, and/or, the optical memory storage medium described above, wherein said at least one intermediate is a triplet excited state of the electron donors, and/or, the optical memory storage medium described above, wherein at least one intermediates produced in the multi-photonic photochemical reaction is stable approximately at liquid helium temperature, and/or, the optical memory storage medium described above, wherein at least one intermediates produced in the multi-photonic photochemical reaction is stable approximately at liquid helium temperature for more than one hour, and/or, the optical memory storage medium described above, wherein the dispersive matrix is a substantially transparent polymer, and/or, the optical memory storage medium described above, wherein the matrix is selected from the group consisting of polyethylene and polymethylmethacrylate, and/or, the optical memory storage medium described above, wherein the electron donors are metal-free porphyrin derivatives, and/or, the optical memory storage medium described above, wherein the electron donors are selected from the group consisting of metal-free tetraphenyl porphyrin and a zinc salt of metal-free tetraphenyl porphyrin, and/or, the optical memory storage medium described above, wherein the electron acceptors are molecules selected from the group consisting of halogenated benzene derivatives and halogenated condensed aromatic hydrocarbon derivatives.

The other object of the present invention is to provide a method for memory storage in an optical memory storage medium, the optical memory storage medium composed essentially of a dispersive matrix having an amorphous structure, and guest molecules dispersed in the dispersive matrix, the guest molecules consisting essentially of electron donors and electron acceptors, whereby the recording medium has an inhomogeneously broadened absorption band due to a distribution of local environments around the guest molecules dispersed in the dispersive matrix, the method comprising the steps of:

(a) irradiating the recording medium with a first light beam of predetermined wavelengths;

(b) subsequently irradiating the recording medium at least once, 500 ms or more after the irradiation by the first light beam, whereby holes are created in a frequency domain by virtue of an irreversible multi-photonic photochemical reaction consisting of more than one photon process, thereby recording at least two non-volatile data bits, each of the data bits corresponding to one of the holes, and/or, the method for memory storage described above, wherein (a) the first light beam consists of a plurality of light components of selected wavelengths, the selected wavelengths being within the inhomogeneously broadened absorption band; and (b) irradiation by the first light beam is carried out by irradiating the recording medium with said plurality of light components in sequence, thereby creating holes corresponding to the frequencies of the light components, and/or, the method for memory storage described above, wherein (a) the first light consists of a plurality of light components of selected wavelengths, the selected wavelengths being within the inhomogeneously broadened absorption band; and (b) irradiation by the first light is carried out by irradiating the recording medium by said plurality of light components simultaneously, thereby creating holes corresponding to the frequencies of the light components, and/or, the method for memory storage described above, wherein at least one reaction intermediate formed by the photochemical reaction is stable, and/or, the method for memory storage described above, wherein the reaction intermediate is stable at about liquid helium temperatures.

BRIEF DESCRIPTION OF THE DRAWINGS

FIGS. 5-a and 5-b illustrate fluorescence spectrum of the medium 3-2 (TPP-9-ABr/PMMA).

1 and 2: guest molecules,
3: matrix,
4: light source,
5: detector,
6: page composer,
7 and 8: two dimensional galvanomirror,
9 to 12: lenses,
13: cryostat,
14: storage medium,
15: reference beam, and
16: object beam.

Figure 10:
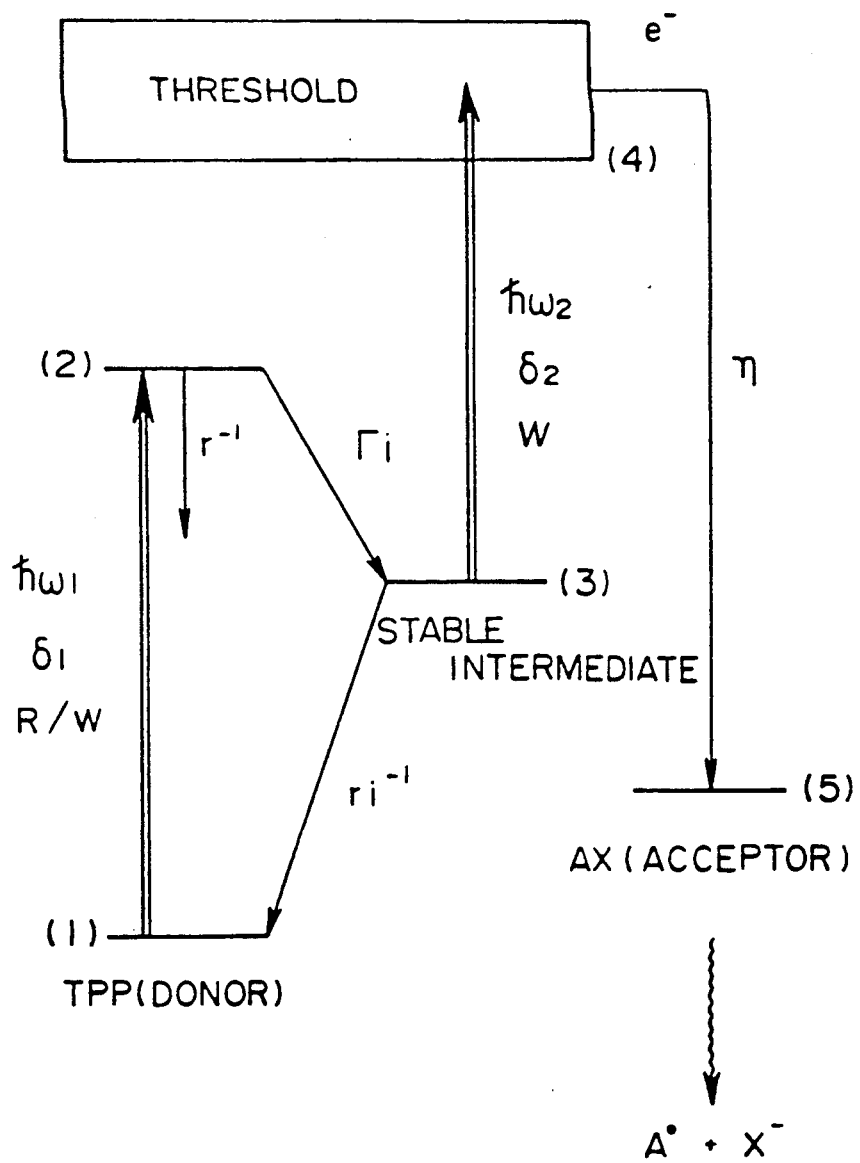

FIG. 10 illustrates the mechanism of a hole formation in an optical storage medium of this invention.

DETAILED DESCRIPTION OF THE INVENTION

The desired features of the medium for a practical PHB optical memory by wavelength multiplexing and the storage method therewith are that: the medium is easily prepared in the desired composition with good reproducibility, and the medium itself is highly stable, holes formed in the medium are sufficiently narrow to keep large frequency multiplicity, holes are thermally stable, and the write-in and read-out are performed at a high speed in a focused laser spot without destruction of stored information.

It is an object of the present invention to provide a stable optical storage medium, based on the PHB phenomenon at a cryogenic temperature for realizing high-quality, high-density wavelength multiplexing optical storage. The medium would be characterized by a high-speed, high-efficiency photochemical reaction of a two or higher-photon process for the hole formation, a high-speed write-in (several tens of ns to several ns/bit) and read-out (several tens of ns to several ns/bit) in a focused laser spot (1 to 100 $\mu m\phi$), high sensitivity, high thermal stability, and high controllability to be prepared in the desired composition with good reproducibility.

It is another object of the present invention to provide an optical storage method which realizes highly sensitive and high speed write-in and read-out schemes, based on the fact that the population of the intermediate states of the PHB reaction would not decrease with time. The irradiation time interval between the frequency-selecting and the gating excitation can be taken from zero to hours at least in one of the two continuous processes of the PHB reaction. This would be due to the utilization of the medium of the present invention, which contains a stable reaction product as the intermediate of the PHB reaction.

An object of the present invention is to provide an optical memory storage medium comprising:

(a) a dispersive matrix having amorphous structure; and (b) guest molecules dispersed in the dispersive matrix, the dispersed guest molecules composed essentially of electron donors and electron acceptors being in a solid state at room temperatures, whereby the memory storage medium has an inhomogeneously broadened absorption band due to a distribution of local environments around the guest molecules dispersed in the dispersive matrix, and the distribution of local environments around the guest molecules dispersed in the dispersive matrix, and the memory storage medium is capable of recording at least non-volatile two data bits in a frequency domain by virtue of an irreversible multi-photonic photochemical reaction consisting of more than one photon process, and/or, the optical memory storage medium described the above, wherein at least one intermediate produced in the multi-photonic photochemical reaction is stable, and/or, an optical memory storage medium described the above, wherein said at least one intermediate is a triplet excited state of the electron donors, and/or, the optical memory storage medium described above, wherein at least one intermediates produced in the multi-photonic photochemical reaction is stable approximately at liquid helium temperature, and/or, the optical memory storage medium described the above, wherein at least one intermediates produced in the multi-photonic photochemical reaction is stable approximately at liquid helium temperature for more than one hour, and/or, the optical memory storage medium described the above, wherein the dispersive matrix is a substantially transparent polymer, and/or, the optical memory storage medium described the above, wherein the matrix is selected from the group consisting of polyethylene and polymethylmethacrylate, and/or, the optical memory storage medium described the above, wherein the electron donors are metal-free porphyrin derivatives, and/or, the optical memory storage medium described the above, wherein the electron donors are selected from the group consisting of metal-free tetraphenyl porphyrin and a zinc salt of metal-free tetraphenyl porphyrin, and/or, the optical memory storage medium described above, wherein the electron acceptors are molecules selected from the group consisting of halogenated benzene derivatives and halogenated condensed aromatic hydrocarbon derivatives, and/or, the optical memory storage medium described the above, wherein the halogenated benzene derivatives and halogenated condensed aromatic hydrocarbon derivatives are molecules selected from the group consisting of halogenated benzene, halogenated phenol, halogenated benzaldehyde, halogenated acetophenone, halogenated toluene, halogenated stilbene, halogenated bibenzyl, halogenated fluorene, halogenated phenazine, halogenated adamantane, halogenated phenanthrene, halogenated triphenylene, halogenated terphenyl, halogenated naphthalene, halogenated anthracene, halogenated pyrene, halogenated picene, halogenated biphenyl, halogenated benzonitrile, halogenated benzophenone, halogenated benzonic acid, and halogenated crycene, and/or, the optical memory storage medium described the above, wherein the halogenated benzene derivatives and halogenated condensed aromatic hydrocarbon derivatives are selected from the group consisting of 9-Bromo-anthracene, 1-Chloro-anthracene, alpha-Bromo-naphthalene, beta-Bromo-naphthalene, 4-Bromo-biphenyl, p-Chloro-benzonitrile, p-Chloro-benzophenone, 1-Chloro-4-iode-benzene, 3-Bromo-nitrobenzene. 2, 4-Dichloro-phenol, 1-Bromo-4-iode-benzene, 3-Bromo-nitrobenzene, 2, 4-Dichloro-phenol, 4-Chloro-benzaldehyde, 2-Iodo-benzoic acid, 2-Bromoacetophenone, 2-Bromo-4-Nitro-toluene, 4, 4'-Dichlorostilbene, 4, 4'-bis (Bromomethyl) bibenzyl, 2, 7-Dibromo-benzilidene-fluorene, 1-Chloro-phenazine, 1-Bromo-adamantane, 4-Bromo-pyrene, 5-Bromo-Chloro-phenazine, 1-Bromo-adamantane, 4-Bromo-pyrene, 5-Bromo-crycene, 3-Chloro-triphenylene, and 4-Bromo-p-terphenyl.

The other object of the invention is to provide method for memory storage in an optical memory storage medium, the optical memory storage medium composed essentially of a dispersive matrix having an amorphous structure, and guest molecules dispersed in the dispersive matrix, the guest molecules consisting essentially of electron donors and electron acceptors, whereby the recording medium has an inhomogeneously broadened absorption band due to a distribution of local environments around the guest molecules dispersed in the dispersive matrix, the method comprising the steps of:

(a) irradiating the recording medium with a first light beam of predetermined wavelengths;

(b) subsequently irradiating the recording medium at least once, 500 ms or more after the irradiation by the first light beam, whereby holes are created in a frequency domain by virtue of an irreversible multi-photonic photochemical reaction consisting of more than one photon process, thereby recording at least two non-volatile data bits, each of the data bits corresponding to one of the holes. and/or, the method for memory storage described above, wherein (a) the first light beam consists of a plurality of light components of selected wavelengths, the selected wavelengths being within the inhomogeneously broadened absorption band; and (b) irradiation by the first light beam is carried out by irradiating the recording medium with said plurality of light components in sequence, thereby creating holes corresponding to the frequencies of the light components, and/or, the method for memory storage described above, wherein (a) the first light consists of a plurality of light components of selected wavelengths, the selected wavelengths being within the inhomogeneously broadened absorption band; and (b) irradiation by the first light is carried out by irradiating the recording medium by said plurality of light components simultaneously, thereby creating holes corresponding to the frequencies of the light components, and/or, the method for memory storage described the above, wherein at least one reaction intermediate formed by the photochemical reaction is stable, and/or, the method for memory storage described the above, wherein th reaction intermediate is stable at about liquid helium temperatures.

The donor and acceptor are defined herein as follows:

1. The donor is a material which provides at least a single inhomogeneously broadened absorption band when dispersed in amorphous matrices, and can initiate a site-selective two or higher-photon photochemical reaction together with one or more species simultaneously present in the medium, when it is irradiated with a light of narrower band width than that of its absorption band.

2. Acceptor is a material which can trigger abovementioned multiphoton photochemical reactions between the above-mentioned donors which are simultaneously present in the medium.

The present invention is outlined below.

The first of the invention is related to an optical memory storage medium comprising the guest molecules and their dispersive matrix having an inhomogeneously broadened absorption band caused by a distribution of local environments of the matrix around the guest molecules; wherein the optical storage memory medium characterized in that at least non-volatile two data bits can be memorized in the frequency dimension by an irreversible multiphotonic photochemical reaction consisting of a more than two-photon process of the guest molecules; wherein the guest molecules are characterized in that the guest molecules are in a solid state at room temperature.

The second of the invention is related to an optical memory medium, consisting of guest molecules and a matrix capable of dispersing the guest molecules therein and having an inhomogeneously broadened absorption band caused by a distribution of local environments of the matrix around the guest molecules. The optical memory medium is characterized by at least two data bits can be memorized in the frequency dimension by a multiphotonic photochemical reaction consisting of a more than two photon process of the guest molecules, wherein at least one of the intermediates formed during the photochemical reaction is a stable product.

The stable product in the present invention is a compound which is stable at a cryogenic temperature below 100K. The third of the invention is related to a process for storing data bits in an optical memory medium consisting of guest molecules and a matrix capable of dispersing the guest molecules therein and having an inhomogeneously broadened absorption band caused by a distribution of local environments of the matrix around the guest molecules, in which a multiphotonic photochemical reaction consisting of a more than two photon process of the guest molecules is used to store the data bits at a frequency dimension during the data storing process, wherein these data bits can be stored at a light irradiation interval time extending 500 ms or longer in at least one of the two continuous data storing processes.

The fourth of the invention is related to a process for an optical memory storage medium comprising the guest molecules and their dispersive matrix having an inhomogeneously broadened absorption band caused by a distribution of local environments of the matrix around the guest molecules;

wherein the memory storage process is characterized in that by a frequency selective first process within a part of or throughout the inhomogeneously broadened absorption band of the guest molecules in which either the frequency is time-sequentially varied or lights of different frequencies are irradiated in parallel, both followed by $\lambda$ n irradiation (where n is an integer equal to or more than 2), a plurality of holes is formed simultaneously at a frequency of the frequency selective excitations, The optical memory medium of the present invention contains a stable reaction product as an intermediate state of a multiphotonic photochemical reaction consisting of a more than two-photon process of the guest molecules to form holes, which allows the larger number of the intermediate to exist than that in a medium containing an unstable intermediate such as the triplet excited state. The quantum yield of the photochemical reactions that contribute to the formation of holes is thereby increased. As a result, the optical memory medium of the present invention works as a high-sensitive medium to realize high-speed speed writing-in and reading-out with a focused laser spot emitted from a low-power CW laser.

The optical memory medium of the present invention uses a multiphotonic photochemical reaction consisting of a more than two-photon process to prevent the destructive read-out of burnt holes which is inevitable in the case of monophotonic photo-chemical reactions.

The optical storage process of the present invention uses the optical memory medium of the present invention, which allows the light irradiation time interval to change freely from zero to hours in one of the two continuous data storing processes, because the optical memory medium contains a stable reaction product in the intermediate stage of the hole formation, the number of which remains essentially unchanged with time. Similarly, the optical storage method of the present invention allows, in the process of storing the data bits at a frequency dimension by the diphotonic or higher multi-photonic photochemical reactions of the guest molecules, the hole-forming procedure wherein a part or all of the guest molecules' absorption band is irradiated with the frequency-selective light $\lambda_1$ (corresponding to the first process), whose frequency is changed time-sequentially and, then irradiated with the light $\lambda_n$ (n is an integer $\leq 2$), corresponding to the second and later processes, or wherein a part of all of the guest molecules' absorption band is irradiated with the frequency-selective lights of different frequencies, (corresponding to the first process) simultaneously, and then irradiated with the light $\lambda_n$ (n is an integer $\leq 2$), corresponding to the second and later processes, in order to form a plurarity of holes simultaneously at the frequency of the frequency-selective lights of different frequencies of the frequency-selective light.

Two methods are available for hole writing-in and reading-out, that is, bit by bit method or holographic method. Multiple storage at a frequency dimension may be performed using a frequency-tunable laser to change writing-in and reading-out frequency, or using a single frequency laser under the application of an electric, magnetic or strain field to the medium during the writing-in or reading-out process (Persistent Spectral Hole-Burning; Science and Applications, edited by W. B. Moerner and M. D. Levenson, published by Springel-Verlag (1988)).

Figure 1:
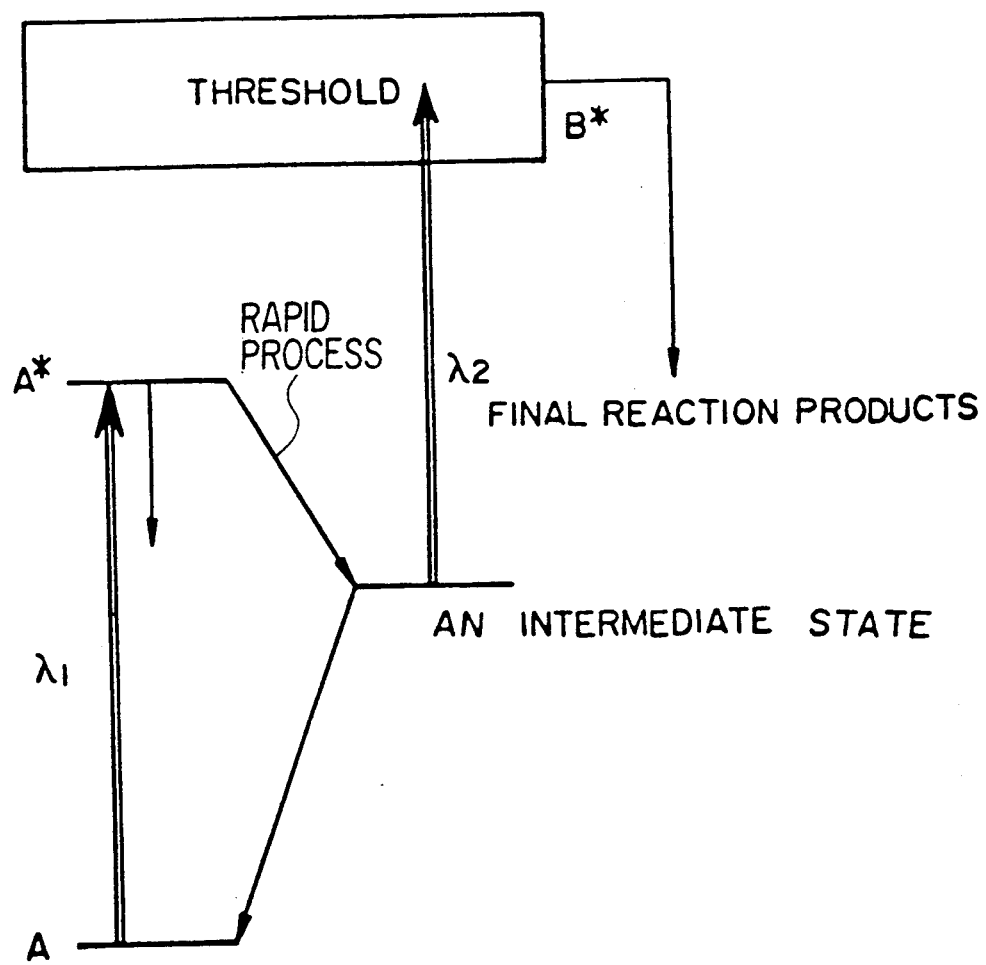
FIG. 1 is a schematic diagram of a photochemical reaction responsible for a hole formation in media of this invention.
Figure 2:
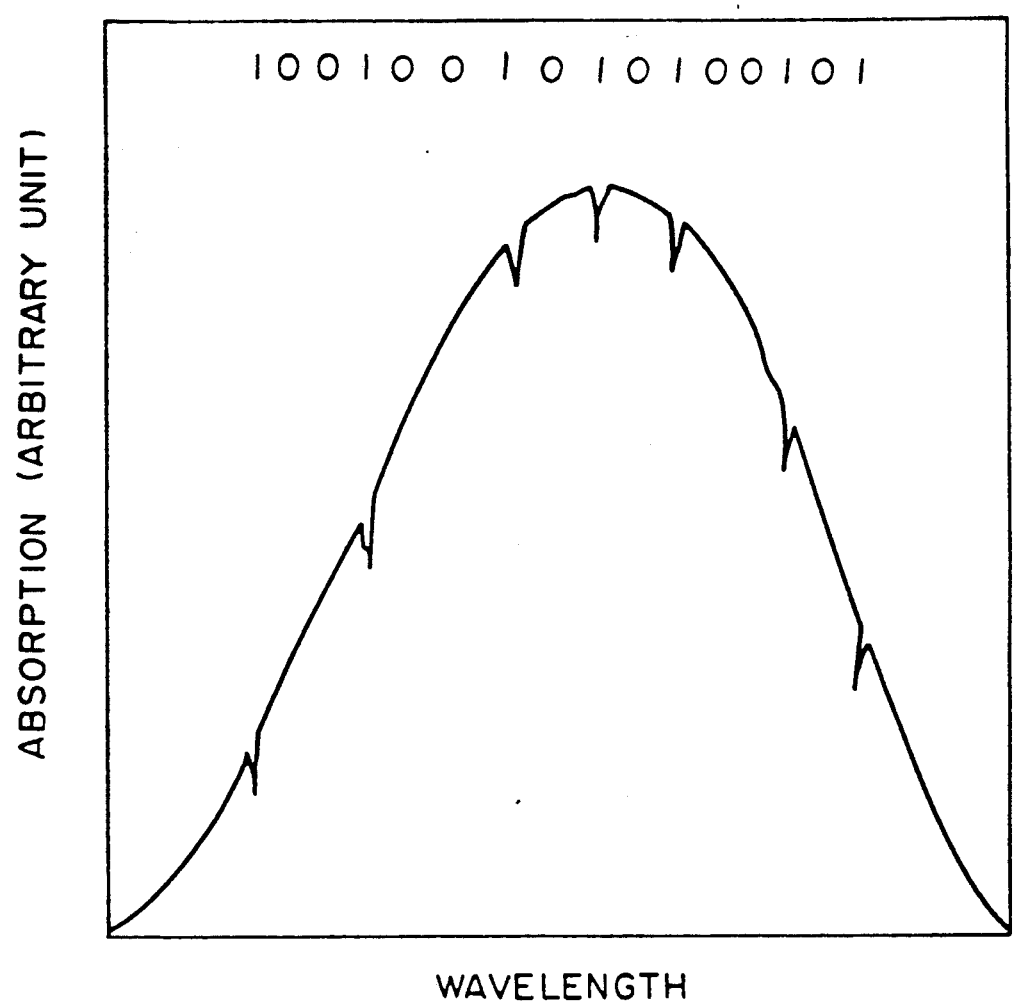
FIG. 2 is a schematic diagram of the wavelength multiplexing optical storage scheme by the PHB phenomenon.
Figure 4:
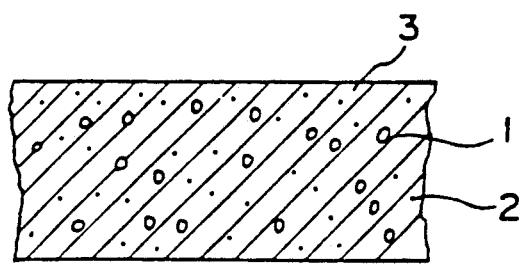
FIG. 4 illustrate absorption spectrum of media of this invention.

The present invention is more fully illustrated. FIG. 1 shows the concept of the multiphotonic photochemical reactions consisting of a more than two-photon process that contributes to the hole formation, where the diphotonic reactions are specifically selected, for convenience. The hole or hologram is recorded as a result of the diphotonic photochemical or photo-physical change into the state B* occurring in the medium. Such a change is accompanied by a change in refractive index and absorption coefficient. The process of the excitation to the state B* the following steps:

First, the electron donor molecule at the ground state is excited with photon $\lambda_1$ (the frequency-selective excitation), to the state A* and forms an intermediate state (stable or unstable). The intermediate thus formed, however, will not contribute to the hole formation because its absorption spectrum are similar to those of the original electron donor. The stable intermediate state does not return to the original state so long as it is kept at a sufficiently low temperature. Because of the photochemical or photophysical reaction that contributes to the hole formation, the intermediate forms the hole or hologram, when irradiated with wavelength $\lambda_2$ (the gating excitation) absorbable by the intermediate. It is preferable that $\lambda_1$ does not equal to $\lambda_2$ in order to prevent the destructive read-out of burnt holes. The condition of $\lambda_1 = \lambda_2$ is acceptable, however, because the destructive read-out can be essentially avoided if the light intensity is reduced to $1/10^2$ to $1/10^5$ as usually done in the reading-out process. This is because quantum yield of a diphotonic reaction process is proportional to the square of exciting light intensity. FIG. 4 shows the basic structure of the optical memory medium of the present invention, where the major component is the matrix that contains one or more types of photochemically reactive species. The number 1 and 2 stand for the photochemically reactive molecules, and 3 for the matrix. This figure specifically illustrates the system involving two types of photochemically reactive molecules. Any photoreaction is useful for the high-speed writing-in and reading-out (several tens ns to several ns/bit) in a focused laser spot (diameter: 1 to 100 $\mu m\phi$) if it forms the hole at a sufficiently high speed and has a high quantum yield. One of the useful reaction processes is electron transfer between a donor and an acceptor. Such a process falls into two general categories, one is intramolecular electron transfer, in which an electron transfers from a donor molecule to another acceptor molecule. From the viewpoint of reaction irreversibility needed to secure the persistence of holes, the latter is more useful for the optical memory medium of the present invention. To make the persistence of holes more decisively, the electron transfer process is preferably accompanied by an irreversible process, such as bond dissociation. One important criterion in selecting the desired donor/acceptor pairs is to select a combination that gives a negative free-energy change ($\Delta G$) for the reaction predicted by the equation:

$$\Delta G = F(Eox^D - Ered^A) - Eo.o - e^2/Rc\epsilon) \qquad (1)$$

where, $Eox^D$ is the oxidation potential of an electron donor, $Ered^A$ is the reduction potential of an electron acceptor, Eo.o is the electronic energy accumulated as a result of the $\lambda_1$ and the $\lambda_2$ excitation, and stabilization energy $-e^2/Rc\epsilon$ of the ion pair, by the medium, where, e: Electron charge, Rc: distance of the ionic pair, and $\epsilon$: dielectric constant of the medium (J. W. Verhoeven, Pure and Applied Chemistry, vol. 58 pp. 1285 (1986), 8.

Equation (1) is often simplified to equation (2) by neglecting the last term on the right side, because it is very small compared with the others:

$$\Delta G = F(Eox^D - Ered^A) - Eo.o \qquad (2)$$

There are necessary conditions that must be satisfied by the photochemically reactive molecule to be used for the optical memory medium of the present invention. The donor molecules useful for the optical memory medium of the present invention include a porphyrin derivative, such as metal-free tetraphenyl-porphyrin, and metal-free phthalocyanine. Molecules other than the above may be selected accounting for the properties of the partner molecule, and there should be a number of desired combinations. The desired combinations can be selected using the equation (2) above when electron transfer is used as the photochemical reaction. In most of donor/acceptor combinations selected using the equation (2), holes are formed by a two-photon electron transfer reaction via a triplet excited state of the donor as an intermediated state. Whether or not the stable intermediate is produced during the photochemical reaction process depends largely on the properties of the molecule involved in the reaction. More concretely, when the above-described porphyrin derivative is selected as a donor molecule, the desired acceptor molecule includes;a halogenated, condensed aromatic hydrocarbon compound represented by chloroanthracene, bromoanthracene, bromonaphthalene or chloronaphthalene: and another type of halogenated aromatic hydrocarbon compound represented by 4-chlorobiphenyl, 4-bromobiphenyl, 4-chloroterphenyl or 4-bromoterphenyl. Equation (2) can be used to select the desired combination. For example, the combination of the above-mentioned donor and acceptor molecules allows a persistent hole to be formed within the inhomogeneously broadened absorption band of the donor molecule by the diphotonic electron transfer from the donor molecule to the acceptor molecule to form a stable intermediate, and to dissociate the carbon-halogen bond in the acceptor molecule. The above is one example in which a hole is formed by the combination of diphotonic electron transfer to produce a stable intermediate and bond dissociation. The hole formation for the optical memory medium of the present invention is not limited to a diphotonic photochemical process, any multiphotonic process consisting of a more than two-photon process is useful for the present invention. The photochemically reactive molecule for the optical memory medium of the present invention is preferably stable at normal temperatures and solid in order to simplify the medium preparing process, to be stable in the medium, and to control the medium composition freely.

Any polymeric compound, rigid glass, inorganic glass, ceramic glass or protein can be used for the matrix of the optical memory medium of the present invention if it is capable of dispersing therein the photoreactive molecule represented by the aforementioned porphyrin derivative, and halogenated aromatic hydrocarbons; transparent at the O—O band region of the above molecule; large frequency multiplicity; and high thermal stability of burnt holes.

The desired material for the matrix of the optical memory medium of the present invention includes but is not limited to; polymeric compounds, such as polyolefin represented by polyethylene, polypropylene and polyisobutylene, polymethacrylate derivatives represented by polymethyl methacrylate and polyethyl methacrylate, polyvinyl chloride, polyvinylidene chloride, polyvinyl acetal represented by polybutyl acetal and polyvinyl carbazole, polyacrylate derivatives represented by polyacrylonitrile, polymethyl acrylate and polyethyl acrylate, polycyanoacrylate derivatives represented by alpha-methylcyanoacrylate, alpha-ethylcyanoacrylate and alpha-isobutylcyanoacrylate, polystyrene derivatives, polybutadiene, a copolymer of any of the above, aromatic polycarboxylic derivative, polyamide derivative, polyvinyl alcohol derivative, polyimide derivatives, polycarbonate derivatives, polyurethane derivatives, polyether derivatives represented by polyphenylene oxide, and polyacetal derivatives; rigid glass, such as alcohol represented by ethanol, glycol, glycerol, ether, n-alkane, ketone, ester, amide, and mixture thereof; inorganic or ceramic glass, such as silicate glass, binary silicate glass, borate glass, phosphate glass, borosilicate glass.

As heretofore mentioned, in the material system having a hole-formation mechanism through a multi-photon (more than 2) photochemical reaction, the present invention provides a optical memory medium, which realizes stable, high-quality, high-density optical memory, carrying on high-speed write (several tens ns to several ns/bit) and high-speed read (several tens ns to several ns/bit) by using a focused laser spot (1 to 100 μm diameter) with high sensitivity and high thermal stability of burnt holes, and is easily prepared in a desired composition with good reproducibility. Also, an optical memory process, by which sensitive and easy high-speed write and read processing are feasible, is provided based on the fact that stable reaction products are contained in the intermediate state of hole formation and that the time intervals between the frequency-selective first photon and the gating second photon are arbitrarily determined from zero to hours because the decrease in the population of the intermediate state with time is negligible.

EXAMPLES

The following examples provide merely a detailed illustration of the present invention and are not intended to limit the scope thereof.

Examples of the present invention are made up of the following Example 1,2,3.

The following Example 1 comprises the combined Examples 1-1 to 1-67, but Examples 1-5, 1-16, 1-27, 1-38, 1-49 are deleted.

Example 2 comprises the combined Example 2-1 to 2-12, but Example 2-5, is deleted.

Example 3 comprises the combined Example 3-1 to 3-21, but Example 3-20 is deleted.

EXAMPLE 1-1

Figure 3:
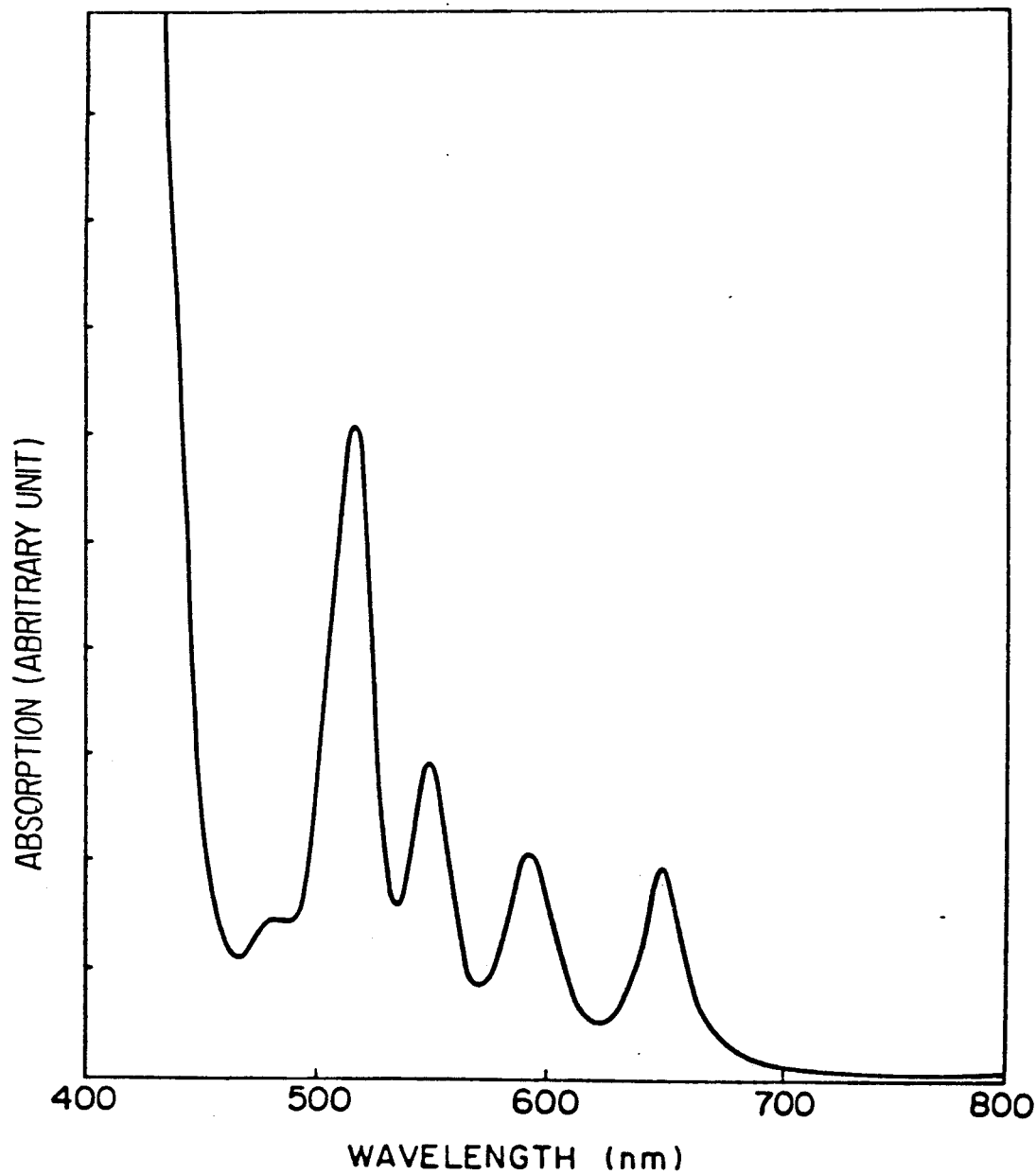
FIG. 3 illustrates absorption spectrum of the medium 1-1 (TPP-B(1-Cl, 4l)/PMMA).
Figure 6:
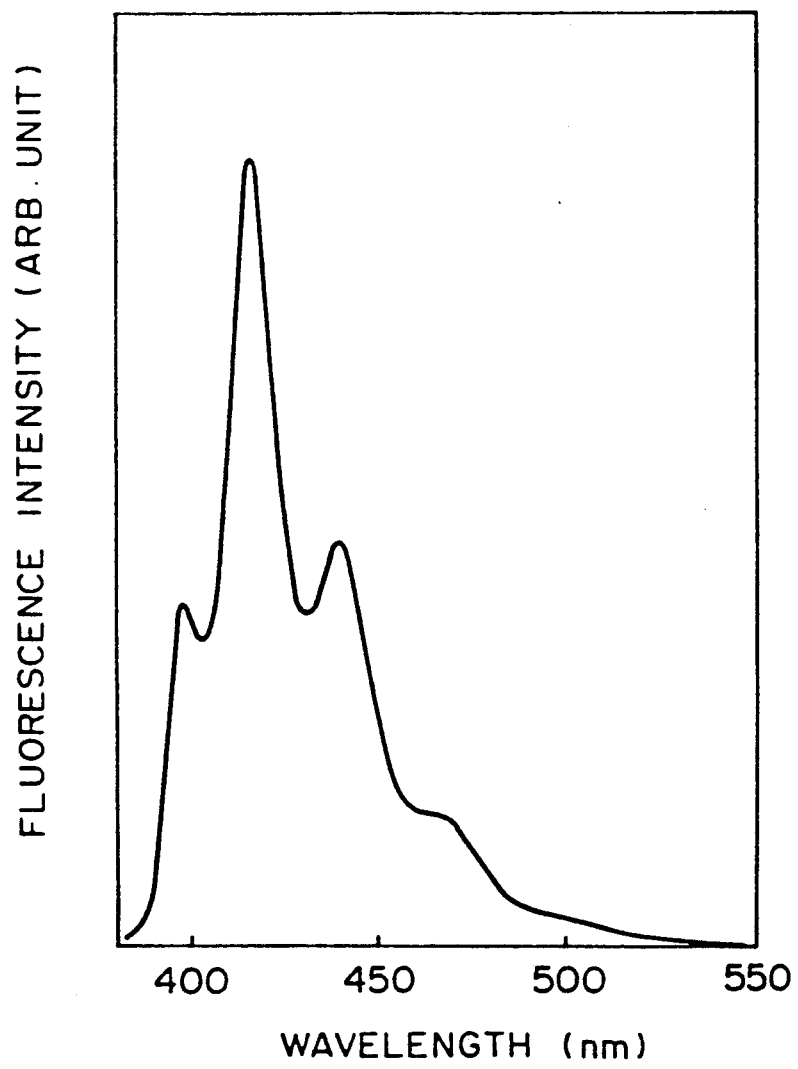
FIG. 6 illustrates fluorescence spectrum of 9-ABr in cyclohexane solution.

A mixed chloroform solution of metal-free tetraphenylporphyrin (hereinafter, "TPP") or its zinc salt (hereinafter, "ZnTPP") and 1-chloro-4-iodobenzene (hereinafter, "B(1-Cl, 4-I)") or 1-chloro-4-bromobenzene (hereinafter, "B(1-Cl, 4-Br)") or 1-bromo-4-iodobenzene (hereinafter, "B(1-Br, 4-I)") or 1, 4-dibromobenzene (hereinafter, "B(1,4-Br$_2$)") or 2-bromonitrobenzene (hereinafter, "2-NBBr") or 3-bromonitrobenzene (hereinafter, "3-NBBr") or 4-bromonitrobenzene (hereinafter, "4-NBBr") or 4-chloronitrobenzene (hereinafter, "4-NBCl") or 2-iodonitrobenzene (hereinafter, "2-NBI") or 4-iodonitrobenzene (hereinafter, "4-NBI") or 2,6-dimethyl-4-bromonitrobenzene (hereinafter, "NB(2,5-DM, 4-Br") with commercially available PMMA (the concentration of these molecules is shown in Table 1-1 below) was cast on a transparent glass substrate under a nitrogen gas atmosphere at 50° C. to 60° C. for 24 hours, then, kept under reduced pressure using a rotary pump at 150° C. for 48 hours, to completely remove the solvent. Thus, 1 mm thick films were prepared. As an example, the absorption spectrum of the medium 1-1 in the visible region is shown in FIG. 3. Namely, FIG. 3 is an absorption spectrum diagram showing wavelength (nm) on the x-axis and absorbance (in arbitrary units) on the y-axis.

TABLE 1

PMMA Host Media

| Medium No. | Donor TPP (mol/l) | Acceptor B(1-Cl, 4-I) (mol/l) | Acceptor B(1-Cl, 4-Br) (mol/l) |
|---|---|---|---|
| 1-1 | $5.2 \times 10^{-4}$ | $5.2 \times 10^{-4}$ | |
| 1-2 | $5.1 \times 10^{-4}$ | | $5.3 \times 10^{-4}$ |

| Medium No. | Donor TPP (mol/l) | Acceptor B(1-Br, 4-I) (mol/l) | Acceptor B(1,4-Br$_2$) (mol/l) |
|---|---|---|---|
| 1-3 | $5.5 \times 10^{-4}$ | $5.1 \times 10^{-4}$ | |
| 1-4 | $4.7 \times 10^{-4}$ | | $5.0 \times 10^{-4}$ |

| Medium No. | Donor TPP (mol/l) | Donor ZnTPP (mol/l) | Acceptor B(1-Cl, 4-I) (mol/l) | Acceptor 2-NBBr (mol/l) |
|---|---|---|---|---|
| 1-5 | $5.3 \times 10^{-4}$ | | | $4.9 \times 10^{-4}$ |
| 1-6 | | $5.0 \times 10^{-4}$ | $5.1 \times 10^{-4}$ | |

| Medium No. | Donor TPP (mol/l) | Acceptor 3-NBBr (mol/l) | Acceptor 4-NBBr (mol/l) |
|---|---|---|---|
| 1-7 | $5.1 \times 10^{-4}$ | $5.3 \times 10^{-4}$ | |
| 1-8 | $5.2 \times 10^{-4}$ | | $5.3 \times 10^{-4}$ |

| Medium No. | Donor TPP (mol/l) | Acceptor 4-NBCl (mol/l) | Acceptor 2-NBI (mol/l) |
|---|---|---|---|
| 1-10 | $5.1 \times 10^{-4}$ | $5.2 \times 10^{-4}$ | |
| 1-11 | $5.6 \times 10^{-4}$ | | $4.8 \times 10^{-4}$ |

| Medium No. | Donor TPP (mol/l) | Acceptor 4-NBI (mol/l) | Acceptor NB(2,5-DM, 4-Br) (mol/l) |
|---|---|---|---|
| 1-12 | $5.1 \times 10^{-4}$ | $5.0 \times 10^{-4}$ | |
| 1-13 | $5.0 \times 10^{-4}$ | | $5.1 \times 10^{-4}$ |

EXAMPLE 1-2

A mixed hot p-xylene solution of TPP or ZnTPP and B(1-Cl, 4-I) or B(1-Cl, 4-Br) or B(1-Br, 4-I) or B(1,4-Br2) or 2-NBBr or 3-NBBr or 4-NBBr or 4-NBCl or 2-NBI or 4-NBI or NB(2,5-DM, 4-Br) with commercially available high-density polyethylene (PE)(the concentration of these molecules is shown in Table 1-2 below) was cast on a transparent glass substrate under a nitrogen gas atmosphere at 120° C. for 24 hours, then kept under reduced pressure using a rotary pump at 150° C. for 48 hours to completely remove the solvent. Thus, films 100 to 200 μm thick were prepared. The absorption spectra of these media look similar to those of the media in Example 1-1.

TABLE 2

PE Host Media

| Medium No. | Donor TPP (mol/l) | Acceptor B(1-Cl, 4-I) (mol/l) | Acceptor B(1-Cl, 4-Br) (mol/l) |
|---|---|---|---|
| 1-14 | $5.3 \times 10^{-4}$ | $5.1 \times 10^{-4}$ | |
| 1-15 | $5.0 \times 10^{-4}$ | | $5.5 \times 10^{-4}$ |

| Medium No. | Donor TPP (mol/l) | Acceptor B(1-Br, 4-I) (mol/l) | Acceptor B(1,4-Br2) (mol/l) |
|---|---|---|---|
| 1-16 | $4.8 \times 10^{-4}$ | $5.3 \times 10^{-4}$ | |
| 1-17 | $5.2 \times 10^{-4}$ | | $5.1 \times 10^{-4}$ |

| Medium No. | Donor TPP (mol/l) | Donor ZnTPP (mol/l) | Acceptor B(1-Cl, 4-I) (mol/l) | Acceptor 2-NBBr (mol/l) |
|---|---|---|---|---|
| 1-18 | $5.0 \times 10^{-4}$ | | | $5.3 \times 10^{-4}$ |
| 1-19 | | $5.0 \times 10^{-4}$ | $5.0 \times 10^{-4}$ | |

| Medium No. | Donor TPP (mol/l) | Acceptor 3-NBBr (mol/l) | Acceptor 4-NBBr (mol/l) |
|---|---|---|---|
| 1-20 | $5.1 \times 10^{-4}$ | $4.8 \times 10^{-4}$ | |
| 1-21 | $5.1 \times 10^{-4}$ | | $5.1 \times 10^{-4}$ |

| Medium No. | Donor TPP (mol/l) | Acceptor 4-NBCl (mol/l) | Acceptor 2-NBI (mol/l) |
|---|---|---|---|
| 1-23 | $4.9 \times 10^{-4}$ | $5.5 \times 10^{-4}$ | |
| 1-24 | $5.3 \times 10^{-4}$ | | $5.3 \times 10^{-4}$ |

| Medium No. | Donor TPP (mol/l) | Acceptor 4-NBI (mol/l) | Acceptor NB(2,5-DM, 4-Br) (mol/l) |
|---|---|---|---|
| 1-25 | $5.5 \times 10^{-4}$ | $5.1 \times 10^{-4}$ | |
| 1-26 | $5.0 \times 10^{-4}$ | | $5.2 \times 10^{-4}$ |

EXAMPLE 1-3

The oxidation potential of TPP and ZnTPP, and the reduction potential of B(1-Cl, 4I), B(1-Cl, 4-Br), B(1-Br, 4-I), B(1,4-Br2), B(1-Cl, 4I), 2-NBBr, 3-NBBr, 4-NBBr, 2-NBCl, 2-NBI, 4-NBI and NB(2,5-DM, 4-Br) were measured by an electrochemical method under the conditions shown in Table 1-3 below. The results are summarized in Table 1-3.

TABLE 1-3

Oxidation and Reduction Potential of the Guest Molecules

| | Solvent | Supporting electrolyte | Oxidation or reduction potential |
|---|---|---|---|
| TPP | $CH_2Cl_2$ | $Bu_4NBF_4$ | 0.95 (V vs SCE) |
| ZnTPP | $CH_2Cl_2$ | $Bu_4NBF_4$ | 0.71 |
| B(1-Cl, 4-I) | MeCN | $Bu_4NBF_4$ | $-1.56$ |
| B(1-Cl, 4-Br) | MeCN | $Bu_4NBF_4$ | $-1.96$ |
| B(1-Br, 4-I) | MeCN | $Bu_4NBF_4$ | $-1.55$ |

TABLE 1-3-continued

Oxidation and Reduction Potential of the Guest Molecules

| | Solvent | Supporting electrolyte | Oxidation or reduction potential |
|---|---|---|---|
| B(1,4-Br2) | MeCN | $Bu_4NBF_4$ | $-1.71$ |
| 2-NBBr | MeCN | $Bu_4NBF_4$ | $-1.03$ |
| 3-NBBr | MeCN | $Bu_4NBF_4$ | $-1.15$ |
| 4-NBBr | MeCN | $Bu_4NBF_4$ | $-1.15$ |
| 4-NBCl | MeCN | $Bu_4NBF_4$ | $-1.04$ |
| 2-NBI | MeCN | $Et_4NClO_4$ | $-1.10$ |
| 4-NBI | MeCN | $Et_4NClO_4$ | $-1.09$ |
| NB(2,5-DM, 4-Br) | MeCN | $Et_4NClO_4$ | $-1.27$ |

According to the oxidation potential or the reduction potential in Table 1-3 it was found that selected combinations of donor ZnTPP with an acceptor, except B(1-Cl, 4-I), B(1-Cl, 4-Br), B(1-Br, 4-I) and B(1,4-Br2), gave negative values of $\Delta G$ calculated from Eq. (2), so that a single-photon intermolecular electron transfer reaction can occur by photoexcitation to $Q_1$ absorption band of ZnTPP (ca. 588 nm). On the other hand, for all the other combinations, it was found that a single-photon intermolecular electron transfer reaction cannot occur. However, a two-photon intermolecular electron transfer reaction, for example, via the triplet excited state of the donor as an intermediate state, can occur.

EXAMPLE 1-4

After the media shown in Table 1-1 or Table 1-2 were cooled down to liquid helium temperature (7 K), they were irradiated by a single pulse of a YAG laser-pumped pulsed dye laser at 645 nm (pulse width: 2.5 ns, band width: 1 cm$^{-1}$) in a range of irradiation energy of 0.1 to 10 mJ/cm$^2$ pulse. However, no hole was formed in the $Q_1$ absorption band of TPP. Therefore, it was found that no hole was formed due to a single-photon photochemical reaction under the above irradiation conditions. This fact supported the result of Example 1-3 and also indicated that no hole was formed by other single-photon photochemical reactions, (for example, a proton tautomerization) under the foregoing experimental conditions.

EXAMPLE 1-5 (-- delete)

EXAMPLE 1-6

After the media in Table 1-1 and Table 1-2 were cooled down to liquid helium temperature, they were irradiated simultaneously with a single pulse (irradiation energy: 0.5 mj/cm$^2$/pulse) of a YAG laser-pumped pulse dye laser (pulse width: 2.5 ns, band width: 1 cm$^{-1}$) at 645 nm and a single pulse (irradiation energy: 0.5 mJ/cm$^2$/pulse) of an Ar laser (pulse width: 20 ms) pulsed by a shutter. A hole with a 1.5 cm$^{-1}$ was formed in all the media. Then, the media were simultaneously irradiated with a single pulse (pulse width: 1 /μs) of an Ar laser-pumped CW dye laser at 645 nm (band width: $<1 \times 10^{-4}$ cm$^{-1}$) pulsed by means of an acousto-optic modulator and a single pulse (pulse width: 20 ms) of an Ar laser pulsed by a shutter with the power listed in Table 1-5 below in order to carry out the irradiation by a light source with narrow band width and the high sensitive detection. Holes were then detected by a laser double-beam scanning technique with the same CW dye laser. A hole was produced in the $Q_1$ absorption band of TPP in all the media. The hole width and the hole formation yield in each medium were summarized in Table 1-5. The hole formation yield was larger by an order of magnitude for the media in PE matrix than for those in PMMA matrix. In the table below, $\Delta\alpha/\alpha$ indicates the hole depth ($\Delta\alpha=\alpha-\alpha'$), and $\alpha, \alpha'$ indicate the initial and final absorption coefficients at the laser frequency, respectively.

TABLE 1-5

| | Irradiation Condition and Hole Characteristics | | | |
|---|---|---|---|---|
| | Irradiation power | | Hole | |
| Medium No. | $\lambda_1$ ($\mu$W/ cm$^2$/pulse) | $\lambda_2$ ($\mu$W/ cm$^2$/pulse) | width (GHz) | $\Delta\alpha/\alpha$ (%) |
| 1-1 | 200 | 80 | 9.7 | 2.5 |
| 1-2 | 200 | 80 | 9.9 | 2.6 |
| 1-3 | 200 | 80 | 9.0 | 2.4 |
| 1-4 | 200 | 80 | 8.9 | 2.5 |
| 1-5 | 200 | 80 | 9.9 | 2.6 |
| 1-7 | 200 | 80 | 10.0 | 2.4 |
| 1-8 | 200 | 80 | 9.7 | 2.5 |
| 1-10 | 200 | 80 | 9.0 | 2.4 |
| 1-11 | 200 | 80 | 8.7 | 2.5 |
| 1-12 | 200 | 80 | 8.9 | 2.6 |
| 1-13 | 200 | 80 | 9.2 | 2.4 |
| 1-14 | 15 | 80 | 9.5 | 3.2 |
| 1-15 | 15 | 80 | 9.8 | 1.9 |
| 1-16 | 15 | 80 | 8.7 | 1.8 |
| 1-17 | 15 | 80 | 9.5 | 3.2 |
| 1-18 | 15 | 80 | 10.8 | 2.9 |
| 1-20 | 15 | 80 | 9.5 | 2.2 |
| 1-21 | 15 | 80 | 10.8 | 1.9 |
| 1-23 | 15 | 80 | 9.7 | 1.8 |
| 1-24 | 15 | 80 | 9.7 | 2.5 |
| 1-25 | 15 | 80 | 10.2 | 2.6 |
| 1-26 | 15 | 80 | 9.0 | 2.4 |

EXAMPLE 1-7

After the media in Table 1-1 or Table 1-2 were cooled down to liquid helium temperature, they were irradiated simultaneously with a single pulse (irradiation energy: 0.3 mJ/cm$^2$/pulse) of a YAG laser-pumped dye laser at 645 nm (pulse width: 2.5 ns, band width: 1 cm$^{-1}$) and a single pulse (irradiation energy: 0.5 mJ/cm$^2$/pulse) of a N$_2$ laser-pumped pulse dye laser at 380 nm (pulse width: 8 ns). A Hole with a width of about 1.5 cm$^{-1}$ was formed in all the media. Then, they were irradiated simultaneously with a single pulse (pulse width: 1 $\mu$s) of an Ar laser-pumped CW dye laser at 645 nm (band width: <1×10$^{-4}$ cm$^{-1}$) pulsed by an acousto-optic modulator and a single pulse (pulse width: 8 ns) of a N$_2$ laser-pumped pulse dye laser at 380 nm with the power listed in Table 1-6 below in order to carry out the irradiation by a light source with narrow bandwidth and the high sensitive detection. Holes were then detected by a laser double-beam scanning technique with the same CW dye laser. A hole was produced in the Q$_1$ band of TPP in all the media. The hole width and the hole formation yield in each medium were summarized in Table 1-6. The hole formation yield was larger by an order for the media in PE matrix than for those in PMMA matrix.

TABLE 1-6

| | Irradiation Conditions and Hole Characteristics | | | |
|---|---|---|---|---|
| | Irradiation power | | Hole | |
| Medium No. | $\lambda_1$ ($\mu$W/ cm$^2$/pulse) | $\lambda_2$ ($\mu$W/ cm$^2$/pulse) | width (GHz) | $\Delta\alpha/\alpha$ (%) |
| 1-1 | 180 | 80 | 9.9 | 3.2 |
| 1-2 | 180 | 80 | 9.8 | 3.6 |
| 1-3 | 180 | 80 | 10.0 | 3.4 |
| 1-4 | 180 | 80 | 9.9 | 3.5 |
| 1-5 | 180 | 80 | 8.9 | 3.6 |
| 1-7 | 180 | 80 | 10.2 | 3.4 |
| 1-8 | 180 | 80 | 9.7 | 3.5 |

TABLE 1-6-continued

| | Irradiation Conditions and Hole Characteristics | | | |
|---|---|---|---|---|
| | Irradiation power | | Hole | |
| Medium No. | $\lambda_1$ ($\mu$W/ cm$^2$/pulse) | $\lambda_2$ ($\mu$W/ cm$^2$/pulse) | width (GHz) | $\Delta\alpha/\alpha$ (%) |
| 1-10 | 180 | 80 | 9.5 | 3.4 |
| 1-11 | 180 | 80 | 9.7 | 3.5 |
| 1-12 | 180 | 80 | 9.2 | 3.6 |
| 1-13 | 180 | 80 | 9.3 | 3.4 |
| 1-14 | 15 | 80 | 9.5 | 3.2 |
| 1-15 | 15 | 80 | 9.3 | 3.9 |
| 1-16 | 15 | 80 | 9.7 | 3.8 |
| 1-17 | 15 | 80 | 9.9 | 3.2 |
| 1-18 | 15 | 80 | 10.2 | 3.9 |
| 1-20 | 15 | 80 | 9.5 | 2.2 |
| 1-21 | 15 | 80 | 10.2 | 3.9 |
| 1-23 | 15 | 80 | 9.7 | 3.8 |
| 1-24 | 15 | 80 | 9.2 | 3.5 |
| 1-25 | 15 | 80 | 10.5 | 3.6 |
| 1-26 | 15 | 80 | 9.3 | 3.4 |

EXAMPLE 1-8

The effect of the irradiation time interval between the frequency-selecting and the gating excitation, $\tau$, on the hole formation was investigated for the $\tau$ value of 0-1 sec, taking the medium 1-1 as an example. After cooling the medium 1-1 down to liquid helium temperature, it was irradiated with a single pulse (pulse width: 1 $\mu$m) of an Ar laser-pumped CW dye laser at 645 nm (band-width: <1×10$^{-4}$ cm$^{-1}$) pulsed by an acousto-optic modulator and a single pulse (pulse width: 20 ms) of an Ar laser pulsed by a shutter for the above-mentioned range of the $\tau$ value with the power listed in Table 1-5 in order to carry out the irradiation by a light source with narrow bandwidth and the high sensitive detection. Holes were then detected by a laser double-beam scanning technique with the same CW dye laser. The hole formation was observed when the $\tau$ value was within several tens of ms. This indicates that for the medium 1-1, a two-photon hole formation occurs via the triplet excited state of TPP as an intermediate state.

EXAMPLE 1-9

The effect of the pulse width of the frequency-selecting excitation on hole formation was examined in the range of 8 ms to 2.5 ns taking the medium 1-2 as an example. After cooling the medium 1-2 down to liquid helium temperature, it was irradiated simultaneously with a single pulse of 645 nm light of either a YAG laser-pumped pulse dye laser for a pulse width of 2.5 ns, or an Ar laser-pumped CW dye laser pulsed by an acousto-optic modulator or by a shutter for a pulse width of 1 $\mu$s–8 ms, and a single pulse (pulse width: 20 ms, irradiation power: 100 $\mu$W/cm$^2$/pulse) of an Ar laser pulsed by a shutter with the power listed in Table 1-7 below. The width and the depth of the burnt hole under each irradiation condition were summarized in Table 1-7.

TABLE 1-7

| Dependence of Hold Characteristics on Irradiation Light Pulse Width | | | |
|---|---|---|---|
| Pulse width ($\mu$S) | Irradiation power ($\mu$W/cm$^2$/pulse) | Hole width (GHz) | $\Delta\alpha/\alpha$ (%) |
| 2.5 × 10$^{-3}$ | 400 | 19.8 | 3.1 |
| 1 | 100 | 11.2 | 3.0 |
| 10 | 100 | 11.4 | 3.1 |
| 100 | 80 | 12.7 | 3.2 |

TABLE 1-7-continued

Dependence of Hold Characteristics on Irradiation Light Pulse Width

| Pulse width ($\mu$S) | Irradiation power ($\mu$W/cm$^2$/pulse) | Hole width (GHz) | $\Delta a/a$ (%) |
|---|---|---|---|
| 8000 | 60 | 13.5 | 2.8 |

EXAMPLE 1-10

The effect of the laser-irradiated spot on hole formation was examined taking the medium 1-2 as an example. Medium 1-2 was irradiated simultaneously with a focused single pulse (pulse width: 1 /$\mu$s, irradiation power: 100 $\mu$W/cm$^2$/pulse) of an Ar laser-pumped CW dye laser at 645 nm (bandwidth: $<1\times10^{-4}$ cm$^{-1}$) pulsed by an acousto-optic modulator and a focused single pulse (pulse width: 20 ms, irradiation power: 100 $\mu$W/cm$^2$/pulse) of an Ar laser pulsed by a shutter at liquid helium temperature. A hole was detected by means of a laser double-beam scanning technique using the same focused laser beam in the burning. A hole could be detected up to the focused laser spot of 100 $\mu$m$\phi$.

EXAMPLE 1-11

In order to examine the effect of acceptor concentration on hole formation, the media in PMMA matrix with the guest concentration shown in Table 1-8 were prepared by the same method as in Example 1-1.

TABLE 1-8

PMMA Host Media with a Highly-doped Acceptor

| Medium No. | Donor TPP (mol/l) | Acceptor B(1-Cl, 4-Br) (mol/l) |
|---|---|---|
| 1-27 | 5.0 × 10$^{-4}$ | 2.6 × 10$^{-3}$ |
| 1-28 | 5.1 × 10$^{-4}$ | 5.0 × 10$^{-2}$ |
| 1-29 | 5.2 × 10$^{-4}$ | 5.1 × 10$^{-1}$ |

After the media in Table 1-9 were cooled down to liquid helium temperature, they were irradiated simultaneously with a single pulse (pulse width: 1 $\mu$s) of an Ar laser-pumped pumped CW dye laser at 645 nm (bandwidth: $<1\times10^{-4}$ cm$^{-1}$) pulsed by an acousto-optic modulator and a single pulse (pulse width: 20 ms, irradiation power: 100 $\mu$W/cm$^2$/pulse) of an Ar laser pulsed by a shutter with the power listed in Table 1-9 below. This resulted in hole formation at the Q$_1$ absorption band of TPP. The hole width and hole depth in each medium are summarized in Table 1-9. The hole formation yield did not show any marked change when the acceptor concentration increased from the value in the medium 1-2 to that in the medium 27. On the other hand, the hole formation yield increased about by an order of magnitude when the acceptor concentration increased from the value in the medium 1-2 to that in the medium 1-28 or 1-29. This indicates that the hole formation yield depends on the average distance between donor and acceptor molecules. Also, the experimental results explain why the hole formation yield is larger about by an order of magnitude for the PE matrix than for the PMMA matrix. In crystalline polymers, such as PE, since guest molecules are dispersed in their amorphous region [Th. Sesselmann, W. Richter, D. Haarer, and H. Morawitz: Phys. Rev., B36, p.7601 (1987)], the distance between donor and acceptor is smaller than that in amorphous polymers such as PMMA even if the guest concentration is the same as that in PMMA.

TABLE 1-9

Irradiation Condition and Hole Characteristics of PMMA Medium with Highly-Doped Acceptor

| Medium No. | Irradiation power ($\mu$W/cm$^2$/pulse) | Hole width (GHz) | $\Delta a/a$ (%) |
|---|---|---|---|
| 1-27 | 100 | 12.0 | 3.2 |
| 1-28 | 10 | 13.2 | 5.5 |
| 1-29 | 20 | 14.4 | 4.5 |

EXAMPLE 1-12

A mixed chloroform solution of TPP or ZnTPP and 2.4-dichlorophenol (hereinafter, "2,4-PCl2") or 4-chlorobenzaldehyde (hereinafter, "4-BACl") or 2-iodobenzoic acid (hereinafter, "2-BAcI") or 3-iodobenzoic acid (hereinafter "3-BAcI") or 4-iodobenzoic acid (hereinafter, "4-BAcI") with commercially available PMMA (the concentration of these molecules is shown in Table 1-10 below) was cast on a transparent glass substrate under a nitrogen gas atmosphere at 50° C. to 60° C. for 24 hours, then kept under reduced pressure using a rotary pump at 150° C. for 48 hours to completely remove the solvent. Thus, 1 mm thick films were prepared. The absorption spectra of these media look similar to that in FIG. 3.

TABLE 1-10

PMMA Host Media

| Medium No. | Donor TPP (mol/l) | Donor ZnTPP (mol/l) | Acceptor 2,4-PCl$_2$ (mol/l) | Acceptor 4-BACl (mol/l) |
|---|---|---|---|---|
| 1-101 | 4.9 × 10$^{-4}$ | | 5.1 × 10$^{-4}$ | |
| 1-102 | 5.0 × 10$^{-4}$ | | | 5.0 × 10$^{-4}$ |
| 1-106 | | 4.8 × 10$^{-4}$ | 5.0 × 10$^{-4}$ | |

| Medium No. | Donor TPP (mol/l) | Donor 2-BAcI (mol/l) | Acceptor 3-BAcI (mol/l) | Acceptor 4-BAcI (mol/l) |
|---|---|---|---|---|
| 1-107 | 5.1 × 10$^{-4}$ | 5.1 × 10$^{-4}$ | | |
| 1-108 | 5.1 × 10$^{-4}$ | | 5.4 × 10$^{-4}$ | |
| 1-109 | 5.2 × 10$^{-4}$ | | | 5.5 × 10$^{-4}$ |

Example 1-13

A mixed hot p-xylene solution of TPP or ZnTPP and 2,4-PCl$_2$, or 4-BACl, or 2-BAcI or 3-BAcI or 4-BAcI with commercially available PE (the concentration of these molecules is shown in Table 1-11 below) was cast on a transparent glass substrate under a nitrogen gas atmosphere at 120° C. for 24 hours and, then, kept under reduced pressure using a rotary pump at 150° C. for 48 hours to completely remove the solvent. Thus, 100 to 200 $\mu$m thick were prepared. Absorption spectra of these media look similar to that in FIG. 3.

TABLE 1-11

PE Host Media

| Medium No. | Donor TPP (mol/l) | Donor ZnTPP (mol/l) | Acceptor 2,4-PCl$_2$ (mol/l) | Acceptor 4-BACl (mol/l) |
|---|---|---|---|---|
| 1-110 | 5.3 × 10$^{-4}$ | | 5.5 × 10$^{-4}$ | |
| 1-111 | 5.1 × 10$^{-4}$ | | | 5.5 × 10$^{-4}$ |
| 1-115 | | 5.6 × 10$^{-4}$ | 5.1 × 10$^{-4}$ | |

| Medium No. | Donor TPP (mol/l) | Donor 2-BAcI (mol/l) | Acceptor 3-BAcI (mol/l) | Acceptor 4-BAcI (mol/l) |
|---|---|---|---|---|

TABLE 1-11-continued

| PE Host Media | | | | |
|---|---|---|---|---|
| 1-116 | $5.0 \times 10^{-4}$ | $5.5 \times 10^{-4}$ | | |
| 1-117 | $5.0 \times 10^{-4}$ | | $5.0 \times 10^{-4}$ | |
| 1-118 | $5.1 \times 10^{-4}$ | | | $5.2 \times 10^{-4}$ |

EXAMPLE 1-14

Using electrochemical methods, the oxidation potential of TPP and ZnTPP and the reduction potential of 2,4-$PCl_2$, 4-BACl, 2-BAcl, 3-BAcl and 4-BAcl were measured under conditions shown in Table 1-12 below. The results are summarized in Table 1-12.

TABLE 1-12

| Oxidation and Reduction Potential of the Guest Molecules | | | |
|---|---|---|---|
| | Solvent | Supporting electrolyte | Oxidation or reduction potential |
| TPP | $CH_2Cl_2$ | $Bu_4NBF_4$ | 0.95 (V vs SCE) |
| ZnTPP | $CH_2Cl_2$ | $Bu_4NBF_4$ | 0.71 |
| 2,4-$PCl_2$ | MeCN | $Bu_4NBF_4$ | −1.67 |
| 4-BACl | MeCN | $Bu_4NBF_4$ | −1.43 |
| 2-BAcl | MeCN | $Et_4NClO_4$ | −1.51 |
| 3-BAcl | MeCN | $Et_4NClO_4$ | −1.51 |
| 4-BAcl | MeCN | $Et_4NClO_4$ | −1.51 |

According to the oxidation potential or the reduction potential in Table 1-12 it was found that all the combinations of donor ZnTPP with the acceptor listed in (Table 1-12 gave positive value of ΔG calculated from Eq. (2), so that a single-photon intermolecular electron transfer reaction cannot occur by photoexcitation to $Q_1$ absorption band of ZnTPP (ca. 588 nm). However, a two-photon intermolecular electron transfer reaction, for example, via the triplet excited state of the donor as an intermediate state, can occur.

EXAMPLE 1-15

After the media shown in Tables 1-10 or Table 1-11 were cooled down to liquid helium temperature (7 K), they were irradiated by a single pulse of a YAG laser-pumped pulsed dye laser at 645 nm (pulse width: 2.5 ns, band-width: 1 $cm^{-1}$) in a range of irradiation energy of 0.1 to 10 $mJ/cm^2$/pulse. However, no hole was formed in the $Q_1$ absorption band of TPP. Therefore, it was found that no hole was formed due to a single-photon photochemical reaction under the above irradiation conditions. This fact supported the result of Example 1-14 and indicated that no hole was formed by other single-photon photochemical reactions, (for example, a proton tautomerization) under the foregoing experimental conditions.

EXAMPLE 1-16 (-- delete))

EXAMPLE 1-17

After the media in Table 1-10 and Table 1-11 were cooled down to liquid helium temperature, they were irradiated simultaneously with a single pulse (irradiation energy: 0.5 $mJ/cm^2$/pulse) of a YAG laser-pumped pulse dye laser (pulse width: 2.5 ns, band width: 1 $cm^{-1}$) at 645 nm and a single pulse (irradiation energy: 0.5 $mJ/cm^2$/pulse) of an Ar laser (pulse width: 20 ms) pulsed by a shutter. A hole with a width of about 1.5 $cm^{-1}$ was formed in all the media. Then, the media were simultaneously irradiated with a single pulse (pulse width: 1 μs) of an Ar laser pumped CW dye laser at 645 nm (band width: $<1 \times 10^{-4}$ $cm^{-1}$) pulsed by means of an acousto-optic modulator and a single pulse (pulse width : 20 ms) of an Ar laser pulsed by a shutter with the power listed in Table 1-14 below in order to carry out the irradiation by a light source with narrow band width and the high sensitive detection. Holes were then detected by a laser double-beam scanning technique with the same CW dye laser. A hole was produced in the $Q_1$ absorption band of TPP in all the media. The hole width and the hole formation yield in each medium were summarized in Table 1-14. The hole formation yield was larger by an order of magnitude for the media in PE matrix than for those in PMMA matrix.

TABLE 1-14

| Irradiation Conditions and Hole Characteristics | | | | |
|---|---|---|---|---|
| | Irradiation power | | Hole | |
| Media No. | $\lambda_1$ (μW/ $cm^2$/pulse) | $\lambda_2$ (μW/ $cm^2$/pulse) | width (GHz) | Δa/a (%) |
| 1-101 | 120 | 80 | 9.5 | 5.5 |
| 1-102 | 120 | 80 | 9.8 | 5.6 |
| 1-107 | 120 | 80 | 10.0 | 5.4 |
| 1-108 | 120 | 80 | 8.7 | 4.5 |
| 1-109 | 120 | 80 | 8.8 | 6.4 |
| 1-110 | 15 | 80 | 8.9 | 5.2 |
| 1-111 | 15 | 80 | 10.2 | 5.9 |
| 1-116 | 15 | 80 | 9.7 | 5.8 |
| 1-117 | 15 | 80 | 10.1 | 5.2 |
| 1-118 | 15 | 80 | 8.8 | 5.9 |

EXAMPLE 1-18

After the media in Table 1-10 and Table 1-11 were cooled down to liquid helium temperature, they were irradiated simultaneously with a single pulse (irradiation energy: 0.3 $mJ/cm^2$/pulse) of a YAG laser-pumped pulse dye laser at 645 nm (pulse width: 2.5 ns, band width: 1 $cm^{-1}$) and a single pulse (irradiation energy: 0.5 $mJ/cm^2$/pulse) of a $N_2$ laser-pumped pulse dye laser at 380 nm (pulse width: 8 ns). A hole with a width of about 1.5 $cm^{-1}$ was formed in all the media. Then, they were irradiated simultaneously with a single pulse (pulse width: 1 μs) of an Ar laser-pumped CW dye laser at 645 nm (band width: $<1 \times 10^{-4}$ $cm^{-1}$) pulsed by an acousto-optic modulator and a single pulse (pulse width : 8 ns) of an $N_2$ laser-pumped pulse dye laser at 380 nm with the power listed in Table 1-15 below in order to carry out the irradiation by a light source with narrow bandwidth and the high sensitive detection. Holes were then detected by a laser double-beam scanning technique with the same CW dye laser. A hole was produced in the $Q_1$ band of TPP in all the media. The hole width and the hole formation yield in each medium were summarized in Table 1-15. The hole formation yield was larger by an order for the media in PE matrix than for those in PMMA matrix.

TABLE 1-15

| Irradiation Conditions and Hole Characteristics | | | | |
|---|---|---|---|---|
| | Irradiation power | | Hole | |
| Medium No. | $\lambda_1$ (μW/ $cm^2$/pulse) | $\lambda_2$ (μW/ $cm^2$/pulse) | width (GHz) | Δa/a (%) |
| 1-101 | 100 | 60 | 9.7 | 4.5 |
| 1-102 | 100 | 60 | 9.0 | 4.5 |
| 1-107 | 100 | 60 | 10.0 | 4.4 |
| 1-108 | 100 | 60 | 9.7 | 4.1 |
| 1-109 | 100 | 60 | 10.2 | 4.2 |
| 1-110 | 12 | 60 | 9.5 | 4.2 |
| 1-111 | 12 | 60 | 8.8 | 4.9 |
| 1-116 | 12 | 60 | 10.7 | 3.8 |
| 1-117 | 12 | 60 | 9.5 | 3.9 |

TABLE 1-15-continued

| | Irradiation Conditions and Hole Characteristics | | | |
|---|---|---|---|---|
| | Irradiation power | | Hole | |
| Medium No. | $\lambda_1$ ($\mu$W/ cm$^2$/pulse) | $\lambda_2$ ($\mu$W/ cm$^2$/pulse) | width (GHz) | $\Delta\alpha/\alpha$ (%) |
| 1-118 | 12 | 60 | 9.8 | 4.9 |

EXAMPLE 1-19

The effect of the irradiation time interval between the frequency-selecting and the gating excitation, $\tau$, on the hole formation was investigated for the $\tau$ value of 0–1 sec. taking the medium 1-101 as an example. After cooling the medium 1-101 down to liquid helium temperature, it was irradiated with a single pulse (pulse width: 1 $\mu$m ) of an Ar laser-pumped CW dye laser at 645 nm (bandwidth: $<1\times10^{-4}$ cm$^{-1}$) pulsed by an acousto-optic modulator and a single pulse (pulse width: 20 ms) of an Ar laser pulsed by a shutter for the above-mentioned range of the $\tau$ value with the power listed in Table 1-14 in order to carry out the irradiation by a light source with narrow bandwidth and the high sensitive detection. Holes were then detected by a laser double-beam scanning technique with the same CW dye laser. The hole formation was observed when the $\tau$ value was within several tens of ms. This indicates that for the medium 1-101, a two-photon hole formation occurs via the triplet excited state of TPP as an intermediate state.

EXAMPLE 1-20

The effect of the pulse width of the frequency-selecting excitation on hole formation was examined in range of 8 ms to the 2.5 ns taking the medium 1-104 as an example. After cooling the medium 1-104 down to liquid helium temperature, it was irradiated simultaneously with a single pulse of 645 nm light of either a YAG laser-pumped pulse dye laser for a pulse width of 2.5 ns, or an Ar laser pumped CW dye laser pulsed by an acousto-optic modulator or by a shutter for a pulse width of 1 $\mu$s, and a single pulse (pulse width: 20 ms, irradiation power: 100 $\mu$W/cm$^2$/pulse) of an Ar laser pulsed by a shutter with the power listed in Table 1-16 below. The width and the depth of the burnt hole under each irradiation condition were summarized in Table 1-16.

TABLE 1-16

| Dependence of Hole Characteristics on Irradiation Light Pulse Width | | | |
|---|---|---|---|
| Pulse width ($\mu$S) | Irradiation power ($\mu$W/cm$^2$/pulse) | Hole width (GHz) | $\Delta\alpha/\alpha$ (%) |
| $2.5 \times 10^{-3}$ | 500 | 20.2 | 2.5 |
| 1 | 200 | 11.2 | 2.3 |
| 10 | 160 | 11.5 | 2.1 |
| 100 | 140 | 12.3 | 2.6 |
| 8000 | 120 | 10.7 | 2.1 |

EXAMPLE 1-21

The effect of the laser-irradiated spot on hole formation was examined taking the medium 1-101 as an example. Medium 1-101 was irradiated simultaneously with a focused single pulse (pulse width: 1 $\mu$s, irradiation power: 100 $\mu$W/cm$^2$ pulse) of an Ar laser-pumped CW dye laser at 645 nm (bandwidth: $<1\times10^{-4}$ cm$^{-1}$) pulsed by an acousto-optic modulator and a focused single pulse (pulse width: 20 ms, irradiation power: 100 $\mu$W/cm$^2$/pulse) of an Ar laser pulsed by a shutter at liquid helium temperature. A hole was detected by means of a laser double-beam scanning technique using the same focused laser beam in the burning. A hole could be detected up to the focused laser spot of 100$\mu$m$\phi$.

EXAMPLE 1-22

In order to examine the effect of acceptor concentration on hole formation, the media in PMMA matrix with the guest concentration shown in Table 1-17 were prepared by the same method as in Example 1-12.

TABLE 1-17

| PMMA Host Media with a Highly-doped Acceptor | | |
|---|---|---|
| Medium No. | Donor TPP (mol/l) | Acceptor 4-BACl (mol/l) |
| 1-119 | $5.1 \times 10^{-4}$ | $2.4 \times 10^{-3}$ |
| 1-120 | $5.2 \times 10^{-4}$ | $5.5 \times 10^{-2}$ |
| 1-121 | $5.4 \times 10^{-4}$ | $5.0 \times 10^{-1}$ |

After the media in Table 1-18 were cooled down to liquid helium temperature, they were irradiated simultaneously with a single pulse (pulse width: 1 $\mu$s) of an Ar laser-pumped CW dye laser at 645 nm (bandwidth: $<1\times10^{-4}$cm$^{-1}$) pulsed by an acousto-optic modulator and a single pulse (pulse width: 20 ms, irradiation power: 100 $\mu$W/cm$^2$/pulse) of an Ar laser pulsed by a shutter with the power listed in Table 1-18 below. This resulted in hole formation at the $Q_1$ absorption band of TPP. The holewidth and hole depth in each medium are summarized in Table 1-18. The hole formation yield did not show any marked change when the acceptor concentration increased from the value in the medium 1-102 to that in the medium 1-119. On the other hand, the hole formation yield increased about by an order of magnitude when the acceptor concentration increased from the value in the medium 1-102 to that in the medium 1-120 or 1-121. This indicates that the hole formation yield depends on the average distance between donor and acceptor molecules. Also, the experimental results explain why the hole formation yield is larger about by an order of magnitude for the PE matrix than for the PMMA matrix. In crystalline polymers, such as PE, since guest molecules are dispersed in their amorphous region [Th. Sesselmann, W. Richter, D. Haarer, and H. Morawitz: Phys. Rev., B36, p.7601 (1987)], the distance between donor and acceptor is smaller than that in amorphous polymers such as PMMA even if the guest concentration is the same as that in PMMA.

TABLE 1-18

| Irradiation Condition and Hole Characteristics of PMMA Medium with a Highly-doped Acceptor | | | |
|---|---|---|---|
| Medium No. | Irradiation power ($\mu$W/cm$^2$/pulse) | Hole width (GHz) | $\Delta\alpha/\alpha$ (%) |
| 1-119 | 200 | 11.3 | 2.5 |
| 1-120 | 20 | 12.7 | 2.7 |
| 1-121 | 20 | 11.4 | 2.6 |

EXAMPLE 1-23

A mixed chloroform solution of TPP or ZnTPP and 2-bromoacetophenone (2-AcPBr, hereinafter) or 4-bromoacetophenone (4-AcPBr, hereinafter) or 4-iodoacetophenone (4-AcPI, hereinafter) or 4-bromoacetoanilide (4-AcAnBr, hereinafter) or 4- chloroacetoanilide (4-AcAnCl, hereinafter) or 4-iodoacetoanilide (4-AcAnI, hereinafter) with commercially available PMMA (the concentration of these molecules is shown in Table 1-19 below) was cast on a transparent glass substrate under a nitrogen gas atmosphere at 50° C. to 60° C. for 24 hours, then, kept under reduced pressure using a rotary pump at 150° C. for 48 hours, to completely remove the solvent. Thus, mm thick films were prepared. The absorption spectra of these media look similar to that in FIG. 3.

TABLE 1-19

PMMA Host Media

| Medium No. | Donor TPP (mol/l) | Acceptor 2-AcPBr (mol/l) | 4-AcPBr (mol/l) | 4-AcPI (mol/l) |
|---|---|---|---|---|
| 1-201 | $5.1 \times 10^{-4}$ | $5.1 \times 10^{-4}$ | | |
| 1-202 | $5.2 \times 10^{-4}$ | | $5.3 \times 10^{-4}$ | |
| 1-203 | $4.9 \times 10^{-4}$ | | | $5.0 \times 10^{-4}$ |

| Medium No. | Donor TPP (mol/l) | ZnTPP (mol/l) | Acceptor 2-AcPBr (mol/l) | 4-AcAnBr (mol/l) |
|---|---|---|---|---|
| 1-206 | $5.0 \times 10^{-4}$ | | | $4.9 \times 10^{-4}$ |
| 1-207 | | $5.2 \times 10^{-4}$ | $5.3 \times 10^{-4}$ | |

| Medium No. | Donor TPP (mol/l) | Acceptor 4-AcAnCl (mol/l) | 4-AcAnI (mol/l) |
|---|---|---|---|
| 1-208 | $5.2 \times 10^{-4}$ | $5.4 \times 10^{-4}$ | $5.4 \times 10^{-4}$ |
| 1-209 | $5.1 \times 10^{-4}$ | | |

EXAMPLE 1-24

A mixed hot p-xylene solution of TPP or ZnTPP and 2-AcPBr or 4-AcPBr or 4-AcPI or 4-AcAnBr or 4-AcAnCl or 4-AcAnI with commercially available PE (the concentration of these molemlas is shown in Table 1-20 below) was cast on a transparent glass substrate under a nitrogen gas atmosphere at 120° C. for 24 hours, then kept under reduced pressure using a rotary pump at 150° C. for 48 hours to completely remove the solvent. Thus, films 100 to 200 μm thick were prepared. The absorption spectra of these media look similar to that in FIG. 3.

TABLE 1-20

PE Host Media

| Medium No. | Donor TPP (mol/l) | Acceptor 2-AcPBr (mol/l) | 4-AcPBr (mol/l) | 4-AcPI (mol/l) |
|---|---|---|---|---|
| 1-213 | $5.1 \times 10^{-4}$ | $5.3 \times 10^{-4}$ | | |
| 1-214 | $5.4 \times 10^{-4}$ | | $5.1 \times 10^{-4}$ | |
| 1-215 | $5.1 \times 10^{-4}$ | | | $5.5 \times 10^{-4}$ |

| Medium No. | Donor TPP (mol/l) | ZnTPP (mol/l) | Acceptor 2-AcPBr (mol/l) | 4-AcAnBr (mol/l) |
|---|---|---|---|---|
| 1-218 | $5.2 \times 10^{-4}$ | | | $5.3 \times 10^{-4}$ |
| 1-219 | | $4.9 \times 10^{-4}$ | $5.2 \times 10^{-4}$ | |

| Medium No. | Donor TPP (mol/l) | Acceptor 4-AcAnCl (mol/l) | 4-AcAnI (mol/l) |
|---|---|---|---|
| 1-220 | $4.9 \times 10^{-4}$ | $5.3 \times 10^{-4}$ | |
| 1-221 | $5.3 \times 10^{-4}$ | | $5.1 \times 10^{-4}$ |

EXAMPLE 1-25

The oxidation potential of TPP and ZnTPP, and the reduction potential of 2-AcPBr, 4-AcPBr, 4-AcPI, 4-AcAnBr, 4-AcAnCl, 4-AcAnI, were measured by an electrochemical method under the conditions shown in Table 1-21 below. The results are summarized in Table 1-21.

TABLE 1-21

Oxidation and Reduction Potential of the Guest Molecules

| | Solvent | Supporting electrolyte | Oxidation or reduction potential |
|---|---|---|---|
| TPP | $CH_2Cl_2$ | $Bu_4NBF_4$ | 0.95 (V vs SCE) |
| ZnTPP | $CH_2Cl_2$ | $Bu_4NBF_4$ | 0.71 |
| 2-AcPBr | MeCN | $Bu_4NBF_4$ | −1.51 |
| 4-AcPBr | MeCN | $Bu_4NBF_4$ | −1.62 |
| 4-AcPI | MeCN | $Et_4NClO_4$ | −1.29 |
| 4-AcAnBr | MeCN | $Et_4NClO_4$ | −2.00 |
| 4-AcAnCl | MeCN | $Et_4NClO_4$ | −2.33 |
| 4-AcAnI | MeCN | $Et_4NClO_4$ | −1.69 |

According to the oxidation potential or the reduction potential in Table 1-21 it was found that selected combinations of ZnTPP with 4-AcPI, gave negative value of $\Delta G$ calculated from Eq. (2), so that a single-photon intermolecular electron transfer reaction can occur by photoexcitation to $Q_1$ absorption band of ZnTPP (ca. 588 nm). On the other hand, for all the other combinations it was found that a single-photon intermolecular electron transfer reaction cannot occur. However, a two-photon intermolecular electron transfer reaction, for example, via the triplet excited state of the donor as an intermediate state, can occur.

EXAMPLE 1-26

After the media shown in Tables 1-19 Table 1-20 were cooled down to liquid helium temperature (7 K), they were irradiated by a single pulse of a YAG laser-pumped pulsed dye laser at 645 nm (pulse width: 2.5 ns, band width: 1 cm$^{-1}$) in a range of irradiation energy of 0.1 to 10 mJ/cm$^2$/pulse. However, no hole was formed in the $Q_1$ absorption band of TPP. Therefore, it was found that no hole was formed due to a single-photon photochemical reaction under the above irradiation conditions. This fact supported the result of Example 1-25 and also indicated that no hole was formed by other single-photon photochemical reactions, (for example, a proton tautomerization) under the foregoing experimental conditions.

EXAMPLE 1-27 (-- delete)

EXAMPLE 1-28

After the media in Table 1-19 and Table 1-20 were cooled down to liquid helium temperature, they were irradiated simultaneously with a single pulse (irradiation energy: 0.5 mJ/cm$^2$/pulse) of a YAG laser-pumped pulse dye laser (pulse width: 2.5 ns, band width: 1 cm$^{-1}$) at 645 nm and a single pulse (irradiation energy: 0.5 mJ/cm$^2$/pulse) of an Ar laser (pulse width: 20 ms) pulsed by a shutter. A hole with a width of about 1.5 cm$^{-1}$ was formed in all the media. Then, the media were simultaneously irradiated with a single pulse (pulse width: 1 μs) of an Ar laser-pumped CW dye laser at 645 nm (band width: <1×10$^{-4}$ cm$^{-1}$) pulsed by means of an acousto-optic modulator and a single pulse (pulse width : 20 ms) of an Ar laser pulsed by a shutter with the power listed in Table 1-23 below in order to carry out the irradiation by a light source with narrow band width and the high sensitive detection. Holes were then detected by a laser double-beam scanning technique with the same CW dye laser. A hole was produced in the $Q_1$ absorption band of TPP in all the media.

The hole width and the hole formation yield in each medium were summarized in Table 1-23. The hole formation yield was larger by an order of magnitude for the media in PE matrix than for those in PMMA matrix.

TABLE 1-23

| | Irradiation Conditions and Hole Characteristics | | | |
|---|---|---|---|---|
| | Irradiation power | | Hole | |
| Media No. | $\lambda_1$ ($\mu$W/ cm$^2$/pulse) | $\lambda_2$ ($\mu$W/ cm$^2$/pulse) | width (GHz) | $\Delta a/a$ (%) |
| 1-201 | 150 | 80 | 8.2 | 3.5 |
| 1-202 | 150 | 80 | 7.5 | 3.6 |
| 1-203 | 200 | 80 | 8.1 | 4.4 |
| 1-206 | 200 | 80 | 8.2 | 3.5 |
| 1-208 | 150 | 80 | 9.3 | 4.6 |
| 1-209 | 150 | 80 | 8.5 | 3.4 |
| 1-213 | 15 | 80 | 8.7 | 3.2 |
| 1-214 | 15 | 80 | 8.8 | 4.9 |
| 1-215 | 20 | 80 | 8.2 | 4.8 |
| 1-218 | 20 | 80 | 8.5 | 4.0 |
| 1-220 | 15 | 80 | 7.9 | 4.8 |
| 1-221 | 15 | 80 | 8.0 | 3.9 |

EXAMPLE 1-29

After the media in Table 1-19 or Table 1-20 were cooled down to liquid helium temperature, they were irradiated simultaneously with a single pulse (irradiation energy: 0.3 mJ/cm$^2$/pulse) of a YAG laser-pumped dye laser at 645 nm (pulse width: 2.5 ns band width: 1 cm$^{-1}$) and a single pulse (irradiation energy: 0.5 mJ/cm$^2$/pulse) of a N$_2$ laser-pumped pulse dye laser at 380 nm (pulse width: 8 ns). A Hole with a width of about 1.5 cm$^{-1}$ was formed in all the media. Then, they were irradiated simultaneously with a single pulse (pulse width: 1 $\mu$s) of an Ar laser-pumped CW dye laser at 645 nm (band width: <1×10$^{-4}$ cm$^{-1}$) pulsed by an acousto-optic modulator and a single pulse (pulse width: 8 ns) of a N$_2$ laser-pumped pulse dye laser at 380 nm with the power listed in Table 1-24 below in order to carry out the irradiation by a light source with narrow bandwidth and the high sensitive detection. Hole were then detected by a laser double-beam scanning technique with the same CW dye laser. A hole was produced in the Q$_1$ band of TPP in all the media. The holewidth and the hole formation yield in each medium were summarized in Table 1-24. The hole formation yield was larger by an order for the media in PE matrix than for those in PMMA matrix.

TABLE 1-24

| | Irradiation Conditions and Hole Characteristics | | | |
|---|---|---|---|---|
| | Irradiation power | | Hole | |
| Medium No. | $\lambda_1$ ($\mu$W/ cm$^2$/pulse) | $\lambda_2$ ($\mu$W/ cm$^2$/pulse) | width (GHz) | $\Delta a/a$ (%) |
| 1-201 | 100 | 60 | 8.8 | 4.5 |
| 1-202 | 120 | 60 | 7.9 | 7.0 |
| 1-203 | 120 | 80 | 8.5 | 7.2 |
| 1-206 | 100 | 60 | 8.2 | 3.5 |
| 1-208 | 150 | 60 | 8.9 | 7.6 |
| 1-209 | 100 | 60 | 8.1 | 7.4 |
| 1-213 | 10 | 60 | 8.5 | 4.2 |
| 1-214 | 15 | 60 | 7.8 | 6.8 |
| 1-215 | 15 | 60 | 7.2 | 6.8 |
| 1-218 | 12 | 60 | 8.1 | 4.4 |
| 1-220 | 15 | 60 | 7.9 | 6.8 |
| 1-221 | 10 | 60 | 8.5 | 5.2 |

EXAMPLE 1-30

The effect of the irridation time interval between the frequency-selecting and the gating excitation, $\tau$, on the hole formation was investigated for the $\tau$ value of 0-1 sec, taking the medium 1-201 as an example. After cooling the medium 1-201 down to liquid helium temperature, it was irradiated with a single pulse (pulse width: 1 $\mu$m) of an Ar laser-pumped CW dye laser at 645 nm (bandwidth: <1×10$^{-4}$ cm$^{-1}$) pulsed by an acousto-optic modulator and a single pulse (pulse width: 20 ms) of an Ar laser pulsed by a shutter for the above-mentioned range of the $\tau$ value with the power listed in Table 1-23 in order to carry out the irradiation by a light source with narrow bandwidth and having highly sensitive detection. Holes were then detected by a laser double-beam scanning technique with the same CW dye laser. The hole formation was observed when the $\tau$ value was within several tens of ms. This indicates that for the medium 1-201, a two-photon hole formation occurs via the triplet excited state of TPP as an intermediate state.

EXAMPLE 1-31

The effect of the pulse width of the frequency-selecting excitation on hole formation was examined in the range of 8 ms to 2.5 ns taking the medium 1-201 as an example. After cooling the medium 1-201 down to liquid helium temperature, it was irradiated simultaneously with a single pulse of 645 nm light of either a YAG laser-pumped pulse dye laser for a pulse width of 2.5 ns, or an Ar laser-pumped CW dye laser pulsed by an acousto-optic modulator or by a shutter for a pulse width of 1 ms, and a single pulse (pulse width: 20 ms, irradiation power: 100 $\mu$W/cm$^2$/pulse) of an Ar laser pulsed by a shutter with the power listed in Table 1-25 below. The width and the depth of the burnt hole under each irradiation condition were summarized in Table 25.

TABLE 1-25

| Dependence of Hole Characteristics on Irradiation Light Pulse Width | | | |
|---|---|---|---|
| Pulse width ($\mu$S) | Irradiation power ($\mu$W/cm$^2$/pulse) | Hole width (GHz) | $\Delta a/a$ (%) |
| 2.5 × 10$^{-3}$ | 500 | 20.8 | 2.8 |
| 1 | 100 | 11.2 | 2.1 |
| 10 | 60 | 12.4 | 3.1 |
| 100 | 40 | 15.7 | 2.6 |
| 8000 | 20 | 10.9 | 2.5 |

EXAMPLE 1-32

The effect of the laser-irradiated spot on hole formation was examined taking the medium 1-201 as an example. Medium 1-201 was irradiated simultaneously with a focused single pulse (pulse width: 1 $\mu$s, irradiation power: 100 $\mu$W/cm$^2$/pulse) of an Ar laser-pumped CW dye laser at 645 nm (bandwidth: <1×10$^{-4}$ cm$^{-1}$) pulsed by an acousto-optic modulator and a focused single pulse (pulse width: 20 ms, irradiation power: 100 $\mu$W/cm$^2$/pulse) of an Ar laser pulsed by a shutter at liquid helium temperature. A hole was detected by means of a laser double-beam scanning technique using the same focused laser beam in the burning. A hole could be detected up to the focused laser spot of 100 $\mu$m$\phi$.

EXAMPLE 1-33

In order to examine the effect of acceptor concentration on hole formation, the media in PMMA matrix with the guest concentration shown in Table 1-26 were prepared by the same method as in Example 1-23.

TABLE 1-26

PMMA Host Media with a Highly-doped Acceptor

| Medium No. | Donor TPP (mol/l) | Acceptor 2-AcPBr (mol/l) |
|---|---|---|
| 1-225 | $5.4 \times 10^{-4}$ | $2.8 \times 10^{-3}$ |
| 1-226 | $5.6 \times 10^{-4}$ | $5.0 \times 10^{-2}$ |
| 1-227 | $5.4 \times 10^{-4}$ | $5.2 \times 10^{-1}$ |

After the media in Table 1-27 were cooled down to liquid helium temperature, they were irradiated simultaneously with a single pulse (pulse width: 1 μs) of an Ar laser-pumped CW dye laser at 645 nm (bandwidth: $<1\times10^{-4}$cm$^{-1}$) pulsed by an acousto-optic modulator and a single pulse (pulse width: 20 ms, irradiation power: 100 μuW/cm$^2$/pulse) of an Ar laser pulsed by a shutter with the power listed in Table 1-9 below. This resulted in hole formation at the $Q_1$ absorption band of TPP. The holewidth and hole depth in each medium are summarized in Table 1-27. The hole formation yield did not show any marked change when the acceptor concentration increased from the value in the medium 1-201 to that in the medium 1-27. On the other hand, the hole formation yield increased about by an order of magnitude when the acceptor concentration increased from the value in the medium 1-201 to that in the medium 1-225 or 1-226. This indicates that the hole formation yield depends on the average distance between donor and acceptor molecules. Also, the experimental results explain why the hole formation yield is larger about by an order of magnitude for the PE matrix than for the PMMA matrix. In crystalline polymers, such as PE, since guest molecules are dispersed in their amorphous region [Th. Sesselmann, W. Richter, D. Haarer, and H. Morawitz: Phys. Rev., B36, p.7601 (1987)], the distance between donor and acceptor is smaller than that in amorphous polymers such as PMMA even if the guest concentration is the same as that in PMMA.

TABLE 1-27

Irradiation Condition and Hole Characteristics of PMMA Medium with a Highly-Doped Acceptor

| Medium No | Irradiation power (μW/cm$^2$/pulse) | Hole width (GHz) | $\Delta a/a$ (%) |
|---|---|---|---|
| 1-225 | 100 | 11.2 | 2.1 |
| 1-226 | 30 | 13.2 | 5.5 |
| 1-227 | 40 | 14.4 | 4.3 |

EXAMPLE 1-34

A mixed chloroform solution of TPP or ZnTPP and 2-bromo-4-nitrotoluene (abbreviated to 2-Br-4-NT, hereinafter), 2-bromo-5-nitrotoluene (abbreviated to 2-Br-5-NT, hereinafter), alpha-bromo-2-nitrotoluene (abbreviated to α-Br-2-NT, hereinafter), alpha-bromo-4-nitrotoluene (abbreviated to α-Br-4-NT, hereinafter), 4, 4'-dichlorostilbene (abbreviated to 4, 4'-SCl$_2$, hereinafter) 4, 4'-dibromostilbene (abbreviated to 4, 4'-SBr$_2$, hereinafter), 4, 4'-diiodostilbene (abbreviated to 4, 4'-SI$_2$) with commercially available PMMA (the concentration of these molecules is shown in Table 1-28 below) was cast on a transparent glass substrate under a nitrogen gas atmosphere at 50° C. to 60° C. for 24 hours, then kept under reduced pressure using a rotary pump at 150° C. for 48 hours to completely remove the solvent. Thus, 1 mm thick films were prepared. The absorption spectra of these media look similar to that in FIG. 3.

TABLE

PMMA Host Media 1-28-1

| Medium No. | Donor TPP (mol/l) | Acceptor 2-Br-4-NT (mol/l) | Acceptor 2-Br-5-NT (mol/l) |
|---|---|---|---|
| 1-301 | $5.2 \times 10^{-4}$ | $5.3 \times 10^{-4}$ | |
| 1-302 | $5.5 \times 10^{-4}$ | | $5.2 \times 10^{-4}$ |

1-28-2

| Medium No. | Donor TPP (mol/l) | Acceptor α-Br-2-NT (mol/l) | Acceptor α-Br-4-NT (mol/l) |
|---|---|---|---|
| 1-303 | $5.3 \times 10^{-4}$ | $5.3 \times 10^{-4}$ | |
| 1-304 | $5.2 \times 10^{-4}$ | | $5.0 \times 10^{-4}$ |

1-28-3

| Medium No. | Donor TPP (mol/l) | Acceptor 4,4'-SCl$_2$ (mol/l) | Acceptor 4,4'-SBr$_2$ (mol/l) |
|---|---|---|---|
| 1-305 | $5.1 \times 10^{-4}$ | $5.1 \times 10^{-4}$ | |
| 1-306 | $5.0 \times 10^{-4}$ | | $5.4 \times 10^{-4}$ |

1-28-4

| Medium No. | Donor TPP (mol/l) | Donor ZnTPP (mol/l) | Acceptor 4,4'-SCl$_2$ (mol/l) | Acceptor 4,4'-SI$_2$ (mol/l) |
|---|---|---|---|---|
| 1-307 | $5.1 \times 10^{-4}$ | | | $5.5 \times 10^{-4}$ |
| 1-308 | | $5.3 \times 10^{-4}$ | $5.1 \times 10^{-4}$ | |

EXAMPLE 1-35

A mixed hot p-xylene solution of TPP or ZnTPP and 2-Br-4-NT or 2-Br-5-NT or α-Br-2-NT or α-Br-4-NT or 4, 4'-SCl$_2$ or 4, 4'-SBr$_2$ or 4, 4'-SI$_2$ with commercially available PE, (the concentration of these molecules is listed in Table 1-29 below) was cast on a transparent glass substrate under nitrogen gas atmosphere at 120° C. for 24 hours and, furthermore, kept under reduced pressure using a rotary pump at 150° C. for 48 hours to completely remove the solvent, and films 100 to 200 μm thickness were prepared. Absorption spectra of these media look similar to that in FIG. 3.

TABLE

PMMA Host Media 1-29-1

| Medium No. | Donor TPP (mol/l) | Acceptor 2-Br-4-NT (mol/l) | Acceptor 2-Br-5-NT (mol/l) |
|---|---|---|---|
| 1-309 | $5.1 \times 10^{-4}$ | $5.2 \times 10^{-4}$ | |
| 1-310 | $5.3 \times 10^{-4}$ | | $5.5 \times 10^{-4}$ |

1-29-2

| Medium No. | Donor TPP (mol/l) | Acceptor α-Br-2-NT (mol/l) | Acceptor α-Br-4-NT (mol/l) |
|---|---|---|---|
| 1-311 | $5.2 \times 10^{-4}$ | $5.0 \times 10^{-4}$ | |
| 1-312 | $5.5 \times 10^{-4}$ | | $5.1 \times 10^{-4}$ |

1-29-3

| Medium No. | Donor TPP (mol/l) | Acceptor 4,4'-SCl$_2$ (mol/l) | Acceptor 4,4'-SBr$_2$ (mol/l) |
|---|---|---|---|
| 1-313 | $5.4 \times 10^{-4}$ | $5.3 \times 10^{-4}$ | |
| 1-314 | $5.2 \times 10^{-4}$ | | $5.4 \times 10^{-4}$ |

1-29-4

| Medium | Donor TPP | Donor ZnTPP | Acceptor 4,4'-SCl$_2$ | Acceptor 4,4'-SI$_2$ |
|---|---|---|---|---|

TABLE-continued

| | PMMA Host Media | | | |
|---|---|---|---|---|
| No. | (mol/l) | (mol/l) | (mol/l) | (mol/l) |
| 1-315 | $5.0 \times 10^{-4}$ | | | $5.2 \times 10^{-4}$ |
| 1-308 | | $5.1 \times 10^{-4}$ | $5.3 \times 10^{-4}$ | |

EXAMPLE 1-36

The oxidation potential of TPP and ZnTPP, and the reduction potential of 2-Br-4-NT, 2-Br-5-NT, α-Br-2-NT, α-Br-4-NT, 4, 4'-SCl$^2$ 4, 4'-SBr$_2$ and 4, 4'-SI$_2$ were measured by an electrochemical method under the conditions shown in Table 1-30 below. The results are summarized in Table 1-30.

TABLE 1-30

| Oxidation and Reduction Potential of the Guest Molecules | | | |
|---|---|---|---|
| | Solvent | Supporting electrolyte | Oxidation or reduction potential |
| TPP | CH$_2$Cl$_2$ | Bu$_4$NBF$_4$ | 0.95(V vs SCE) |
| ZnTPP | CH$_2$Cl$_2$ | Bu$_4$NBF$_4$ | 0.71 |
| 2-Br-4-NT | MeCN | Bu$_4$NBF$_4$ | −1.00 |
| 2-Br-5-NT | MeCN | Bu$_4$NBF$_4$ | −1.00 |
| α-Br-2-NT | MeCN | Et$_4$NClO$_4$ | −1.15 |
| α-Br-4-NT | MeCN | Et$_4$NClO$_4$ | −1.09 |
| 4,4'-SCl$_2$ | MeCN | Bu$_4$NBF$_4$ | −1.93 |
| 4,4'-SBr$_2$ | MeCN | Bu$_4$NBF$_4$ | −1.72 |
| 4,4'-SI$_2$ | MeCN | Bu$_4$NBF$_4$ | −1.25 |

According to the oxidation potential or the reduction potential in Table 1-30 it was found that selected combinations of donor ZnTPP with an acceptor, except 4,4'-SCl$_2$ and 4, 4'-SBr$_2$ gave a negative values of αG calculated from Eq. (2), so that a single-photon intermolecular electron transfer reaction can occur by photoexcitation to Q$_1$ absorption band of ZnTPP (ca. 588 nm). On the other hand, for all the other combinations it was found that a single-photon intermolecular electron transfer reaction cannot occur. However, a two-photon intermolecular electron transfer reaction, for example, via the triplet excited state of the donor as an intermediate state, can occur.

EXAMPLE 1-37

After the media shown in Tables 1-28 or Table 1-29 were cooled down to liquid helium temperature (7 K), they were irradiated by a single pulse of a YAG laser-pumped pulsed dye laser at 645 nm (pulse width: 2.5 ns, band width: 1 cm$^{-1}$) in a range of irradiation energy of 0.1 to 10 mJ/cm$^2$/pulse. However, no hole was formed in the Q$_1$ absorption band of TPP. Therefore, it was found that no hole was formed due to a single-photon photochemical reaction under the above irradiation conditions. This fact supported the result of Example 1-36 and also indicated that no hole was formed by other single-photon photochemical reactions, (for example, a proton tautomerization) under the foregoing experimental conditions.

EXAMPLE 1-38 (-- delete)

EXAMPLE 1-39

After the media in Table 1-28 and Table 1-29 were cooled down to liquid helium temperature, they were irradiated simultaneously with a single pulse (irradiation energy: 0.5 mJ/cm$^2$/pulse) of a YAG laser-pumped pulse dye laser (pulse width: 2.5 ns, band width: 1 cm$^{-1}$) at 645 nm and a single pulse (irradiation energy: 0.5 mJ/cm$^2$/pulse) of an Ar laser (pulse width: 20 ms) pulsed by a shutter. A hole with a width of about 1.5 cm$^{-1}$ was formed in all the media. Then, the media were simultaneously irradiated with a single pulse (pulse width: 1 μs) of an Ar laser-pumped CW dye laser at 645 nm (band width: <1×10$^{-4}$ cm$^{-1}$) pulsed by means of an acousto-optic modulator and a single pulse (pulse width : 20 ms) of an Ar laser pulsed by a shutter with the power listed in Table 1-32 below in order to carry out the irradiation by a light source with narrow band width and the high sensitive detection. Holes were then detected by a laser double-beam scanning technique with the same CW dye laser. A hole was produced in the Q$_1$ absorption band of TPP in all the media. The hole width and the hole formation yield in each medium were summarized in Table 1-32. The hole formation yield was larger by an order of magnitude for the media in PE matrix than for those in PMMA matrix.

TABLE 1-32

| Irradiation Conditions and Hole Characteristics | | | | |
|---|---|---|---|---|
| | Irradiation Power | | | |
| Medium No. | $\lambda_1$ (μW/cm$^2$/pulse) | $\lambda_2$ (μW/cm$^2$/pulse) | Hole width (GHz) | Δα/α (%) |
| 1-301 | 120 | 80 | 7.4 | 3.6 |
| 1-302 | 120 | 80 | 7.2 | 3.5 |
| 1-303 | 120 | 80 | 8.5 | 4.2 |
| 1-304 | 120 | 80 | 9.0 | 6.0 |
| 1-305 | 110 | 80 | 7.3 | 7.3 |
| 1-306 | 120 | 80 | 7.6 | 3.9 |
| 1-307 | 120 | 80 | 7.5 | 5.0 |
| 1-309 | 20 | 80 | 6.0 | 4.0 |
| 1-310 | 20 | 80 | 5.8 | 4.1 |
| 1-311 | 20 | 80 | 6.3 | 3.7 |
| 1-312 | 20 | 80 | 6.1 | 3.9 |
| 1-313 | 20 | 80 | 4.9 | 4.3 |
| 1-314 | 20 | 80 | 5.6 | 4.6 |
| 1-315 | 20 | 80 | 6.2 | 3.1 |

EXAMPLE 1-40

After the media in Table 1-28 or Table 1-29 were cooled down to liquid helium temperature, they were irradiated simultaneously with a single pulse (irradiation energy: 0.3 mJ/cm$^2$/pulse) of a YAG laser-pumped dye laser at 645 nm (pulse width: 2.5 ns, band width: 1 cm$^{-1}$) and a single pulse (irradiation energy: 0.5 mJ/cm$^2$/pulse) of a N$_2$ laser-pumped pulse dye laser at 380 nm ( pulse width: 8 ns). A Hole with a width of about 1.5 cm$^{-1}$ was formed in all the media. Then, they were irradiated simultaneously with a single pulse (pulse width: 1 of an Ar laser-pumped CW dye laser at 645 nm (band width: <1×10$^{-4}$ cm$^{-1}$) pulsed by an acousto-optic modulator and a single pulse (pulse width: 8 ns) of a N$_2$ laser-pumped pulse dye laser at 380 nm with the power listed in Table 1-24 below in order to carry out the irradiation by a light source with narrow bandwidth and the high sensitive detection. Hole were then detected by a laser double-beam scanning technique with the same CW dye laser. A hole was produced in the Q$_1$ band of TPP in all the media. The holewidth and the hole formation yield in each medium were summarized in Table 1-33. The hole formation yield was larger by an order for the media in PE matrix than for those in PMMA matrix.

TABLE 1-33

Irradiation Conditions and Hole Characteristics

| Medium No | Irradiation Power $\lambda_1$ ($\mu W/cm^2$/pulse) | Irradiation Power $\lambda_2$ ($\mu W/cm^2$/pulse) | Hole width (GHz) | $\Delta a/a$ (%) |
|---|---|---|---|---|
| 1-301 | 60 | 80 | 7.9 | 5.3 |
| 1-302 | 60 | 80 | 7.9 | 5.6 |
| 1-303 | 60 | 80 | 7.8 | 3.7 |
| 1-304 | 60 | 80 | 6.8 | 6.3 |
| 1-305 | 60 | 80 | 7.5 | 4.1 |
| 1-306 | 60 | 80 | 8.1 | 3.7 |
| 1-307 | 60 | 80 | 6.9 | 4.1 |
| 1-309 | 10 | 80 | 6.4 | 3.5 |
| 1-310 | 10 | 80 | 7.9 | 3.0 |
| 1-311 | 10 | 80 | 7.3 | 6.8 |
| 1-312 | 10 | 80 | 7.2 | 3.3 |
| 1-313 | 10 | 80 | 6.5 | 4.1 |
| 1-314 | 10 | 80 | 6.8 | 4.0 |
| 1-315 | 10 | 80 | 6.4 | 3.8 |

EXAMPLE 1-41

The effect of the irradiation time interval between the frequency-selecting and the gating excitation, $\tau$, on the hole formation was investigated for the $\tau$ value of 0–1 sec, taking the medium 1-304 as an example. After cooling the medium 1-304 down to liquid helium temperature, it was irradiated with a single pulse (pulse width: 1 $\mu$m) of an Ar laser-pumped CW dye laser at 645 nm (bandwidth: $<1\times10^{-4}$ cm$^{-1}$) pulsed by an acousto-optic modulator and a single pulse (pulse width: 20 ms) of an Ar laser pulsed by a shutter for the above-mentioned range of the $\tau$ value with the power listed in Table 1-23 in order to carry out the irradiation by a light source with narrow bandwidth and the high sensitive detection. Holes were then detected by a laser double-beam scanning technique with the same CW dye laser. The hole formation was observed when the $\tau$ value was within several tens of ms. This indicates that for the medium 1-201, a two-photon hole formation occurs via the triplet excited state of TPP as an intermediate state.

EXAMPLE 1-42

The effect of the pulse width of the frequency-selecting excitation on hole formation was examined in the range of 8 ms to 2.5 ns taking the medium 1-305 as an example. After cooling the medium 1-305 down to liquid helium temperature, it was irradiated simultaneously with a single pulse of 645 nm light of either a YAG laser-pumped pulse dye laser for a pulse width of 2.5 ns, or an Ar laser-pumped CW dye laser pulsed by an acousto-optic modulator or by a shutter for a pulse width of 1 $\mu$s–8 ms, and a single pulse (pulse width: 20 ms, irradiation power: 100 $\mu$W/cm$^2$/pulse) of an Ar laser pulsed by a shutter with the power listed in Table 1-25 below. The width and the depth of the burnt hole under each irradiation condition were summarized in Table 1-34.

TABLE 1-34

Dependence of Hole Characteristics on Irradiation Light Pulse Width

| Pulse width ($\mu$S) | Irradiation power ($\mu$W/cm$^2$/pulse) | Hole width (GHz) | $\Delta a/a$ (%) |
|---|---|---|---|
| $2.5 \times 10^{-3}$ | 300 | 15.3 | 5.0 |
| 1 | 110 | 11.6 | 3.6 |
| 10 | 80 | 10.2 | 3.7 |
| 100 | 50 | 9.4 | 4.8 |

TABLE 1-34-continued

Dependence of Hole Characteristics on Irradiation Light Pulse Width

| Pulse width ($\mu$S) | Irradiation power ($\mu$W/cm$^2$/pulse) | Hole width (GHz) | $\Delta a/a$ (%) |
|---|---|---|---|
| 8000 | 20 | 9.1 | 5.6 |

EXAMPLE 1-43

The effect of the laser-irradiated spot on hole formation was examined taking the medium 1-305 as an example. Medium 1-305 was irradiated simultaneously with a focused single pulse (pulse width: 1 $\mu$s, irradiation power: 100 $\mu$W/cm$^2$/pulse) of an Ar laser-pumped CW dye laser at 645 nm (bandwidth: $<1\times10^{-4}$ cm$^{-1}$) pulsed by an acousto-optic modulator and a focused single pulse (pulse width: 20 ms, irradiation power: 100 $\mu$W/cm$^2$/pulse) of an Ar laser pulsed by a shutter at liquid helium temperature. A hole was detected by means of a laser double-beam scanning technique using the same focused laser beam in the burning. A hole could be detected up to the focused laser spot of 100 $\mu$m$\phi$.

EXAMPLE 1-44

In order to examine the effect of acceptor concentration on hole formation, the media in PMMA matrix with the guest concentration shown in Table 1-35 were prepared by the same method as in Example 1-34.

TABLE 1-35

PMMA Host Media with a Highly-doped Acceptor

| Medium No. | Donor TPP (mol/l) | Acceptor 4,4'-SCl$_2$ (mol/l) |
|---|---|---|
| 1-317 | $5.1 \times 10^{-4}$ | $4.2 \times 10^{-3}$ |
| 1-318 | $5.3 \times 10^{-4}$ | $3.9 \times 10^{-2}$ |
| 1-319 | $5.2 \times 10^{-4}$ | $5.1 \times 10^{-1}$ |

After the media in Table 1-36 were cooled down to liquid helium temperature, they were irradiated simultaneously with a single pulse (pulse width: 1 $\mu$s) of an Ar laser-pumped CW dye laser at 645 nm (bandwidth: $<1\times10^{-4}$ cm$^1$) pulsed by an acousto-optic modulator and a single pulse (pulse width: 20 ms, irradiation power: 100 $\mu$W/cm$^2$/pulse) of an Ar laser pulsed by a shutter with the power listed in Table 1-36 below. This resulted in hole formation at the $Q_1$ absorption band of TPP. The holewidth and hole depth in each medium are summarized in Table 1-36. The hole formation yield did not show any marked change when the acceptor concentration increased from the value in the medium 1-317 to that in the medium 1-305. On the other hand, the hole formation yield increased about by an order of magnitude when the acceptor concentration increased from the value in the medium 1-305 to that in the medium 1-318 or 1-319. This indicates that the hole formation yield depends on the average distance between donor and acceptor molecules. Also, the experimental results explain why the hole formation yield is larger about by an order of magnitude for the PE matrix than for the PMMA matrix. In crystalline polymers, such as PE, since guest molecules are dispersed in their amorphous region [Th. Sesselmann, W. Richter, D. Haarer, and H. Morawitz: Phys. Rev., B36, p.7601 (1987)], the distance between donor and acceptor is smaller than that in amorphous polymers such as PMMA even if the guest concentration is the same as that in PMMA.

TABLE 1-36

Irradiation Condition and Hole Characteristics of PMMA Medium with a Highly-Doped Acceptor

| Medium No. | Irradiation power ($\mu W/cm^2$/pulse) | Hole width (GHz) | $\Delta\alpha/\alpha$ (%) |
|---|---|---|---|
| 1-317 | 50 | 8.8 | 5.7 |
| 1-318 | 10 | 10.6 | 3.8 |
| 1-319 | 20 | 14.7 | 4.3 |

EXAMPLE 1-45

A mixed chloroform solution of TPP or ZnTPP and 4,4'-bis (bromomethyl) bibenzyl [abbreviated to 4,4'-b(BrM)BB, hereinafter], 2,7-dibromobenzylidene fluorene (abbreviated to 2,7-BFBr$_2$, hereinafter), 2,7-dichlorobenzylidene fluorene (abbreviated to 2,7-BFCl$_2$, hereinafter), 2,7-diiodobenzylidene fluorene (abbreviated to 2,7-BFI$_2$, hereinafter) and 9-benzylidene-2-bromofluorene (abbreviated to 9-B-2-FBr, hereinafter) with commercially available PMMA (the concentration of these molecules is shown in Table 1-37 below) was cast on a transparent glass substrate under a nitrogen gas atmosphere 50° C. to 60° C. for 24 hours, then kept under reduced pressure using a rotary pump at 150° C. for 48 hours to completely remove the solvent. Thus, 1 mm thick films were prepared. The absorption spectra of these media look similar to that in FIG. 3.

TABLE

PMMA Host Media 1-37-1

| Medium No. | Donor TPP (mol/l) | Acceptor 4,4'-b(BrM)BB (mol/l) | 2,7-BFBr$_2$ (mol/l) |
|---|---|---|---|
| 1-404 | $5.6 \times 10^{-4}$ | $5.0 \times 10^{-4}$ | |
| 1-405 | $5.3 \times 10^{-4}$ | | $5.1 \times 10^{-4}$ |

1-37-2

| Medium No. | Donor TPP (mol/l) | Acceptor 2,7-BFCl$_2$ (mol/l) | 2,7-BFI$_2$ (mol/l) |
|---|---|---|---|
| 1-406 | $5.5 \times 10^{-4}$ | $5.3 \times 10^{-4}$ | |
| 1-407 | $5.2 \times 10^{-4}$ | | $5.3 \times 10^{-4}$ |

1-37-3

| Medium No. | Donor TPP (mol/l) | ZnTPP (mol/l) | Acceptor 2,7-BFI$_2$ (mol/l) | 9-B-2-FBr (mol/l) |
|---|---|---|---|---|
| 1-408 | $5.6 \times 10^{-4}$ | | | $4.9 \times 10^{-4}$ |
| 1-409 | | $5.2 \times 10^{-4}$ | $5.5 \times 10^{-4}$ | |

EXAMPLE 1-46

A mixed hot p-xylene solution of TPP or ZnTPP and 4,4'-b(BrM)BB or 2,7-BFBr$_2$ 2,7-BFCl$_2$ or 2,7-BFI$_2$ or 9-B-2-FBr with commercially available PE, (the concentration of these molecules is listed in Table 1-38 below) was cast on a transparent glass substrate under nitrogen gas atmosphere at 120° C. for 24 hours and, then, kept under reduced pressure using a rotary pump at 150° C. for 48 hours to completely remove the solvent, and films 100 to 200 μm thickness were prepared. Absorption spectra of these media look similar to that in FIG. 3.

TABLE

PMMA Host Media 1-38-1

| Medium No. | Donor TPP (mol/l) | Acceptor 4,4'-b(BrM)BB (mol/l) | 2,7-BFBr$_2$ (mol/l) |
|---|---|---|---|
| 1-413 | $5.5 \times 10^{-4}$ | $5.0 \times 10^{-4}$ | |
| 1-414 | $5.3 \times 10^{-4}$ | | $5.3 \times 10^{-4}$ |

1-38-2

| Medium No. | Donor TPP (mol/l) | Acceptor 2,7-BFCl$_2$ (mol/l) | 2,7-BFI$_2$ (mol/l) |
|---|---|---|---|
| 1-415 | $5.4 \times 10^{-4}$ | $4.9 \times 10^{-4}$ | |
| 1-416 | $5.3 \times 10^{-4}$ | | $5.3 \times 10^{-4}$ |

1-38-3

| Medium No. | Donor TPP (mol/l) | ZnTPP (mol/l) | Acceptor 2,7-BFI$_2$ (mol/l) | 9-B-2-FBr (mol/l) |
|---|---|---|---|---|
| 1-417 | $5.1 \times 10^{-4}$ | | | $5.1 \times 10^{-4}$ |
| 1-418 | | $5.2 \times 10^{-4}$ | $5.1 \times 10^{-4}$ | |

EXAMPLE 1-47

The oxidation potential of TPP and ZnTPP, and the reduction potential of 4,4'-(BrM)BB, 2,7-BFBr$_2$, 2,7-BFCl$_2$, 2,7-BFI$_2$ and 9-B-2-FBR were measured by an electrochemical method under the conditions shown in Table 1-39 below. The results are summarized in Table 1-39.

TABLE 1-39

Oxidation and Reduction Potential of the Guest Molecules

| | Solvent | Supporting electrolyte | Oxidation or reduction potential |
|---|---|---|---|
| TPP | CH$_2$Cl$_2$ | Bu$_4$NBF$_4$ | 0.95(V vs SCE) |
| ZnTPP | CH$_2$Cl$_2$ | Bu$_4$NBF$_4$ | 0.71 |
| 4,4'-b(BrM)BB | MeCN | Et$_4$NClO$_4$ | −1.15 |
| 2,7-BFBr$_2$ | MeCN | Bu$_4$NBF$_4$ | −1.67 |
| 2,7-BFCl$_2$ | MeCN | Et$_4$NClO$_4$ | −1.71 |
| 2,7-BFI$_2$ | MeCN | Bu$_4$NBF$_4$ | −1.64 |
| 9-B-2-FBr | MeCN | Et$_4$NClO$_4$ | −1.74 |

According to the oxidation potential or the reduction potential in Table 1-39 it was found that selected combinations of donor ZnTPP with an acceptor, 4,4'-b(BrM)BB, gave negative values of $\Delta G$ calculated from Eq. (2), so that a single-photon intermolecular electron transfer reaction can occur by photoexcitation to $Q_1$ absorption band of ZnTPP (ca. 588 nm). On the other hand, for all the other combinations it was found that a single-photon intermolecular electron transfer reaction cannot occur. However, a two-photon intermolecular electron transfer reaction, for example, via the triplet excited state of the donor as an intermediate state, can occur.

EXAMPLE 1-48

After the media shown in Table 1-37 or Table 1-38 were cooled down to liquid helium temperature (7 K), they were irradiated by a single pulse of a YAG laser-pumped pulsed dye laser at 645 nm (pulse width: 2.5 ns, band width: 1 cm$^{-1}$) in a range of irradiation energy of 0.1 to 10 mJ/cm$^2$/pulse. However, no hole was formed in the $Q_1$ absorption band of TPP. Therefore, it was found that no hole was formed due to a single-photon photochemical reaction under the above irradiation conditions. This fact supported the result of Example 1-47 and also indicated that no hole was formed by other single-photon photochemical reactions. (for example, a proton tautomerization) under the foregoing experimental conditions.

EXAMPLE 1-49 (-- delete)

EXAMPLE 1-50

After the media in Table 1-37 and Table 1-38 were cooled down to liquid helium temperature, they were irradiated simultaneously with a single pulse (irradiation energy 0.5 mJ/cm$^2$/pulse) of a YAG laser-pumped pulse dye laser (pulse width: 2.5 ns, band width: 1 cm$^{-1}$) at 645 nm and a single pulse (irradiation energy: 0.5 mJ/cm$^2$/pulse) of an Ar laser (pulse width: 20 ms) pulsed by a shutter. A hole with a width of about 1.5 cm$^{-1}$ was formed in all the media. Then, the media were simultaneously irradiated with a single pulse (pulse width: 1 μs) of an Ar laser-pumped CW dye laser at 645 nm (band width: $<1\times10^{-4}$ cm$^{-1}$) pulsed by means of an acousto-optic modulator and a single pulse (pulse width: 20 ms) of an Ar laser pulsed by a shutter with the power listed in Table 1-41 below in order to carry out the irradiation by a light source with narrow band width and the high sensitive detection. Holes were then detected by a laser double-beam scanning technique with the same CW dye laser. A hole was produced in the Q1 absorption band of TP in all media. The holewidth and the hole formation in each medium were summarized in Table 1-41. The hole formation yield was larger by an order for the media in PE matrix than for those in PMMA matrix.

TABLE 1-41

| | Irradiation Conditions and Hole Characteristics | | | |
|---|---|---|---|---|
| | Irradiation Power | | | |
| Medium No | $\lambda_1$ (μW/cm$^2$/pulse) | $\lambda_2$ (μW/cm$^2$/pulse) | Hole width (GHz) | $\Delta a/a$ (%) |
| 1-404 | 120 | 80 | 8.0 | 7.5 |
| 1-405 | 120 | 80 | 7.9 | 3.6 |
| 1-406 | 120 | 80 | 8.0 | 6.4 |
| 1-407 | 110 | 80 | 7.5 | 7.2 |
| 1-408 | 120 | 80 | 6.7 | 6.9 |
| 1-413 | 15 | 80 | 8.7 | 7.3 |
| 1-414 | 20 | 80 | 7.2 | 4.6 |
| 1-415 | 20 | 80 | 7.2 | 8.0 |
| 1-416 | 15 | 80 | 6.8 | 7.2 |
| 1-417 | 20 | 80 | 8.1 | 3.8 |

EXAMPLE 1-51

After the media in Table 1-37 or Table 1-38 were cooled down to liquid helium temperature, they were irradiated simultaneously with a single pulse (irradiation energy: 0.3 mJ/cm$^2$/pulse) of a YAG laser-pumped dye laser at 645 nm (pulse width: 2.5 ns, band width: 1 cm$^{-1}$) and a single pulse (irradiation energy: 0.5 mJ/cm$^2$/pulse) of a N$_2$ laser-pumped pulse dye laser at 380 nm (pulse width: 8 ns). A Hole with a width of about 1.5 cm$^{-1}$ was formed in all the media. Then, they were irradiated simultaneously with a single pulse (pulse width: 1 μs) of an Ar laser-pumped CW dye laser at 645 nm (band width: $<1\times10^{-4}$ cm$^{-1}$) pulsed by an acousto-optic modulator and a single pulse (pulse width: 8 ns) of a N$_2$ laser-pumped pulse dye laser at 380 nm with the power listed in Table 1-42 below in order to carry out the irradiation by a light source with narrow bandwidth and the high sensitive detection. Hole were then detected by a laser double-beam scanning technique with the same CW dye laser. A hole was produced in the Q$_1$ band of TPP in all the media. The holewidth and the hole formation yield in each medium were summarized in Table 1-42. The hole formation yield was larger by an order for the media in PE matrix than for those in PMMA matrix.

TABLE 1-42

| | Irradiation Conditions and Hole Characteristics | | | |
|---|---|---|---|---|
| | Irradiation power | | | |
| Medium No. | $\lambda_1$ (μW/cm$^2$/pulse) | $\lambda_2$ (μW/cm$^2$/pulse) | Hole width (GHz) | $\Delta a/a$ (%) |
| 1-404 | 60 | 80 | 8.7 | 3.7 |
| 1-405 | 60 | 80 | 7.1 | 5.0 |
| 1-406 | 60 | 80 | 8.2 | 8.3 |
| 1-407 | 60 | 80 | 8.4 | 6.0 |
| 1-408 | 60 | 80 | 7.8 | 5.5 |
| 1-413 | 15 | 80 | 8.5 | 3.8 |
| 1-414 | 10 | 80 | 6.8 | 5.5 |
| 1-415 | 10 | 80 | 7.3 | 7.4 |
| 1-416 | 15 | 80 | 8.0 | 4.8 |
| 1-417 | 10 | 80 | 7.6 | 8.3 |

EXAMPLE 1-52

The effect of the irradiation time interval between the frequency-selecting and the gating excitation, $\tau$, on the hole formation was investigated for the $\tau$ value of 0-1 sec, taking the medium 1-405 as an example. After cooling the medium 1-405 down to liquid helium temperature, it was irradiated with a single pulse (pulse width: 1 μs ) of an Ar laser-pumped CW dye laser at 645 nm (bandwidth: $<1\times10^{-4}$ cm$^{-1}$) pulsed by an acousto-optic modulator and a single pulse (pulse width: 20 ms) of an Ar laser pulsed by a shutter for the above-mentioned range of the irradiation interval with the power listed in Table 1-42 in order to carry out the irradiation by a light source with narrow bandwidth and the high sensitive detection. Holes were then detected by a laser double-beam scanning technique with the same CW dye laser. The hole formation was observed when the irradiation interval was within several tens of ms. This indicates that for the media 1-405, two-photon hole formation occurs via the triplet excited state of TPP as an intermediate state.

EXAMPLE 1-53

The effect of the pulse width of the frequency-selecting excitation on hole formation was examined in the range of 8 ms to 2.5 ns, taking the medium 1-405 as an example. After cooling the medium 1-405 down to liquid helium temperature, it was irradiated simultaneously with a single pulse of 645 nm light of either a YAG laser-pumped pulse dye laser for a pulse width of 2.5 ns, or an Ar laser pumped CW dye laser pulsed by an acousto-optic modulator or by a shutter for a pulse width of 1 μs - 8 ms, and a single pulse (pulse width: 20 ms, irradiation power: 100 μW/cm$^2$/pulse) of an Ar laser/pulsed by a shutter with the power listed in Table 1-43 below. The width and the depth of the burnt hole under each irradiation condition were summarized in Table 1-43.

TABLE 1-43

Dependence of Hole Characteristics on Irradiation Light Pulse Width

| Pulse width (μS) | Irradiation power (μW/cm²/pulse) | Hole width (GHz) | Δa/a (%) |
|---|---|---|---|
| $2.5 \times 10^{-3}$ | 300 | 17.5 | 5.1 |
| 1 | 100 | 12.8 | 5.0 |
| 10 | 60 | 12.4 | 5.1 |
| 100 | 40 | 9.3 | 5.3 |
| 8000 | 20 | 8.5 | 4.8 |

EXAMPLE 1-54

The effect of the irradiation laser spot on hole formation was examined taking the medium 1-407 as an example. Medium 1-407 was irradiated simultaneously with a focused single pulse (pulse width: 1 μs, irradiation power: 100 μW/cm²/pulse) of an Ar laser-pumped CW dye laser at 645 nm (bandwidth: $<1\times10^{-4}$cm$^{-1}$) pulsed by an acousto-optic modulator and a focused single pulse (pulse width: 20 ms, irradiation power: 100 μW/cm²/pulse) of an Ar laser pulsed by a shutter at liquid helium temperature. A hole was detected by means of a laser double-beam scanning technique using the same focused laser beam in the burning. A hole could be detected up to the focused laser spot of 100 μmϕ.

EXAMPLE 1-55

In order to examine the effect of acceptor concentration on hole formation, the media in PMMA matrix with the guest concentration shown in Table 1-44 were prepared by the same method as in Example 1-45.

TABLE 1-44

PMMA Host Media with a Highly-doped Acceptor

| Medium No. | Donor TPP (mol/l) | Acceptor 2, 7-BFl₂ (mol/l) |
|---|---|---|
| 1-419 | $5.5 \times 10^{-4}$ | $3.1 \times 10^{-3}$ |
| 1-420 | $5.4 \times 10^{-4}$ | $4.7 \times 10^{-2}$ |
| 1-421 | $5.6 \times 10^{-4}$ | $5.0 \times 10^{-1}$ |

After the media in Table 1-45 were cooled down to liquid helium temperature, they were irradiated simultaneously with a single pulse (pulse width: 1 μs) of an Ar laser-pumped CW dye laser at 645 nm (bandwidth: $<1\times10^{-4}$cm$^{-1}$) pulsed by an acousto-optic modulator and a single pulse (pulse width: 20 ms, irradiation power: 100 μW/cm²/pulse) of an Ar laser pulsed by a shutter with the power listed in Table 1-45 below. This resulted in hole formation in the $Q_1$ absorption band of TPP. The holewidth and hole depth in each medium are summarized in Table 1-45.The hole formation yield did not show any marked change when the acceptor concentration increased from the value in the medium 1-407 to that in the medium 1-419. On the other hand, the hole formation yield increased about by an order of magnitude when the acceptor concentration increased from the value in the medium 1-407 to that in the medium 1-420 or 1-421 This indicates that the hole formation yield depends on the average distance between donor and acceptor molecules. Also, the experimental results explain why the hole formation yield is larger about by an order for the PE matrix than for the PMMA matrix. In crystalline polymers, such as PE, since guest molecules are dispersed in their amorphous region [Th. Sesselmann, W. Richter, D. Haarer, and H. Morawitz: Phys. Rev., B36, p.7601 (1987)], the distance between donor and acceptor is smaller than that in amorphous polymers such as PMMA even if the guest concentration is the same as that in PMMA.

TABLE 1-45

Irradiation Condition and Hole Characteristics of PMMA Medium with a Highly-Doped Acceptor

| Medium No. | Irradiation power (μW/cm²/pulse) | Hole width (GHz) | Δa/a (%) |
|---|---|---|---|
| 1-419 | 50 | 8.2 | 4.9 |
| 1-420 | 10 | 12.2 | 5.1 |
| 1-421 | 20 | 14.4 | 4.6 |

EXAMPLE 1-56

A mixed chloroform solution of TPP or ZnTPP and 2, 7 -diiodofluorecein (abbreviated to 2, 7 -Fl₂, hereinafter), 4,5 -diiodofluorecein (abbreviated to 4,5 -Fl₂, hereinafter), 1-chlorophenazine (abbreviated to 1-PCl, hereinafter), 2-chlorophenazine (abbreviated to 2-PCl, hereinafter), 2-chloro-6-methoxyphenazine (abbreviated to 2-Cl-6-MP, hereinafter), 1-bromoadamantane (abbreviated to 1-ADBr, hereinafter) with commercially available PMMA (the concentration of these molecules is shown in Table 1-46 below) was cast on a transparent glass substrate under a nitrogen gas atmosphere at 50° C. to 60° C. for 24 hours, then kept under reduced pressure using a rotary pump at 150° C. for 48 hours to completely remove the solvent. Thus, 1 mm thick films were prepared. The absorption spectra of these media look similar to that in FIG. 3.

TABLE 1-46

PMMA Host Media

| Medium No. | Donor TPP (mol/l) | Acceptor 2,7-Fl₂ (mol/l) | Acceptor 4,5-Fl₂ (mol/l) |
|---|---|---|---|
| 1-501 | $5.4 \times 10^{-4}$ | $5.2 \times 10^{-4}$ | |
| 1-502 | $5.2 \times 10^{-4}$ | | $5.1 \times 10^{-4}$ |

| Medium No. | Donor TPP (mol/l) | Acceptor 1-PCl (mol/l) | Acceptor 2-PCl (mol/l) | Acceptor 2-Cl-6-MP (mol/l) |
|---|---|---|---|---|
| 1-503 | $5.5 \times 10^{-4}$ | $5.0 \times 10^{-4}$ | | |
| 1-504 | $5.1 \times 10^{-4}$ | | $5.3 \times 10^{-4}$ | |
| 1-505 | $5.0 \times 10^{-4}$ | | | $5.2 \times 10^{-4}$ |

| Medium No. | Donor TPP (mol/l) | Donor ZnTPP (mol/l) | Acceptor 1-ADBr (mol/l) |
|---|---|---|---|
| 1-506 | $5.3 \times 10^{-4}$ | | $5.5 \times 10^{-4}$ |
| 1-507 | | $5.1 \times 10^{-4}$ | $5.0 \times 10^{-4}$ |

EXAMPLE 1-57

A mixed hot p-xylene solution of TPP or ZnTPP and 2,7 -Fl₂ or 4,5 Fl₂ or 1-PCl or 2-PCl or 2-Cl-6-MP of 1-ADBr with commercially available PE, (the concentration of these molecules is listed in Table 1-47 below) was cast on a transparent glass substrate under nitrogen gas atmosphere at 120° C. for 24 hours and, furthermore, kept under reduced pressure using a rotary pump at 150° C. for 48 hours to completely remove the solvent, and films 100 to 200 μm thickness were prepared. Absorption spectra of these media look similar to that in FIG. 3.

TABLE 1-47

PE Host Media

| Medium No. | Donor TPP (mol/l) | Acceptor 2,7-Fl$_2$B (mol/l) | Acceptor 4,5-Fl$_2$ (mol/l) |
|---|---|---|---|
| 1-509 | 5.3 × 10$^{-4}$ | 5.1 × 10$^{-4}$ | |
| 1-510 | 5.3 × 10$^{-4}$ | | 5.3 × 10$^{-4}$ |

| Medium No. | Donor TPP (mol/l) | Acceptor 1-PCl (mol/l) | Acceptor 2-PCl (mol/l) |
|---|---|---|---|
| 1-511 | 5.2 × 10$^{-4}$ | 5.1 × 10$^{-4}$ | |
| 1-512 | 5.4 × 10$^{-4}$ | | 5.2 × 10$^{-4}$ |

| Medium No | Donor TPP (mol/l) | Donor ZnTPP (mol/l) | Acceptor 2-Cl-6-MP (mol/l) | Acceptor 1-ADBr (mol/l) |
|---|---|---|---|---|
| 1-513 | 5.5 × 10$^{-4}$ | | 5.4 × 10$^{-4}$ | |
| 1-514 | 5.2 × 10$^{-4}$ | | | 5.0 × 10$^{-4}$ |
| 1-516 | | 5.0 × 10$^{-4}$ | | 5.2 × 10$^{-4}$ |

EXAMPLE 1-58

The oxidation potential of TPP and ZnTPP, and the reduction potential of 2,7-Fl$_2$, 4,5-Fl$_2$, 1-PCl, 2-PCl, 2-Cl-6-MP and 1-ADBr were measured by an electrochemical method under the conditions shown in Table 1-48 below. The results are summarized in Table 1-48.

TABLE 1-48

Oxidation and Reduction Potential of the Guest Molecules

| | Solvent | Supporting electrolyte | Oxidation or reduction potential |
|---|---|---|---|
| TPP | CH$_2$Cl$_2$ | Bu$_4$NBF$_4$ | 0.95 (V vs SCE) |
| ZnTPP | CH$_2$Cl$_2$ | Bu$_4$NBF$_4$ | 0.71 |
| 2,7-Fl$_2$ | MeCN | Bu$_4$NBF$_4$ | −1.17 |
| 4,5-Fl$_2$ | MeCN | Bu$_4$NBF$_4$ | −1.02 |
| 1-PCl | MeCN | Et$_4$NClO$_4$ | −1.24 |
| 2-PCl | MeCN | Et$_4$NClO$_4$ | −1.11 |
| 2-Cl-6-MP | MeCN | Bu$_4$NBF$_4$ | −1.268 |
| 1-ADBr | MeCN | Et$_4$NClO$_4$ | −2.38 |

According to the oxidation potential or the reduction potential in Table 1-48 it was found that selected combinations of donor ZnTPP with an acceptor, 2,7-Fl$_2$, 4,5-Fl$_2$, 1-PCl, 2-PCl, and 2-Cl-6-MP gave negative values of $\Delta G$ calculated from Eq. (2), so that a single-photon intermolecular electron transfer reaction can occur by photoexcitation to Q$_1$ absorption band of ZnTPP (ca. 588 nm). On the other hand, for all the other combinations it was found that a single-photon intermolecular electron transfer reaction cannot occur. However, a two-photon intermolecular electron transfer reaction, for example, via the triplet excited state of the donor as an intermediate state, can occur.

EXAMPLE 1-59

After the media shown in Tables 1-46 or Table 1-47 were cooled down to liquid helium temperature (7 K), they were irradiated by a single pulse of a YAG laser-pumped pulsed dye laser at 645 nm (pulse width: 2.5 ns, band width: 1 cm$^{-1}$) in a range of irradiation energy of 0.1 to 10 mJ/cm$^2$/pulse. However, no hole was formed in the Q$_1$ absorption band of TPP. Therefore, it was found that no hole was formed due to a single-photon photochemical reaction under the above irradiation conditions. This fact supported the result of Example 1-58 and also indicated that no hole was formed by other single-photon photochemical reactions, (for example, a proton tautomerization) under the foregoing experimental conditions.

EXAMPLE 1-60 (-- delete)

EXAMPLE 1-61

After the media in Table 1-46 and Table 1-47 were cooled down to liquid helium temperature, they were irradiated simultaneously with a single pulse (irradiation energy: 0.1 mJ/cm$^2$/pulse) of a YAG laser-pumped pulse dye laser (pulse width: 2.5 ns, band width: 1 cm$^{-1}$) at 645 nm and a single pulse (irradiation energy: 0.1 mJ/cm$^2$/pulse) of an Ar laser (pulse width: 20 ms) pulsed by a shutter. A hole with a width of about 1.5 cm$^{-1}$ was formed in all the media. Then, the media were simultaneously irradiated with a single pulse (pulse width: 1 μs) of an Ar laser-pumped CW dye laser at 645 nm (band width: <1×10$^{-4}$ cm$^{-1}$) pulsed by means of an acousto-optic modulator and a single pulse (pulse width: 20 ms) of an Ar laser pulsed by a shutter with the powder listed in Table 1-50 below in order to carry out the irradiation by a light source with narrow band width and the high sensitive detection. Holes were then detected by a laser double-beam scanning technique with the same CW dye laser. A hole was produced in the Q$_1$ absorption band of TPP in all the media. The holewidth and the hole formation in each medium were summarized in Table 1-50. The hole formation yield was larger by an order for the media in PE matrix than for those in PMMA matrix.

TABLE 1-50

Irradiation Conditions and Hole Characteristics

| Medium No | Irradiation power $\lambda_1$ (μW/cm$^2$/pulse) | Irradiation power $\lambda_2$ (μW/cm$^2$/pulse) | Hole width (GHz) | $\Delta a/a$ (%) |
|---|---|---|---|---|
| 1-501 | 120 | 80 | 8.2 | 3.5 |
| 1-502 | 120 | 80 | 7.5 | 5.2 |
| 1-503 | 120 | 80 | 8.0 | 6.2 |
| 1-504 | 110 | 80 | 8.3 | 7.3 |
| 1-505 | 120 | 80 | 7.6 | 4.9 |
| 1-506 | 120 | 80 | 8.5 | 7.0 |
| 1-509 | 20 | 80 | 9.0 | 7.0 |
| 1-510 | 20 | 80 | 8.5 | 5.6 |
| 1-511 | 20 | 80 | 7.9 | 5.8 |
| 1-512 | 20 | 80 | 6.7 | 6.3 |
| 1-513 | 20 | 80 | 6.5 | 4.1 |
| 1-514 | 20 | 80 | 7.1 | 4.7 |

EXAMPLE 1-62

After the media in Table 1-46 or Table 1-47 were cooled down to liquid helium temperature, they were irradiated simultaneously with a single pulse (irradiation energy: 0.3 mJ/cm$^2$/pulse) of a YAG laser-pumped dye laser at 645 nm (pulse width: 2.5 ns, band width: 1 cm$^{-1}$) and a single pulse (irradiation energy: 0.5 mJ/cm$^2$/pulse) of a N$_2$ laser-pumped pulse dye laser at 380 nm ( pulse width: 8 ns). A Hole with a width of about 1.5 cm$^{-1}$ was formed in all the media. Then, they were irradiated simultaneously with a single pulse (pulse width: 1 μs) of an Ar laser-pumped CW dye laser at 645 nm (band width: <1×10$^{-4}$ cm$^{-1}$) pulsed by an acousto-optic modulator and a single pulse (pulse width: 8 ns) of a N$_2$ laser-pumped pulse dye laser at 380 nm with the power listed in Table 1-51 below in order to carry out the irradiation by a light source with narrow bandwidth and the high sensitive detection. Holes were then detected by a laser double-beam scanning technique with the same CW dye laser. A hole was produced in the $Q_1$ band of TPP in all the media. The holewidth and the hole formation yield in each medium were summarized in Table 1-51. The hole formation yield was larger by an order for the media in PE matrix than for those in PMMA matrix.

TABLE 1-51

| | Irradiation Conditions and Hole Characteristics | | | |
|---|---|---|---|---|
| | Irradiation power | | | |
| Medium No | $\lambda_1$ ($\mu$W/cm$^2$/pulse) | $\lambda_2$ ($\mu$W/cm$^2$/pulse) | Hole width (GHz) | $\Delta a/a$ (%) |
| 1-501 | 60 | 80 | 7.3 | 4.7 |
| 1-502 | 60 | 80 | 8.1 | 5.1 |
| 1-503 | 60 | 80 | 6.2 | 7.3 |
| 1-504 | 60 | 80 | 8.5 | 5.0 |
| 1-505 | 60 | 80 | 7.1 | 5.7 |
| 1-506 | 60 | 80 | 6.5 | 4.8 |
| 1-509 | 10 | 80 | 7.6 | 7.1 |
| 1-510 | 20 | 80 | 5.4 | 3.1 |
| 1-511 | 15 | 80 | 5.3 | 4.3 |
| 1-512 | 20 | 80 | 6.1 | 5.6 |
| 1-513 | 10 | 80 | 6.0 | 5.4 |
| 1-514 | 10 | 80 | 5.2 | 3.7 |

EXAMPLE 1-63

The effect of the irradiation time interval between the frequency-selecting and the gating excitation, $\tau$, on the hole formation was investigated for the $\tau$ value of 0-1 sec, taking the medium 1-503 as an example. After cooling the medium 1-503 down to liquid helium temperature, they were irradiated with a single pulse (pulse width: 1 $\mu$m) of an Ar laser-pumped CW dye laser at 645 nm (bandwidth: $<1\times10^{-4}$ cm$^{-1}$) pulsed by an acousto-optic modulator and a single pulse (pulse width: 20 ms) of an Ar laser pulsed by a shutter for the above-mentioned range of the irradiation interval with the power listed in Table 1-50 in order to carry out the irradiation by a light source with narrow bandwidth and the high sensitive detection. Holes were then detected by a laser double-beam scanning technique with the same CW dye laser. The hole formation was observed when the irradiation interval was within several tens of ms. This indicates that for the above-described media, two-photon hole formation occurs via the triplet excited state of TPP as an intermediate state.

EXAMPLE 1-64

The effect of the pulse width of the frequency-selecting excitation on hole formation was examined in the range of 8 ms to 2.5 ns, taking the medium 1-506 as an example. After cooling the medium 1-506 down to liquid helium temperature, it was irradiated simultaneously with a single pulse of 645 nm light of either a YAG laser-pumped pulse dye laser for a pulse width of 2.5 ns, or an Ar laser -pumped CW dye laser pulsed by an acousto-optic modulator or by a shutter for a pulse width of 1 $\mu$s-8 ms, and a single pulse (pulse width: 20 ms, irradiation power: 100 $\mu$W/cm$^2$/pulse) of an Ar laser pulsed by a shutter with the power listed in Table 1-52 below. The width and the depth of the burnt hole under each irradiation condition were summarized in Table 1-52.

TABLE 1-52

| Dependence of Hole Characteristics on Irradiation Light Pulse Width | | | |
|---|---|---|---|
| Pulse width ($\mu$S) | Irradiation power ($\mu$W/cm$^2$/pulse) | Hole width (GHz) | $\Delta a/a$ (%) |
| 2.5 · 10$^{-3}$ | 300 | 16.3 | 4.1 |
| 1 | 100 | 10.8 | 4.1 |
| 10 | 70 | 10.4 | 4.7 |
| 100 | 40 | 8.2 | 4.3 |
| 8000 | 20 | 8.3 | 4.6 |

EXAMPLE 1-65

The effect of the irradiation laser spot on hole formation was examined taking the medium 1-506 as an example. Medium 1-506 was irradiated simultaneously with a focused single pulse (pulse width: 1 $\mu$s, irradiation power: 100 $\mu$W/cm$^2$/pulse) of an Ar laser-pumped CW dye laser at 645 nm (bandwidth: $<1\times10^4$cm$^{-1}$) pulsed by an acousto-optic modulator and a focused single pulse (pulse width: 20 ms, irradiation power: 100 $\mu$W/cm$^2$/pulse) of an Ar laser pulsed by a shutter at liquid helium temperature. A hole was detected by means of a laser double-beam scanning technique using the same focused laser beam in the burning. A hole could be detected up to the focused laser spot of 100 $\mu$m$\phi$.

EXAMPLE 1-66

In order to examine the effect of acceptor concentration on hole formation, the media in PMMA matrix with the guest concentration shown in Table 1-53 were prepared by the same method as in Example 1-46.

TABLE 1-53

| PMMA Host Media with a Highly-doped Acceptor | | |
|---|---|---|
| Medium No. | Donor TPP (mol/l) | Acceptor 1-ADBr (mol/l) |
| 1-517 | 5.3 × 10$^{-4}$ | 3.2 × 10$^{-3}$ |
| 1-518 | 5.5 × 10$^{-4}$ | 4.3 × 10$^{-2}$ |
| 1-519 | 5.4 × 10$^{-4}$ | 5.1 × 10$^{-1}$ |

After the media in Table 1-54 were cooled down to liquid helium temperature, they were irradiated simultaneously with a single pulse (pulse width: 1 $\mu$s) of an Ar laser-pumped CW dye laser at 645 nm (bandwidth: $<1\times10^{-4}$cm$^{-1}$) pulsed by an acousto-optic modulator and a single pulse (pulse width: 20 ms, irradiation power: 100 $\mu$W/cm$^2$/pulse) of an Ar laser pulsed by a shutter with the power listed in Table 1-54 below. This resulted in hole formation at the $Q_1$ absorption band of TPP. The holewidth and hole depth in each medium are summarized in Table 1-54.The hole formation yield did not show any marked change when the acceptor concentration increased from the value in the medium 1-506 to that in the medium 1-419. On the other hand, the hole formation yield increased about by an order of magnitude when the acceptor concentration increased from the value in the medium 1-407 to that in the medium 1-518 or 1-519. This indicates that the hole formation yield depends on the average distance between donor and acceptor molecules. Also, the experimental results explain why the hole formation yield is larger about by an order of magnitude for the PE matrix than for the PMMA matrix. In crystalline polymers, such as PE, since guest molecules are dispersed in their amorphous region [Th. Sesselmann, W. Richter, D. Haarer, and H. Morawitz: Phys. Rev., B36, p.7601 (1987)], the distance between donor and acceptor is smaller than that in amorphous polymers such as PMMA even if the guest concentration is the same as that in PMMA.

TABLE 1-54

Irradiation Condition and Hole Characteristics of PMMA Medium with a Highly-Doped Acceptor

| Medium No. | Irradiation power ($\mu W/cm^2$/pulse) | Hole width (GHz) | $\Delta a/a$ (%) |
|---|---|---|---|
| 1-517 | 50 | 7.8 | 4.7 |
| 1-518 | 10 | 11.2 | 5.3 |
| 1-519 | 20 | 15.4 | 4.8 |

EXAMPLE 1-67

Figure 9:
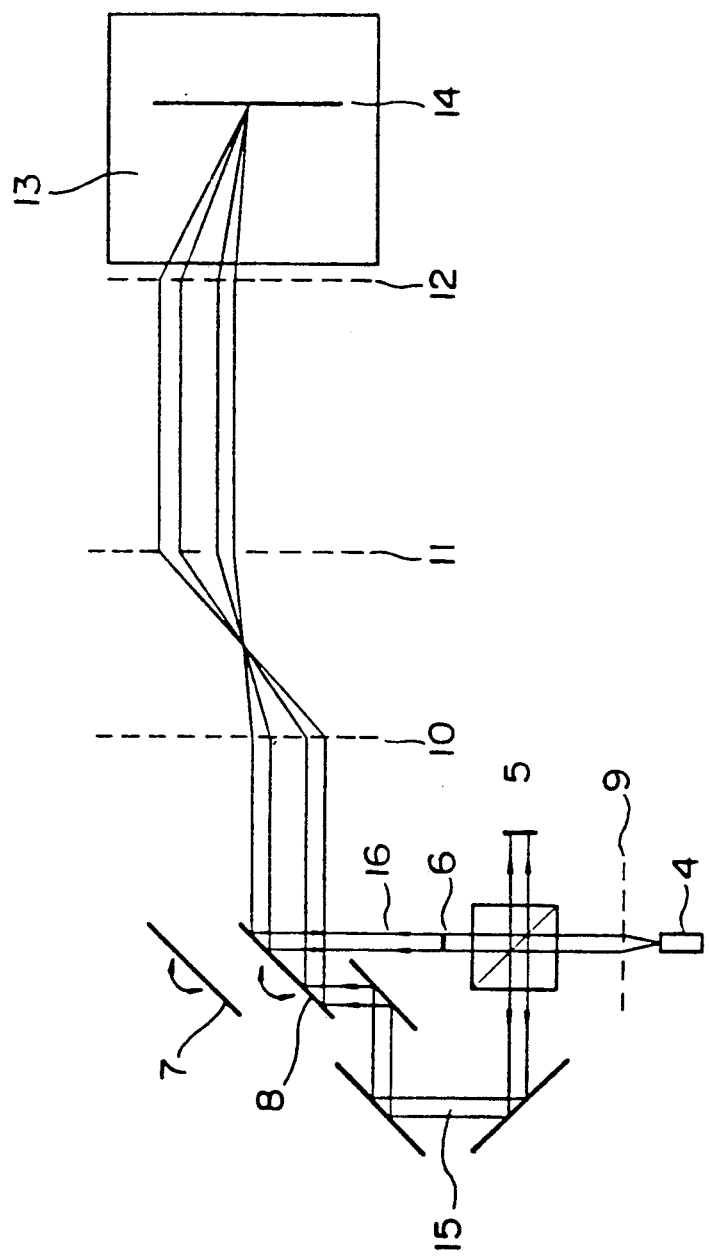
FIG. 9 is a schematic diagram of an apparatus with the holographic storage scheme.

After the media 1-1, 1-101, 1-201, 1-305, 1-407 or 1-501 were cooled down to liquid helium temperature, they were simultaneously irradiated with a single pulse of two kinds of coherent dye laser light (the frequenbcy selective excitation) at 645 nm (pulse width: 2.5 ns, irradiation energy: 1.0 mJ/cm$^2$/pulse; wherein the one light is the reference beam and the other is the object beam) and a single pulse of dye laser light (the gating excitation) at 488 nm (pulse width: 6 ns, irradiation energy: 1.0 mJ/cm$^2$/pulse) in a focused laser spot of 100 $\mu m\phi$ by using the experimental setup shown in FIG. 9. Consequently, a image was holographically stored due to the two-photon photochemical reaction. The image was reproduced by the subsequent irradiation with the only reference beam. FIG. 9 shows a schematic diagram of the apparatus comprising the hologram system, where 4: light source, 5: detector, 6: page composer, 7 and 8: two-dimensional galvanomirror, 9 to 12: lens, 13: cooling chamber, 14: memory medium, 15: reference beram and 16: object beam are illustrated.

EXAMPLE 2-1

A mixed chloroform solution of metal-free tetraphenylporphyrin (hereinafter, "TPP") or its zinc salt (hereinafter, "ZnTPP") and 1, 8-dichloroanthraquinone (abbreviated 1, 8-AQCl$_2$, hereinafter) or p-chlorobenzonitrile (abbreviated p-BNCl, hereinafter) or p-chlorobenzophenone (abbreviated p-BPCl, hereinafter) with commercially available PMMA (the concentration of these molecules is shown in Table 2-1 below) was cast on a transparent glass substrate under a nitrogen gas atmosphere at 50° C. to 60° C. for 24 hours, then, kept under reduced pressure using a rotary pump at 150° C. for 48 hours, to completely remove the solvent. Thus, 1 mm thick films were prepared. The absorption spectrum of these media 2-5 look similar to that in FIG. 3.

TABLE 2-1

| PMMA Host Media | | | |
|---|---|---|---|
| | Donor | Acceptor | |
| Medium No. | TPP (mol/l) | 1,8-AQCl$_2$ (mol/l) | p-BNCl (mol/l) |
| 2-4 | 5.6 × 10$^{-4}$ | 5.0 × 10$^{-4}$ | |
| 2-5 | 5.3 × 10$^{-4}$ | | 5.1 × 10$^{-4}$ |

| | Donor | | Acceptor |
|---|---|---|---|
| Medium No. | TPP (mol/l) | ZnTPP (mol/l) | p-BPCl (mol/l) |
| 2-6 | 5.5 × 10$^{-4}$ | | 5.3 × 10$^{-4}$ |
| 2-7 | | 5.2 × 10$^{-4}$ | 5.5 × 10$^{-4}$ |

EXAMPLE 2-2

A mixed hot p-xylene solution of TPP or ZnTPP and 1,8-AQCl$_2$ or p-BNCl or p-BPCl with commercially available high-density polyethylene (PE)(the concentration of these molecules is shown in Table 2-2 below) was cast on a transparent glass substrate under a nitrogen gas atmosphere at 120° C. for 24 hours, then kept under reduced pressure using a rotary pump at 150° C. for 48 hours to completely remove the solvent. Thus, films 100 to 200 $\mu$m thick were prepared. The absorption spectra of these media look similar to that in FIG. 3.

TABLE 2-2

| PE Host Media | | | |
|---|---|---|---|
| | Donor | Acceptor | |
| Medium No. | TPP (mol/l) | 1,8-AQCl$_2$ (mol/l) | p-BNCl (mol/l) |
| 2-12 | 5.5 × 10$^{-4}$ | 5.2 × 10$^{-4}$ | |
| 2-13 | 5.3 × 10$^{-4}$ | | 5.0 × 10$^{-4}$ |

| | Donor | | Acceptor | |
|---|---|---|---|---|
| Medium No. | TPP (mol/l) | ZnTPP (mol/l) | p-BNCl (mol/l) | p-BPCl (mol/l) |
| 2-14 | 5.4 × 10$^{-4}$ | | | 5.3 × 10$^{-4}$ |
| 2-16 | | 5.2 × 10$^{-4}$ | 5.4 × 10$^{-4}$ | |

EXAMPLE 2-3

The oxidation potential of TPP and ZnTPP, and the reduction potential of 1,8-AQCl$_2$, p-BNCl, p-BPCl were measured by an electrochemical method under the conditions shown in Table 2-3 below. The results are summarized in Table 2- 3.

TABLE 2-3

Oxidation and Reduction Potential of the Guest Molecules

| | Solvent | Supporting electrolyte | Oxidation or reduction potential |
|---|---|---|---|
| TPP | CH$_2$Cl$_2$ | Bu$_4$NBF$_4$ | 0.95(V vs SCE) |
| ZnTPP | CH$_2$Cl$_2$ | Bu$_4$NBF$_4$ | 0.71 |
| 1,8-AQCl$_2$ | MeCN | Bu$_4$NBF$_4$ | −0.79 |
| p-BNCl | MeCN | Bu$_4$NBF$_4$ | −1.65 |
| p-BPCl | MeCN | Et$_4$NClO$_4$ | −1.45 |

According to the oxidation potential or the reduction potential in Table 2-3 it was found that selected combinations of donor TPP or ZnTPP with an acceptor, except 1,8-AQCl$_2$, gave a negative value of $\Delta G$ calculated from Eq. (2), so that a single-photon intermolecular electron transfer reaction can occur by photoexcitation to $Q_1$ absorption band of TPP (ca. 645 nm) or ZnTPP (ca. 588 nm). On the other hand, for all the other combinations, it was found that a single-photon intermolecular electron transfer reaction cannot occur. However, a two-photon intermolecular electron transfer reaction, for example, via the triplet excited state of the donor as an intermediate state, can occur.

EXAMPLE 2-4

After the media shown in Tables 2-1 or Table 2-2 were cooled down to liquid helium temperature (7 K), they were irradiated by a single pulse of a YAG laser-pumped pulsed dye laser at 645 nm (pulse width: 2.5 ns, band width: 1 cm$^{-1}$) in a range of irradiation energy of 0.1 to 10 mJ/cm$^2$/pulse. However, no hole was formed in the $Q_1$ absorption band of TPP. Therefore, it was found that no hole was formed due to a single-photon photochemical reaction under the above irradiation conditions. This fact supported the result of Example 2-3 except for TPP-1, 8-AQCl$_2$ and also indicated that no hole was formed by other single-photon photochemical reactions, (for example, a proton tautomerization) under the foregoing experimental conditions.

EXAMPLE 2-5 (-- delete)

EXAMPLE 2-6

After the media in Table 2-1 and Table 2-2 were cooled down to liquid helium temperature, they were irradiated simultaneously with a single pulse (irradiation energy: 0.5 mJ/cm$^2$/pulse) of a YAG laser-pumped pulse dye laser (pulse width: 2.5 ns, band width: 1 cm$^{-1}$) at 645 nm and a single pulse (irradiation energy: 0.5 mJ/cm$^2$/pulse) of an Ar laser (pulse width: 20 ms) pulsed by a shutter. A hole with a width of about 1.5 cm$^{-1}$ was formed in all the media. Then, the media were simultaneously irradiated with a single pulse (pulse width: 1 μs) of an Ar laser-pumped CW dye laser at 645 nm (band width: <1×10$^{-4}$ cm$^{-1}$) pulsed by means of an acousto-optic modulator and a single pulse (pulse width:20 ms) of an Ar laser pulsed by a shutter with the power listed in Table 2-5 below in order to carry out the irradiation by a light source with narrow band width and the high sensitive detection. Holes were then detected by a laser double-beam scanning technique with the same CW dye laser. A hole was produced in the Q$_1$ absorption band of TPP in all the media. The hole width and the hole formation yield in each medium were summarized in Table 2-5. The hole formation yield was larger by an order of magnitude for the media in PE matrix than for those in PMMA matrix.

TABLE 2-5

Irradiation Condition and Hole Characteristics

| Medium No. | Irradiation power λ$_1$ (μW/cm$^2$/pulse) | λ$_2$ (μW/cm$^2$/pulse) | Holewidth (GHz) | Δa/a (%) |
|---|---|---|---|---|
| 2-4 | 120 | 80 | 8.7 | 3.5 |
| 2-5 | 120 | 80 | 6.9 | 7.6 |
| 2-6 | 120 | 80 | 8.0 | 7.4 |
| 2-12 | 15 | 80 | 8.5 | 3.2 |
| 2-13 | 15 | 80 | 6.8 | 6.9 |
| 2-14 | 15 | 80 | 7.7 | 6.8 |

EXAMPLE 2-7

After the media in Table 2-1 or Table 2-2 were cooled down to liquid helium temperature, they were irradiated simultaneously with a single pulse (irradiation energy: 0.3 mJ/cm$^2$/pulse) of a YAG laser-pumped dye laser at 645 nm (pulse width: 2.5 ns, band width: 1 cm$^{-1}$) and a single pulse (irradiation energy: 0.5 mJ/cm$^2$/pulse) of a N$_2$ laser-pumped pulse dye laser at 380 nm (pulse width: 8 ns). A Hole with a width of about 1.5 cm$^{-1}$ was formed in all the media. Then, they were irradiated simultaneously with a single pulse (pulse width: 1 μs) of an Ar laser-pumped CW dye laser at 645 nm (band width: <1×10$^{-4}$ cm$^{-1}$) pulsed by an acousto-optic modulator and a single pulse (pulse width: 8 ns) of a N$_2$ laser-pumped pulse dye laser at 380 nm with the power listed in Table 2-6 below in order to carry out the irradiation by a light source with narrow bandwidth and the high sensitive detection. Holes were then detected by a laser double-beam scanning technique with the same CW dye laser. A hole was produced in the Q$_1$ band of TPP in all the media. The holewidth and the hole formation yield in each medium were summarized in Table 2-6. The hole formation yield was larger by an order for the media in PE matrix than for those in PMMA matrix.

TABLE 2-6

Irradiation Conditions and Hole Characteristics

| Medium No. | Irradiation power λ$_1$ (μW/cm$^2$/pulse) | λ$_2$ (μW/cm$^2$/pulse) | Holewidth (GHz) | Δa/a (%) |
|---|---|---|---|---|
| 2-4 | 60 | 80 | 8.7 | 3.7 |
| 2-5 | 60 | 80 | 7.1 | 5.0 |
| 2-6 | 60 | 80 | 8.2 | 8.3 |
| 2-12 | 15 | 80 | 8.5 | 3.8 |
| 2-13 | 10 | 80 | 6.8 | 5.5 |
| 2-14 | 10 | 80 | 7.6 | 8.3 |

EXAMPLE 2-8

The effect of the irradiation time interval between the frequency-selecting and the gating excitation, τ, on the hole formation was investigated for the τ value of 0–1 sec, taking the medium 2-1 as an example. After cooling the medium 2-1 down to liquid helium temperature, it was irradiated with a single pulse (pulse width: 1 μm) of an Ar laser-pumped CW dye laser at 645 nm (bandwidth: <1×10$^{-4}$ cm$^{-1}$) pulsed by an acousto-optic modulator and a single pulse (pulse width: 20 ms) of an Ar laser pulsed by a shutter for the above-mentioned range of the τ value with the power listed in Table 2-5 in order to carry out the irradiation by a light source with narrow bandwidth and the high sensitive detection. Holes were then detected by a laser double-beam scanning technique with the same CW dye laser. The hole formation was observed when the τ value was within several tens of ms. This indicates that for the medium 2-1, a two-photon hole formation occurs via the triplet excited state of TPP as an intermediate state.

EXAMPLE 2-9

The effect of the pulse width of the frequency-selecting excitation on hole formation was examined in the range of 8 ms to 2.5 ns taking the medium 2-2 as an example. After cooling the medium 2-2 down to liquid helium temperature, it was irradiated simultaneously with a single pulse of 645 nm light of either a YAG laser-pumped pulse dye laser for a pulse width of 2.5 ns, or an Ar laser pumped CW dye laser pulsed by an acousto-optic modulator or by a shutter for a pulse width of 1 μ- 8 ms, and a single pulse (pulse width: 20 ms, irradiation power: 100 μW/cm$^2$/pulse) of an Ar laser pulsed by a shutter with the power listed in Table 2-7 below. The width and the depth of the burnt hole under each irradiation condition were summarized in Table 2-7.

TABLE 2-7

Dependence of Hole Characteristics on Irradiation Light Pulse Width

| Pulse width (μS) | Irradiation power (μW/cm$^2$/pulse) | Holewidth (GHz) | Δa/a (%) |
|---|---|---|---|
| 2.5 × 10$^{-3}$ | 300 | 22.0 | 5.5 |
| 1 | 100 | 11.8 | 5.2 |
| 10 | 60 | 11.4 | 5.1 |
| 100 | 40 | 9.7 | 5.6 |

TABLE 2-7-continued

Dependence of Hole Characteristics on Irradiation Light Pulse Width

| Pulse width ($\mu$S) | Irradiation power ($\mu$W/cm$^2$/pulse) | Holewidth (GHz) | $\Delta a/a$ (%) |
|---|---|---|---|
| 8000 | 20 | 8.1 | 5.1 |

EXAMPLE 2-10

The effect of the laser-irradiated spot on hole formation was examined taking the medium 2-2 as an example. Medium 2-2 was irradiated simultaneously with a focused single pulse (pulse width: 1 $\mu$s, irradiation power: 100 $\mu$W/cm$^2$ pulse) of an Ar laser-pumped CW dye laser at 645 nm (bandwidth: $<1\times10^{-4}$cm$^{-1}$) pulsed by an acousto-optic modulator and a focused single pulse (pulse width: 20 ms, irradiation power: 100 $\mu$W/cm$^2$/pulse) of an Ar laser pulsed by a shutter at liquid helium temperature. A hole was detected by means of a laser double-beam scanning technique using the same focused laser beam in the burning. A hole could be detected up to the focused laser spot of 100 $\mu$m$\phi$.

EXAMPLE 2-11

In order to examine the effect of acceptor concentration on hole formation, the media in PMMA matrix with the guest concentration shown in Table 2-8 were prepared by the same method as in Example 2-1.

TABLE 2-8

PMMA Host Media with a Highly-doped Acceptor

| Medium No. | Donor TPP (mol/l) | Acceptor p-BNCl (mol/l) |
|---|---|---|
| 2-17 | 5.4 · 10$^{-4}$ | 2.8 · 10$^{-3}$ |
| 2-18 | 5.6 · 10$^{-4}$ | 5.0 · 10$^{-2}$ |
| 2-19 | 5.4 · 10$^{-4}$ | 5.2 · 10$^{-1}$ |

After the media in Table 2-9 were cooled down to liquid helium temperature, they were irradiated simultaneously with a single pulse (pulse width: 1 $\mu$s) of an Ar laser-pumped CW dye laser at 645 nm (bandwidth: $<1\times10^{-4}$cm$^{-1}$) pulsed by an acousto-optic modulator and a single pulse (pulse width: 20 ms, irradiation power: 100 $\mu$W/cm$^2$/pulse) of an Ar laser pulsed by a shutter with the power listed in Table 2-9 below. This resulted in hole formation at the Q$_1$ absorption band of TPP. The holewidth and hole depth in each medium are summarized in Table 2-9. The hole formation yield did not show any marked change when the acceptor concentration increased from the value in the medium 2-2 to that in the medium 2-17. On the other hand, the hole formation yield increased about by an order of magnitude when the acceptor concentration increased from the value in the medium 2-2 to that in the medium 2-18 or 2-19. This indicates that the hole formation yield depends on the average distance between donor and acceptor molecules. Also, the experimental results explain why the hole formation yield is larger about by an order of magnitude for the PE matrix than for the PMMA matrix. In crystalline polymers, such as PE, since guest molecules are dispersed in their amorphous region [Th. Sesselmann, W. Richter, D. Haarer, and H. Morawitz: Phys. Rev., B36, p.7601 (1987)], the distance between donor and acceptor is smaller than that in amorphous polymers such as PMMA even if the guest concentration is the same as that in PMMA.

TABLE 2-9

Irradiation Condition and Hole Characteristics of PMMA Medium with Highly-Doped Acceptor

| Medium No. | Irradiation power ($\mu$W/cm$^2$ pulse) | Hole width (GHz) | $\Delta a/a$ (%) |
|---|---|---|---|
| 2-17 | 60 | 7.9 | 4.7 |
| 2-18 | 10 | 14.2 | 5.5 |
| 2-19 | 20 | 11.4 | 5.5 |

EXAMPLE 2-12

After the midium 2-5 was cooled down to liquid helium temperature, it was simultaneously irradiated with a single pulse of two kinds of coherent dye laser light (the frequency selective excitation at 645 nm (pulse width: 2.5 ns, irradiation energy: 1.0 mJ/cm$^2$/pulse: wherein the one light is the reference beam and the other is the object beam) and a single pulse of dye laser light (the gating excitation) at 488 nm (pulse width: 6 ns, irradiation energy: 1.0 mJ/cm$^2$/pulse) in a focused laser spot of 100 $\mu$m$\phi$ by using the experimental setup shown in FIG. 9. Consequently, a image was holographically stored due to the two-photon photchemical reaction. The image was reproduced by the subsequent irradiation with the only reference beam. FIG. 9 shows a shematic diagram of the apparatus comprising the hologram system, where 4: light source, 5: detector, 6: page composer, 7 and 8: two-dimensional galvanomirror, 9 to 12: lens, 13: cooling chamber, 14: memory medium, 15: reference beam and 16: object beam are illustrated.

EXAMPLE 2-13

After being cooled down to liquid helium temperature, the medium 2-5 was simultaneously irradiated with 10 pulses of an Ar laser-pumped CW dye laser at 640-650 nm (pulse width: 67 ms, power: 0.2 mW/cm$^2$/pulse) pulsed by a shutter at every 1 nm and 10 pulses of an Ar laser pulsed by a shutter (pulse width: 67 ms, power 0.2 mW/cm$^2$/pulse). Deep 11 holes were formed in the Q$_1$ absorption band of TPP. The difference absorption spectrum obtained by subtracting an unburned absorption spectrum from one taken after the above irradiation showed that the reaction product has absorption bands around 690, 495, 455 nm. Comparing the reference values, it was found that the former group was due to TPP cation radical. It means that the TPP cation radical and the anthracene anion radical are formed as reaction products in the medium, accompanied by the hole formation. The same experiments were carried out on the other media, and, the adsorption of the TPP cation radical could be observed in these experiments.

EXAMPLE 3-1

A mixed chloroform solution of metal-free tetraphenylporphyrin (hereinafter, "TPP") or its zinc salt and 1-chloroanthracene (abbreviated to 1-ACl, hereinafter) or 9-bromoanthracene (abbreviated to 9-ABr, hereinafter) or anthracene (abbreviated to A, hereinafter) or $\alpha$-bromonaphthalene (abbreviated to $\alpha$-NBr, hereinafter) or $\beta$-bromonaphthalene (abbreviated to $\beta$-NBr, hereinafter) or 4-bromobiphenyl (abbreviated to 4-BBr, hereinafter) with commercially available PMMA (the concentration of these molecules is shown in Table 3-1 below) was cast on a transparent glass substrate under a nitrogen gas atmosphere at 50° C. to 60° C. for 24 hours, then, kept under reduced pressure using a rotary pump at 150° C. for 48 hours, to completely remove the solvent. Thus, 1 mm thick films were prepared. The absorption spectra of these media look similar to that in FIG. 3. The fluorescence spectra of the medium 3-2 are shown in FIG. 5-$a$ and 5-$b$.

TABLE 3-1

PMMA Host Media

| Medium No. | Donor TPP (mol/l) | Acceptor 1-ACl (mol/l) | 9-ABr (mol/l) |
|---|---|---|---|
| 3-1 | $5.6 \times 10^{-4}$ | $5.2 \times 10^{-4}$ | |
| 3-2 | $5.4 \times 10^{-4}$ | | $5.4 \times 10^{-4}$ |

| Medium No. | Donor TPP (mol/l) | α-NBr (mol/l) | Acceptor β-NBr (mol/l) | 4-BBr (mol/l) |
|---|---|---|---|---|
| 3-3 | $5.6 \times 10^{-4}$ | $5.0 \times 10^{-4}$ | | |
| 3-4 | $5.4 \times 10^{-4}$ | | $5.0 \times 10^{-4}$ | |
| 3-5 | $5.4 \times 10^{-4}$ | | | $5.4 \times 10^{-4}$ |

| Medium No | Donor TPP (mol/l) | ZnTPP (mol/l) | Acceptor 9-ABr (mol/l) | A (mol/l) |
|---|---|---|---|---|
| 3-6 | $5.4 \times 10^{-4}$ | | | $5.4 \times 10^{-4}$ |
| 3-7 | | $5.2 \times 10^{-4}$ | $5.5 \times 10^{-4}$ | |

EXAMPLE 3-2

A mixed hot p-xylene solution of TPP or ZnTPP and 1-ACl or 9-ABr or A or α-NBr or β-NBr or 4-BBr with commercially available high-density polyethylene (PE)(the concentration of these molecules is shown in Table 3-2 below) was cast on a transparent glass substrate under a nitrogen gas atmosphere at 120° C. for 24 hours, then kept under reduced pressure using a rotary pump at 150° C. for 48 hours to completely remove the solvent. Thus, films 100 to 200 μm thick were prepared. The absorption spectra of these media look similar to that in FIG. 3.

TABLE 3-2

PE Host Media

| Medium No | Donor TPP (mol/l) | Acceptor 1-ACl (mol/l) | 9-ABr (mol/l) |
|---|---|---|---|
| 3-8 | $5.3 \times 10^{-4}$ | $5.4 \times 10^{-4}$ | |
| 3-9 | $5.4 \times 10^{-4}$ | | $5.4 \times 10^{-4}$ |

| Medium No. | Donor TPP (mol/l) | α-NBr (mol/l) | Acceptor β-NBr (mol/l) | 4-BBr (mol/l) |
|---|---|---|---|---|
| 3-10 | $5.6 \times 10^{-4}$ | $5.0 \times 10^{-4}$ | | |
| 3-11 | $5.2 \times 10^{-4}$ | | $5.3 \times 10^{-4}$ | |
| 3-12 | $5.4 \times 10^{-4}$ | | | $5.5 \times 10^{-4}$ |

| Medium No. | Donor TPP (mol/l) | ZnTPP (mol/l) | Acceptor 9-ABr (mol/l) | A (mol/l) |
|---|---|---|---|---|
| 3-13 | $5.1 \times 10^{-4}$ | | | $5.2 \times 10^{-4}$ |
| 3-14 | | $5.2 \times 10^{-4}$ | $5.4 \times 10^{-4}$ | |

EXAMPLE 3-3

The oxidation potential of TPP and ZnTPP, an the reduction potential of 1-ACl, 9-ABr, A, α-NBr, β-NBr and 4-BBr were measured by an electrochemical method under the conditions shown in Table 3-3 below. The results are summarized in Table 3-3.

TABLE 3-3

| Oxidation and Reduction Potential of the Guest Molecules | | | |
|---|---|---|---|
| | Solvent | Supporting electrolyte | Oxidation or reduction potential |
| TPP | $CH_2Cl_2$ | $Bu_4NBF_4$ | 0.95(V vs SCE) |
| ZnTPP | $CH_2Cl_2$ | $Bu_4NBF_4$ | 0.71 |
| 9-ABr | MeCN | $Bu_4NBF_4$ | $-1.68$ |
| 1-ACl | MeCN | $Bu_4NBF_4$ | $-1.84$ |
| A | MeCN | $Et_4NClO_4$ | $-2.04$ |
| α-NBr | MeCN | $Bu_4NBF_4$ | $-1.63$ |
| β-NBr | MeCN | $Bu_4NBF_4$ | $-1.64$ |
| 4-BBr | MeCN | $Bu_4NBF_4$ | $-1.73$ |

According to the oxidation potential or the reduction potential in Table 3-3 it was found that any selected combination of the donor with the acceptor listed in Table 3-3 gave positive values of ΔG calculated from Eq. (2), so that a single-photon intermolecular electron transfer reaction cannot occur by photoexcitation to $Q_1$ absorption band of the donors. However, a two-photon intermolecular electron transfer reaction, for example, via the triplet excited state of the donor as an intermediate state, can occur.

EXAMPLE 3-4

After being cooled to liquid helium temperature, the media, shown in Table 3-1 or Table 3-2, were irradiated with a single pulse (pulse width: 2.5 ns, band width: 1 $cm^{-1}$) of a YAG laser-pumped pulse dye laser in a range of irradiation energy of 0.1 to 10 mJ/cm²/pulse). However, no hole was formed in the Q1 absorption band of TPP. Therefore, in theses media, it was found that no hole was formed based on a single photoninduced photochemical reaction under the foregoing expermental condition. The fact supported the result of Example 3-3 and also indicated that no hole was formed by other single-photon photochmical reactions, (for example, a proton tautomerization) under the foregoing experimental conditions.

EXAMPLE 3-5

Figure 7:
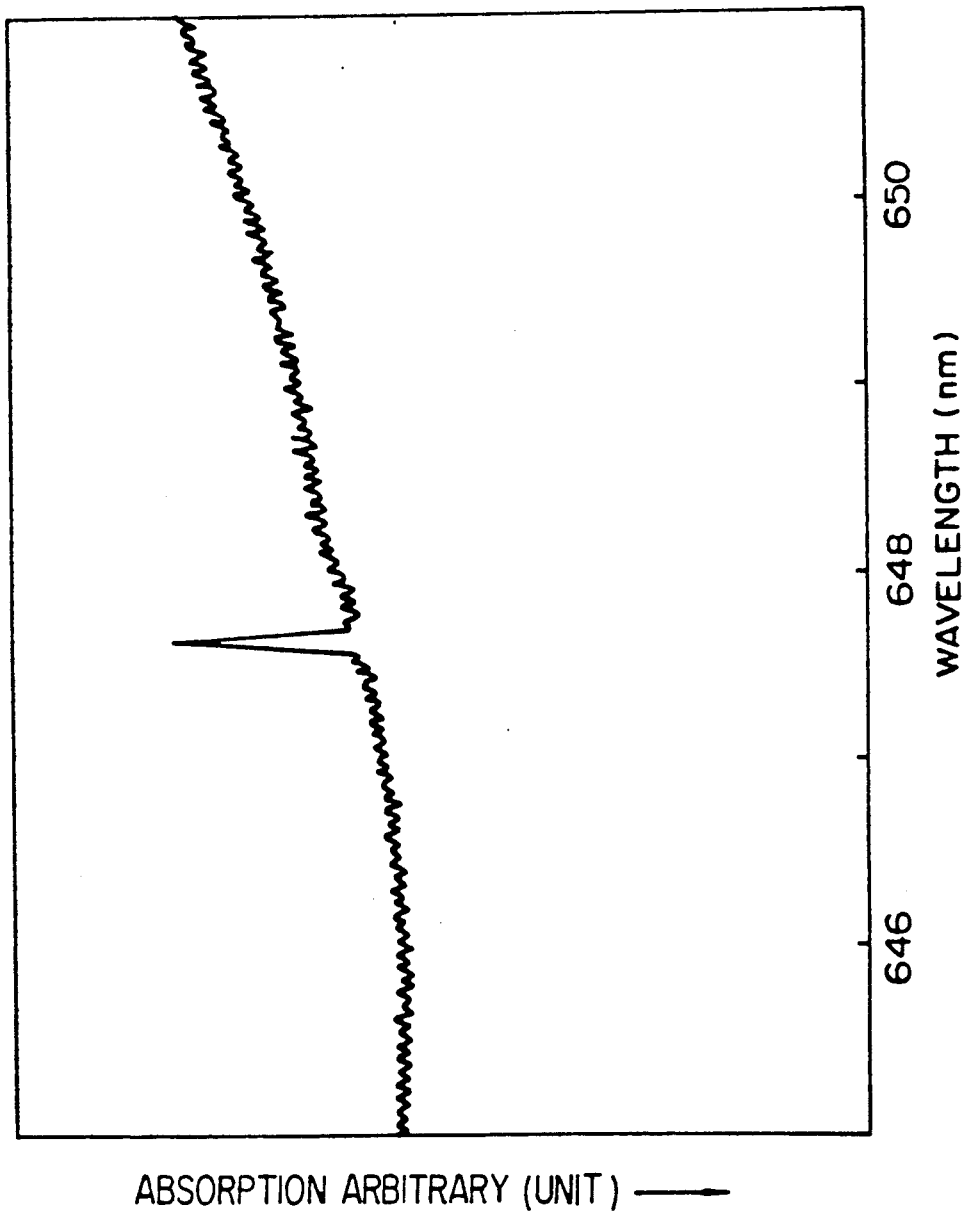
FIG. 7 illustrates an example of PHB hole spectrum in the medium 3-2 (TPP. 9-ABr/PMMA).

After the media in Table 3-1 or Table 3-2, except the media 3-6, 3-7 and 3-13, 3-14, were cooled down liquid to helium temperature, they were irradiated by two pulses (irradiation energy: 0.1 mJ/cm²/pulse) of a YAG laser-pumped pulse dye laser at 645 nm (pulse width: 2.5 ns, band width: 1 $cm^{-1}$) with the time interval of 0.2 sec. A hole with a width of about 1.5 $cm^{-1}$ was formed in all the media. FIG. 7 shows a diagram of a hole spectrum formed in the medium 3-2, showing wavelength (nm)(in arbitrasy unit) and absorbance (in arbitrasy unit). Then, they were irradiated with two pulses (pulse width: 1 μs) of an Ar laser-pumped CW dye laser at 645 nm (bandwidth: $<1 \times 10^{-4} cm^{-1}$) pulsed by an acousto-optic modulator with the time interval of 0.2 sec with the power listed in Table 3-4 below in order to carry out the irradiation by light sources with narrow bandwidth and the high-sensitive detection. Holes were then detected by a laser double-beam scaning technique with the same CW dye laser. A hole was produced in the $Q_1$ band of TPP in all the media. The hole width and the hole formation yield in each medium were summarized in Table 3-4. The hole formation yield was larger by an order for the media in PE matrix than for those in PMMA matrix. Furthermore, using the YAG laser-pumped dye laser, the dependence of the holeformation yield on the irradiation time interval was measured. The holeformation yield was independent of the irradiation time interval in the range of 0 to 1 hr. This fact indicates that an intermediate state of the two-photon photochemical reaction, which is responsible for the hole formation in the foregoing medium, was not the metastable triple excited state of TPP, but was a stable reaction product.

TABLE 3-4

Irradiation Condition and Hole Characteristics of PMMA host media

| Medium No. | Irradiation power ($\mu W/cm^2$/pulse) | Holewidth (GHz) | $\Delta a/a$ (%) |
|---|---|---|---|
| 3-1 | 60 | 7.9 | 1.6 |
| 3-2 | 60 | 7.7 | 1.6 |
| 3-3 | 40 | 11.0 | 1.7 |
| 3-4 | 40 | 13.1 | 1.6 |
| 3-5 | 80 | 11.3 | 1.4 |
| 3-8 | 2 | 8.0 | 1.9 |
| 3-9 | 2 | 7.9 | 1.9 |
| 3-10 | 5 | 11.0 | 1.8 |
| 3-11 | 3 | 11.0 | 1.8 |
| 3-12 | 20 | 10.8 | 1.7 |

EXAMPLE 3-6

After the media in Table 3-1 or Table 3-2, except media 3-6, 3-7 and 3-13, 3-14 were cooled to liquid helium temperature, they were irradiated simultaneously with a single pulse (irradiation energy: 0.1 mJ/cm²pulse) of a YAG laser-pumped pulse dye laser at 645 nm (pulse width: 2.5 ns, bandwidth: 1 cm⁻¹) and a single pulse (irradiation energy: 0.1 mJ/cm²/pulse) of an Ar laser (pulse width: 20 ms) pulsed by a shutter. A hole with a width of about 1.5 cm⁻¹ was formed in all the media. Then, they were irradiated simultaneously with a single pulse (pulse width: 1 μs) of an Ar laser-pumped CW dye laser at 645 nm (bandwidth: <1×10⁻⁴ cm⁻¹) pulsed by an acousto-optic modulator and a single pulse (pulse width: 20 ms) of Ar laser pulsed by a shutter with the power listed in Table 3-5 in order to carry out the irradiation by light sources with narrouw bandwidth and the high-sensitive detection. Holes were then detected by a laser double-beam scanning technique with the same CW dye laser. A hole was produced in the $Q_1$ band of TPP in all the media. The holewidth and the hole formation yield in each medium were summarized in Table 3-5. The hole formation yield was larger by an order for the media in PE matrix than for those in PMMA matrix, and, furthermore, it increased by an order accampanying the change of the gating excitation from 645 nm to Ar laser light. However, its dependence on the kind of halogen was not so strong. Furthermore, using the YAG laser-pumped dye laser, the dependence of the hole formation yield on the irradiation time interval was measured. The holeformation yield was independent of the irradiation time interval in the range of 0 to 1 hr. This fact indicates that an intermediate state of the two-photon photochemical reaction, which is responsible for the hole formation in the foregoing medium, was not the metastable triple excited state of TPP, but was a stable reaction product.

TABLE 3-5

Irradiation Condition and Hole Characteristics

| Medium No. | Irradiation power $\lambda_1$ ($\mu W/cm^2$/pulse) | $\lambda_2$ ($\mu W/cm^2$/pulse) | Holewidth (GHz) | $\Delta a/a$ (%) |
|---|---|---|---|---|
| 3-1 | 40 | 620 | 11.0 | 3.3 |
| 3-2 | 60 | 100 | 7.7 | 3.1 |
| 3-3 | 40 | 620 | 11.0 | 3.3 |
| 3-4 | 140 | 600 | 13.1 | 3.3 |
| 3-5 | 60 | 400 | 10.9 | 2.9 |
| 3-8 | 2 | 50 | 8.0 | 6.2 |
| 3-9 | 2 | 50 | 8.2 | 6.3 |
| 3-10 | 5 | 70 | 11.0 | 6.3 |
| 3-11 | 3 | 60 | 11.0 | 6.3 |
| 3-12 | 10 | 80 | 11.0 | 6.3 |

EXAMPLE 3-7

After the media in Table 3-1 or Table 3-2, except media 3-6, 3-7 and 3-13, 3-14 were cooled down to liquid helium temperature, they were irradiated simultaneously with a single pulse (irradiation energy: 0.1 mJ/cm²/pulse) of a YAG laser-pumped pulse dye laser at 645 nm (pulse width: 2.5 ns, bandwidth: 1 cm⁻¹) and a single pulse (irradiation energy: 0.1 mJ/cm²/pulse). A hole with a width of about 1.5 cm⁻¹ was at 380 nm (pulse width: 8 ns). A hole with a width of about 1.5 cm⁻¹ was formed in all the media. Then, they were irradiated simultaneously with a single pulse (pulse width: 1 μs) of an Ar laser-pumped CW dye laser at 645 nm (bandwidth: <1×10⁻⁴ cm⁻¹) pulsed by an acousto-optic modulator and a single pulse (pulse width: 8 ns) of a N₂ laser-pumped dye laser at 380 nm with the power listed in Table 3-6 below in order to carry out the irradiation by light sources with narrow bandwidth and the high-sensitive detection. Holes then detected by a laser double-beam scanning thechnique with the same CW dye laser. A hole was produced in the $Q_1$ band of TPP in all the media. The holewidth and the hole formation yield in each medium were summarized in Table 3-6. The hole formation yield was larger by an order for the media in PE matrix than for those in PMMA matrix, and, furthermore, it increased by an order occampanying the change of the gating excitation from 645 nm to Ar laser light. However, its dependence on the kind of halogen was not so strong. Furthermore, using the YAG laser-pumped dye laser, the dependence of the hole formation yield on the irradiation time interval was measured. The hole formation yield was independent of the irradiation time interval in the range of 0 to 1 hr. This fact indicates that an intermediate state of the two-photon photochemical reaction, which is responsible for the hole formation in the foregoing medium, was not the metastable triple excited state of TPP, but was a stable reaction product.

TABLE 3-6

Irradiation Conditions and Hole Characteristics

Irradiation Conditions and Hole Characteristics

| Medium No. | Irradiation power $\lambda_1$ ($\mu W/cm^2$/pulse) | $\lambda_2$ ($\mu W/cm^2$/pulse) | Holewidth (GHz) | $\Delta a/a$ (%) |
|---|---|---|---|---|
| 3-1 | 20 | 300 | 10.8 | 4.0 |
| 3-2 | 30 | 50 | 8.0 | 3.8 |
| 3-3 | 20 | 300 | 11.1 | 3.9 |
| 3-4 | 70 | 300 | 12.8 | 3.8 |

TABLE 3-6-continued

Irradiation Conditions and Hole Characteristics

| Medium No. | Irradiation power $\lambda_1$ ($\mu W/cm^2$/pulse) | $\lambda_2$ ($\mu W/cm^2$/pulse) | Holewidth (GHz) | $\Delta a/a$ (%) |
|---|---|---|---|---|
| 3-5 | 30 | 200 | 10.9 | 3.5 |
| 3-8 | 2 | 30 | 8.1 | 7.3 |
| 3-9 | 2 | 30 | 8.2 | 7.3 |
| 3-10 | 5 | 50 | 11.3 | 7.1 |
| 3-11 | 3 | 30 | 11.0 | 6.9 |
| 3-12 | 10 | 50 | 10.8 | 6.8 |

EXAMPLE 3-8

The effect of the irradiation pulse width on hole formation was examined, taking the media 3-2 and 3-9 as examples, in the range of 8 ms to 2.5 ns. After cooling the media 3-2 and 3-9 down to liquid helium temperature, they were irradiated with two pulses of 645 nm light of either a YAG laser-pumped pulse dye laser for a pulse width of 2.5 ns, or an Ar laser-pumped CW dye laser pulsed by an acousto-optic modulator or by a shutter for a pulse width of 1 $\mu$s-8 ms with the time interval of 0.2 sec. with the power listed in Table 3-7. The width and the depth of the burnt hole in each medium are summarized in Table 3-7. It should be noted that no hole was formed for the medium 3-2 even when the irradiation was carried out with 1,0000 pulses of the irradiation power of 900 $\mu W/cm^2$/pulse for the pulse width of 1 $\mu$s.

TABLE 3-7

Dependence of hole characteristics on irradiation light pulse width

| Pulse width ($\mu S$) | Irradiation power ($\mu W/cm^2$/pulse) | Holewidth (GHz) | $\Delta a/a$ (%) |
|---|---|---|---|
| <Media 9> | | | |
| $2.5 \times 10^3$ | 100 | 22.0 | 6.0 |
| 1 | 60 | 17.7 | 6.0 |
| 10 | 6 | 11.4 | 6.6 |
| 100 | 0.2 | 5.2 | 4.7 |
| 8000 | 2 | 8.1 | 1.9 |
| <Media> | | | |
| $2.5 \times 10^3$ | 1000 | 25.0 | 1.7 |
| 1 | 900 | — | — |
| 10 | 200 | 15.7 | 1.6 |
| 100 | 60 | 10.8 | 1.9 |
| 8000 | 60 | 5.7 | 1.6 |

EXAMPLE 3-9

The effect of the irradiation laser spot on hole formation was examined taking the medium 3-9 as an example. Medium 3-9 was irradiated with a focused two pulses (pulse width: 1 $\mu$s, irradiation power: 10 $\mu W/cm^2$/pulse) of an Ar laser-pumped CW dye laser at 645 nm (bandwidth: $<1 \times 10^{-4} cm^{-1}$) pulsed by an acousto-optic modulator with the time interval of 0.2 sec. at liquid helium temperature. A hole was detected by means of a laser double-beam scanning technique using the same focused laser beam in the burning. A hole could be detected up to the focused laser spot of 100 $\mu m\phi$.

EXAMPLE 3-10

After the media 3-6, 3-7, 3-13 or the medium 3-14 in Table 3-1 or Table 3-2, respectively were cooled down to liquid helium temperature, the media 3-6 and 3-13 were irradiated with a YAG laser-pumped pulse dye laser at 645 nm (pulse width: 2.5 ns, band width: 1 cm$^{-1}$) while the media 3-7 and 3-14 were irradiated with one at 593 nm (pulse width: 2.5 ns, band width: 1 cm$^{-1}$) with irradiation conditions shown in Table 3-8. No hole was, however, formed in the $Q_1$ absorption band of TPP for all the media.

TABLE 3-8

| Medium | Wave length (nm) | Irradiation power ($\mu m/cm^2$/pulse) | Pulse width (s) | Number of radiation pulse (pulse) |
|---|---|---|---|---|
| 3-6 | 645 | 0.2 | $8 \times 10^{-3}$ | 10 |
| 3-7 | 593 | 100 | $2.5 \times 10^{-9}$ | 100 |
| 3-13 | 645 | 0.2 | $8 \times 10^{-3}$ | 10 |
| 3-14 | 593 | 100 | $2.5 \times 10^{-9}$ | 100 |

EXAMPLE 3-11

Figure 8:
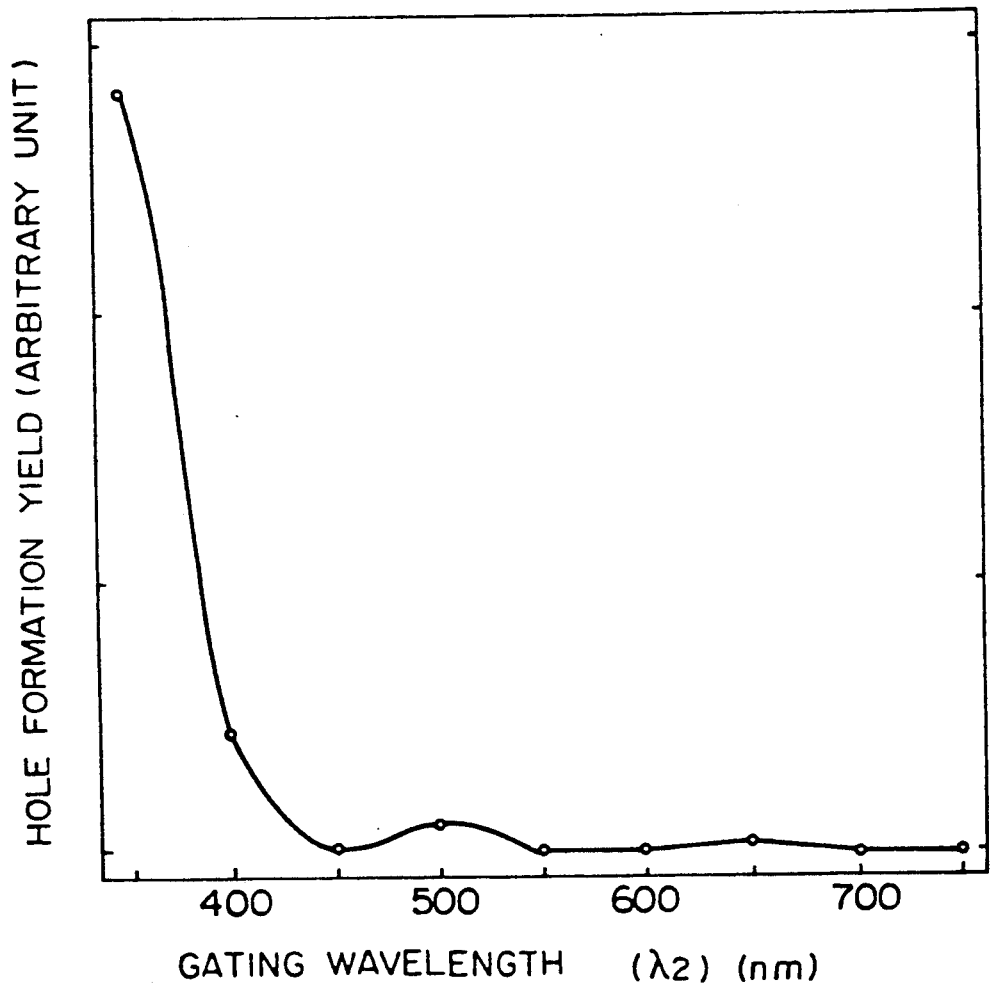
FIG. 8 illustrates a photon-gating action spectrum for the gating excitation in the medium 3-8 (TPP. 1-ACl/PE).

After the medium 3-8 was cooled down to liquid helium temperature, it was irradiated simultaneously with a single pulse of a N$_2$ laser-pumped dye laser, $\lambda_2$, and a single pulse of a YAG laser-pumped pulse dye laser, $\lambda_1$, at 642 nm (pulse width: 2.5 ns, irradiation amount: 0.1 mJ/cm$^2$). In the irradiation above, the excitation was changed from 350 nm to 750 nm at every 50 nm step. The hole formation yield (in arbitrary unit) on the y-axis is illustrated in FIG. 8 as a function of the $\lambda_2$ wavelength (nm) on the x-axis. It showed be noted that the hole formation yield has been corrected for the constant burning fluence of the $\lambda_2$ excitation. FIG. 8 corresponds to the absorption spectrum of the intermediate state of the PHB reaction. According to FIG. 8, the effective gating for the hole formation is realized by mean of a light of wavelength shorter than 500 nm. The same experiments were also carried out for the media 3-11 and 3-12, and the absorption spectra of the intermediates similar to that in the medium 3-8 were obtained for these media.

EXAMPLE 3-12

After cooling down to liquid helium temperature, the medium 3-8 was irradiated with a single pulse of a YAG laser-pumped dye laser ($\lambda_1$)(pulse width: 2.5 ns, irradiation energy: 0.1 mJ/cm$^2$) at each wavelength by changing the wavelength from 642 nm to 648 nm in every 0.5 nm step. Then the medium was irradiated with a single pulse of an Ar laser ($\lambda_2$) pulsed by a shutter (pulse width: 2.5 ms) into the same spot. Consequently, holes were simultaneously formed at each wavelength of the $\lambda_2$ in the $Q_1$ absorption band of TPP.

EXAMPLE 3-13

In order to examine the effect of acceptor concentration on hole formation, the media in PMMA matrix with the guest concentration shown in Table 3-9 were prepared by the same method as in Example 3-1.

TABLE 3-9

| | PMMA Host Media with a Highly-doped Acceptor | | |
|---|---|---|---|
| | Donor | Acceptor | |
| Medium No. | TPP (mol/l) | 1-ACl (mol/l) | 9-ABr (mol/l) |
| 3-15 | $5.4 \times 10^{-4}$ | $2.8 \times 10^{-3}$ | |
| 3-16 | $5.6 \times 10^{-4}$ | | $2.7 \times 10^{-3}$ |
| 3-17 | $5.6 \times 10^{-4}$ | $5.0 \times 10^{-2}$ | |
| 3-18 | $5.4 \times 10^{-4}$ | $5.2 \times 10^{-1}$ | |
| 3-19 | $5.4 \times 10^{-4}$ | | $5.4 \times 10^{-2}$ |
| 3-20 | $5.6 \times 10^{-4}$ | | $5.4 \times 10^{-1}$ |

After the media in Table 3-10 were cooled down to liquid helium temperature, they were irradiated simultaneously with two pulses (pulse width: 2.5 ns, bandwidth: 1 cm$^1$) of a YAG laser-pumped pulse dye laser with the time interval of 0.2 sec, or with a single pulse (pulse width: 1 μs) of an Ar laser-pumped CW dye laser at 645 nm (bandwidth: $<1\times10^{-4}$cm$^{-1}$) pulsed by an acousto-optic modulator and a single pulse (pulse width: 20 ms, irradiation power: 100 μw/cm$^2$/pulse) of an Ar laser pulsed by a shutter with the power listed in Table 3-10 below. This resulted n hole formation in the Q$_1$ absorption band of TPP. The holewidth and hole depth in each medium are summarized in Table 3-10. The hole formation yield did not show any marked change when the acceptor concentration increased form the value in the medium 3-1 or 3-2 to that in the m.medium 3-15 or 3-16. On the other hand, the hole formation yield increased about by an order of magnitude when the acceptor concentration increased form the value in the media 3-1 or 3-2 to that in the medium 3-17 to 3-20. This indicates that the hole formation yield depends on the average distance between donor and acceptor molecules. Also, the experimental results explain why the hole matrix than for the PMMA matrix. In crystalline polymers, such as PE, since guest molecules are dispersed in there amorphous region [Th. Sesselmann, W. Richter, D. Haarer, H. Morawitz: Phys. Rev., B36, p.7601 (1987)], the distance between donor and acceptor is smaller than that in amorphous polymers such as PMMA even if the guest concentration is the same as that in PMMA.

TABLE 3-10

| | Irradiation Condition and Hole Characteristics of PMMA Medium with Highly-Doped Acceptor | | | |
|---|---|---|---|---|
| | Irradiation power | | | |
| Medium No. | λ$_1$ (μW/cm$^2$/ pulse) | λ$_2$ (μW/cm$^2$/ pulse) | Hole width (GHz) | Δa/a (%) |
| 3-15 | 60 | 620 | 7.9 | 1.7 |
| | 40 | | 11.0 | 3.3 |
| 3-16 | 60 | 620 | 7.9 | 1.6 |
| | 40 | | 11.0 | 3.3 |
| 3-17 | 10 | 600 | 14.2 | 3.1 |
| | 4 | | 14.4 | 2.2 |
| 3-18 | 20 | 560 | 11.4 | 3.5 |
| | 10 | | 16.3 | 5.7 |
| 3-19 | 10 | 600 | 14.2 | 3.1 |
| | 4 | | 14.4 | 2.2 |
| 3-20 | 20 | 560 | 11.4 | 3.5 |
| | 10 | | 16.3 | 5.7 |

EXAMPLE 3-14

After the media in Table 3-1 or Table 3-2, except the media 3-6, 3-7, 3-13, or 3-14, were cooled down to liquid helium temperature they were simultaneously irradiated with a single pulse of two kinds of coherent dye laser light (the frequency selective excitation) at 645 nm (pulse width: 2.5 ns, irradiation energy: 0.5 mJ/cm$^2$/pulse: wherein the one light is the reference beam and the other is the object beam) and a single pulse of dye laser light (the gating excitation) at 380 nm (pulse width: 6 ns, irradiation energy : 0.5 mJ/cm$^2$/pulse) in a focused laser spot of 100 μmΦ by using the experimental setup shown in FIG. 9. Consequently, a image was holographically stored due to the two-photon photochemical reaction The holography formation yield was independent of the irradiation interval between the frequency selective and the gating excitations. The image was reproduced by the subsequent irradiation with the only reference beam. FIG. 9 shows a schematic diagram of the apparatus comprising the hologram system, where 4: light source, 5: detector, 6: page composer, 7 and 8: two-dimensional galvanomirror, 9 to 12: lens, 13: cooling chamber, 14: memory medium, 15: reference beam and 16: object beam are illustrated.

EXAMPLES 3-15

After being cooled down to liquid helium temperature, the medium 3-1 was irradiated with 10 pulses of a YAG laser-pumped dye laser at 640-650 nm (pulse width: 2.5 ns) at every 1 nm step with an irradiation energy of 5 mJ/cm$^2$/pulse. Deep 11 holes were formed in the Q$_1$ absorption band of TPP. The difference absorption spectrum obtained by subtracting an unburned absorption spectrum form one taken after the above irradiation showed that the reaction product gave absorption bands around 690, 495, 455 nm. Comparing a collection of absorption spectra so far reported, it was found that the absorption was due to a TPP cation radical. Thus, TPP cation radicals are at least formed as reaction products in the medium, accompanying the hole formation. The same experiment was carried out on the media 3-4 and 3-5. The absorption spectrum of TPP cation radicals were also observed. Accordingly, the mechanism of hole formation for media of this invention is illustrated in Table 3-10, where the hole formation in the medium of the present invention is explained using energy levels (1) to (5).

EXAMPLE 3-16

A mixed chloroform solution of metal-free tetraphenylporphyrin or its zinc salt and 3-Chlorophenanthrene (hereinafter 3-PheCl), 4-Bromo-pyrene (hereinafter 4-PyBr), 5-Bromo-chrysene (hereinafter 5-ChrBr), 3-Chloro-triphenylene (hereinafter 3-TrPhCl), 4-Bromo-p-terphenyl (hereinafter 4-Br-p-TPh), 4-Bromo-m-terphenyl (hereinafter 4-Br-m-TPh), 4-Bromo-o-terphenyl (hereinafter 4-Br-o-TPh), with commercially available PMMA (the concentration of these molecules is shown in Table 3-17 below) was cast on a transparent glass substrate under a nitrogen gas atmosphere at 50° C. to 60° C. for 24 hours, then, kept under reduced pressure using a rotary pump at 150° C. for 48 hours, to completely remove the solvent. Thus, 1 mm thick films were prepared. The absorption spectra of the media in Table look similar to that in FIG. 3.

TABLE 3-16

| | PMMA Host Media | | |
|---|---|---|---|
| | Donor | Acceptor | |
| Medium No. | TPP (mol/l) | 3-Phecl (mol/l) | 4-PyBr (mol/l) |

TABLE 3-16-continued

PMMA Host Media

| | | | | |
|---|---|---|---|---|
| 3-21 | $5.0 \times 10^{-4}$ | $5.2 \times 10^{-4}$ | | |
| 3-22 | $5.3 \times 10^{-4}$ | | | $5.0 \times 10^{-4}$ |

| | Donor | | Acceptor | |
|---|---|---|---|---|
| Medium No. | TPP (mol/l) | 5-ChrBr (mol/l) | 3-TrPhCl (mol/l) | 4-Br-p-TPH (mol/l) |
| 3-23 | $5.1 \times 10^{-4}$ | $4.9 \times 10^{-4}$ | | |
| 3-24 | $4.9 \times 10^{-4}$ | | $5.0 \times 10^{-4}$ | |
| 3-25 | $5.2 \times 10^{-4}$ | | | $5.3 \times 10^{-4}$ |

| | Donor | | Acceptor | |
|---|---|---|---|---|
| Medium No. | TPP (mol/l) | ZnTPP (mol/l) | 4-Br-m-TPH (mol/l) | 4-Br-o-TPH (mol/l) |
| 3-26 | $4.8 \times 10^{-4}$ | | $5.1 \times 10^{-4}$ | |
| 3-27 | $5.1 \times 10^{-4}$ | | | $5.1 \times 10^{-4}$ |

EXAMPLE 3-17

A mixed hot p-xylene solution of TPP or ZnTPP and 3-PheCl, 4-PyBr, 5-ChrBr, 3-TrPhCl, 4-Br-p-TPh, 4-Br-m-TPh, 4-Br-o-TPh with commercially available high-density polyethylene (PE) was cast on a transparent glass substrate under a nitrogen gas atmosphere at 120° C. for 24 hours, then kept under reduced pressure using a rotary pump at 150° C. for 48 hours to completely remove the solvent. Thus, films 100 to 200 μm thick were prepared. TGhe absorption spectra of these media look similar to those of the media in Example 3-1.

TABLE 3-17

PE Host Media

| | Donor | Acceptor | |
|---|---|---|---|
| Medium No. | TPP (mol/l) | 3-PheCl (mol/l) | 4-PyBr (mol/l) |
| 3-28 | $4.7 \times 10^{-4}$ | $5.0 \times 10^{-4}$ | |
| 3-29 | $5.1 \times 10^{-4}$ | | $4.9 \times 10^{-4}$ |

| | Donor | | Acceptor | |
|---|---|---|---|---|
| Medium No. | TPP (mol/l) | 5-ChrBr (mol/l) | 3-TrPhCl (mol/l) | 4-Br-p-TPh (mol/l) |
| 3-30 | $5.5 \times 10^{-4}$ | $5.2 \times 10^{-4}$ | | |
| 3-31 | $5.2 \times 10^{-4}$ | | $5.7 \times 10^{-4}$ | |
| 3-32 | $5.0 \times 10^{-4}$ | | | $5.0 \times 10^{-4}$ |

| | Donor | | Acceptor | |
|---|---|---|---|---|
| Medium No. | TPP (mol/l) | ZnTPP (mol/l) | 4-Br-m-TPh (mol/l) | 4-Br-o-TPh (mol/l) |
| 3-33 | $4.9 \times 10^{-4}$ | | $4.9 \times 10^{-4}$ | |
| 3-34 | $5.3 \times 10^{-4}$ | | | $5.0 \times 10^{-4}$ |

EXAMPLE 3-18

The oxidation potential of TPP and ZnTPP, and the reduction potential of 3-PheCl, 4-PyBr, 5-ChrBr, 3-TrPhCl, 4-Br-p-TPh, 4-Br-m-TPh, 4-Br-o-TPh were measured by an electrochemical method under the conditions shown in Table 3-18 below. The results were summarized in Table 3-18.

TABLE 3-18

Oxidation and Reduction Potential of the Guest Molecules

| | Solvent | Supporting electrolyte | Oxidation or reducton potential |
|---|---|---|---|
| TPP | $CH_2Cl_2$ | $Bu_4NBF_4$ | 0.95(V vs SCE) |
| ZnTPP | $CH_2Cl_2$ | $Bu_4NBF_4$ | 0.71 |
| 3-PheCl | MeCN | $Bu_4NBF_4$ | −1.85 |
| 4-PyBr | MeCN | $Bu_4NBF_4$ | −1.97 |
| 5-ChrBr | MeCN | $Bu_4NBF_4$ | −2.35 |

TABLE 3-18-continued

Oxidation and Reduction Potential of the Guest Molecules

| | Solvent | Supporting electrolyte | Oxidation or reducton potential |
|---|---|---|---|
| 3-TrPhCl | MeCN | $Bu_4NBF_4$ | −2.53 |
| 4-Br-p-TPh | MeCN | $Bu_4NBF_4$ | −2.19 |
| 4-Br-m-TPh | MeCn | $Bu_4NBF_4$ | −2.49 |
| 4-Br-o-TPh | MeCn | $Bu_4NBF_4$ | −2.57 |

According to the oxidation potential or the reduction potential in Table 3-18 it was found that any selected combination of the donor with the acceptor in Table gave positive value of $\Delta G$ calculated from Eq. (2), so that a single-photon intermolecular electron transfer reaction cannot occur by photoexcitation to $Q_1$ absorption band of the donor. However, a two-photon intermolecular electron transfer reaction, for example, via the triplet excited state of the donor as an intermediate state, can occur.

EXAMPLE 3-19

After the media shown in Tables 3-16 or Table 3-17 were cooled down to liquid helium temperature (7 K), they were irradiated by a single pulse of a YAG laser-pumped pulsed dye laser at 645 nm (pulse width: 2.5 ns, band width: 1 cm$^{-1}$) in a range of irradiation energy of 0.1 to 10 mJ/cm$^2$/pulse. However, no hole was formed in the $Q_1$ absorption band of TPP. Therefore, it was found that no hole was formed due to a single-photon photochemical reaction under the above irradiation conditions. This fact supported the result of Example 3-18 and also indicated that no hole was formed by other single-photon photochemical reactions, (for example, a proton tautomerization) under the foregoing experimental conditions.

EXAMPLE 3-20 (-- delete)

EXAMPLE 3-21

After the media in Table 3-16 and Table 3-17 were cooled down to liquid helium temperature, they were irradiated simultaneously with a single pulse (irradiation energy: 0.5 mJ/cm$^2$/pulse) of a YAG laser-pumped pulse dye laser (pulse width: 2.5 ns, band width: 1 cm$^-$) at 645 nm and a single pulse (irradiation energy: 0.5 mJ/cm$^2$/pulse) of an Ar laser (pulse width: 20 ms) pulsed by a shutter. A hole with a width of about 1.5 cm$^{-1}$ was formed in all the media. Then, the media were simultaneously irradiated with a single pulse (pulse width: 1 μs) of an Ar laser-pumped CW dye laser at 645 nm (band width: $<1 \times 10^{-4}$ cm$^{-1}$) pulsed by means of an acousto-optic modulator and a single pulse (pulse width : 20 ms) of an Ar laser pulsed by a shutter with the power listed in Table 3-19 below in order to carry out the irradiation by a light source with narrow band width and the high sensitive detection. Holes were then detected by a laser double-beam scanning technique with the same CW dye laser. A hole was produced in the $Q_1$ absorption band of TPP in all the media. The hole width and the hole formation yield in each medium were summarized in Table 3-19. The hole formation yield was larger by an order of magnitude for the media in PE matrix than for those in PMMA matrix.

TABLE 3-19

| | Irradiation Condition and Hole Characteristics | | | |
|---|---|---|---|---|
| Medium No | Irradiation power $\lambda_1$ ($\mu W/cm^2$/pulse) | $\lambda_2$ ($\mu W/cm^2$/pulse) | Holewidth (GHz) | $\Delta\alpha/\alpha$ (%) |
| 3-21 | 60 | 60 | 10.8 | 2.5 |
| 3-22 | 80 | 60 | 11.3 | 2.2 |
| 3-23 | 85 | 60 | 12.5 | 2.1 |
| 3-24 | 90 | 50 | 11.4 | 2.8 |
| 3-25 | 50 | 70 | 10.5 | 2.2 |
| 3-26 | 70 | 80 | 12.3 | 1.9 |
| 3-27 | 70 | 60 | 13.5 | 2.0 |
| 3-28 | 10 | 60 | 10.0 | 2.7 |
| 3-29 | 15 | 60 | 10.8 | 2.2 |
| 3-30 | 12 | 60 | 11.1 | 2.3 |
| 3-31 | 15 | 50 | 11.2 | 2.5 |
| 3-32 | 8 | 70 | 10.1 | 3.0 |
| 3-33 | 10 | 80 | 11.7 | 2.4 |
| 3-34 | 10 | 60 | 12.8 | 2.4 |

EFFECT OF THE INVENTION

As heretofore mentioned, in a material with a hole formation mechanism through a multi-photon (more than 2) photochemical reaction, the present invention provides a optical storage medium, which realizes stable, high-quality, high-density wavelength multiplexing optical storage high-speed write-in (several tens ns to several ns/bit) and high-speed read-out (several tens ns to several ns/bit) in a focused laser spot (1 to 100 $\mu m\phi$-diameter), high sensitivity, high thermal stability and high controllability to be prepared in the desired medium composition under good reproducibility. Also, a optical storage method by which a simple, sensitive high-speed write-in and high-speed read-out scheme is feasible, is provided based on the fact that a stable reaction products is included as an intermediate state of the hole formation reaction, and that the time interval between the frequency selecting and the gating excitation are taken as desired from zero to hours because the number of the population of the intermediate state does not decrease with time.

What is claimed is:

1. An optical data storage medium, comprising:
   (a) an amorphous matrix; and
   (b) guest molecules dispersed in the amorphous matrix, the guest molecules consisting essentially of electron donors and electron acceptors which are in a solid state at room temperature,
   the optical data storage medium having an inhomogeneously broadened absorption band due to a distribution of local environments around the guest molecules dispersed in the amorphous matrix, such that the optical data storage medium is capable of storing at least two bits of data in a frequency domain by virtue of an irreversible multi-photonic electron transfer reaction consisting of more than one photon process, in which at least one electron is transferred from the electron donors to the electron acceptors.

2. The optical data storage medium according to claim 1 having at least one intermediate produced in the multi-photonic electron transfer reaction which is a triplet excited state of the electron donors.

3. The optical data storage medium according to claim 1 wherein at least one intermediate produced in the multiphotonic electron transfer reaction is stable approximately at liquid helium temperature for more than one hour.

4. The optical data storage medium according to claim 1 wherein the amorphous matrix is a substantially transparent polymer.

5. The optical data storage medium according to claim 4 wherein the polymer is selected from the group consisting of polyethylene and polymethylmethacrylate.

6. The optical data storage medium according to claim 1 wherein the electron donors are metal-free porphyrin derivatives.

7. The optical data storage medium according to claim 6 wherein the metal-free porphyrin derivatives are selected from the group consisting of metal-free tetraphenyl porphyrin and a zinc salt of metal-free tetraphenyl porphyrin.

8. The optical data storage medium according to claim 1 wherein the electron acceptors are molecules selected from the group consisting of halogenated benzene derivatives and halogenated condensed aromatic hydrocarbon derivatives.

9. The optical data storage medium according to claim 8 wherein the halogenated benzene derivatives and halogenated condensed aromatic hydrocarbon derivatives are molecules selected from the group consisting of halogenated benzene, halogenated phenol, halogenated benzaldehyde, halogenated acetophenone, halogenated toluene, halogenated stilbene, halogenated bibenzyl, halogenated fluorene, halogenated phenazine, halogenated adamantane, halogenated phenanthrene, halogenated triphenylene, halogenated terphenyl, halogenated naphthalene, halogenated anthracene, halogenated pyrene, halogenated picene, halogenated biphenyl, halogenated benzonitrile, halogenated benzophenone, halogenated benzonic acid, and halogenated crycene.

10. The optical data storage medium according to claim 8 wherein the halogenated benzene derivatives and halogenated condensed aromatic hydrocarbon derivatives are selected from the group consisting of 9-Bromo-anthracene, 1-Chrolo-anthracene, alpha-Bromo-naphthalene, beta-Bromo-naphthalene, 4-Bromo-biphenyl, p-Chloro-benzonitrile, p-Chloro-benzophenone, 1-Chloro-4-iode-benzene, 3-Bromo-nitrobenzene, 2,4-Dichloro-phenol, 1-Bromo-4-iode-benzene, 3-Bromo-nitrobenzene, 2,4-Dichloro-phenol, 4-Chloro-benzaldehyde, 2-Iodo-benzoic acid, 2-Bromo-acetophenone, 2-Bromo-4-Nitro-toluene, 4,4'-Dichlorostilbene, 4,4'-bis (Bromomethyl) bibenzyl, 2,7-Dibromo-benzilidene-fluorene, 1-Chloro-phenazine, 1-Bromo-adamantane, 4-Bromo-pyrene, 5-Bromo-Chloro-phenazine, 1-Bromo-adamantane, 4-Bromo-pyrene, 5-Bromo-crycene, 3-Chloro-triphenylene, and 4-Bromo-p-terphenyl.

11. A method for storing data in an optional data storage medium consisting essentially of electron donor and electron acceptor guest molecules dispersed in an amorphous matrix, whereby the optical data storage medium has an inhomogeneously broadened absorption band due to a distribution of local environments around the guest molecules dispersed in the amorphous matrix, the method comprising the steps of:
   (a) exposing the optical data storage medium to a light beam of predetermined wavelengths in a primary exposure; and
   (b) exposing said optical data storage medium to a light beam of predetermined wavelengths at least once, 500 ms or more after the primary exposure in a secondary exposure, whereby at least two bits of data can be stored in a frequency domain of the optical data storage medium by means of an irreversible multi-photonic electron transfer reaction consisting of more than one photon process, in which at least one electron is transferred from the electron donor guest molecules to the electron acceptors guest molecules, thereby creating a plurality of holes in a frequency domain in the optical data storage medium.

12. The method for storing data in an optical data storage medium according to claim 11 wherein:
    (a) the light beam during the primary exposure consists of a plurality of light components of selected wavelengths, the selected wavelengths being within the inhomogeneously broadened absorption band; and
    (b) the primary exposure is carried out by irradiating the optical data storage medium with the plurality of light components in sequence, thereby creating holes corresponding to the frequencies of the light components.

13. The method of storing data in an optical data storage medium according to claim 11 wherein:
    (a) the light beam during the primary exposure consists of a plurality of light components of selected wavelengths, the selected wavelengths being within the inhomogeneously broadened absorption band; and
    (b) the primary exposure is carried out by irradiating the optical data storage medium with the plurality of light components simultaneously, thereby creating holes corresponding to the frequencies of the light components.

14. The method for data storage according to claim 11, wherein at least one intermediate product produced in the multiphotonic electron transfer reaction is stable at liquid helium temperature for more than one hour.

* * * * *